United States Patent
Kawasaki et al.

(10) Patent No.: US 8,598,643 B2
(45) Date of Patent: Dec. 3, 2013

(54) NONVOLATILE SEMICONDUCTOR MEMORY DEVICE AND METHOD OF MANUFACTURING THE SAME

(75) Inventors: Kaori Kawasaki, Yokohama (JP);
Yoshiaki Fukuzumi, Yokohama (JP);
Masaru Kito, Kuwana (JP); Tomoko Fujiwara, Odawara (JP); Takeshi Imamura, Yokkaichi (JP); Ryouhei Kirisawa, Yokohama (JP); Hideaki Aochi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 150 days.

(21) Appl. No.: 13/235,425

(22) Filed: Sep. 18, 2011

(65) Prior Publication Data

US 2012/0241846 A1  Sep. 27, 2012

(30) Foreign Application Priority Data

Mar. 24, 2011  (JP) .................. 2011-066180

(51) Int. Cl.
*H01L 27/108* (2006.01)
*H01L 29/76* (2006.01)
*H01L 29/94* (2006.01)
*H01L 31/119* (2006.01)

(52) U.S. Cl.
USPC ........... 257/298; 257/296; 257/305; 257/306; 257/384; 257/E21.006; 257/E21.042; 257/E21.165; 257/E21.247; 257/E21.249; 257/E21.645; 257/E21.646

(58) Field of Classification Search
USPC ......... 257/296, 298, 300, 301, 303, 304, 305, 257/306, 311, 384, 456, 396, 293, E21.006, 257/E21.042, E21.165, E21.247, E21.249, 257/E21.645, E21.646
See application file for complete search history.

(56) References Cited

U.S. PATENT DOCUMENTS

| | | | |
|---|---|---|---|
| 7,539,056 B2 * | 5/2009 | Katsumata et al. ...... | 365/185.18 |
| 7,821,058 B2 * | 10/2010 | Kidoh et al. ................. | 257/324 |
| 7,847,334 B2 | 12/2010 | Katsumata et al. | |
| 7,936,004 B2 | 5/2011 | Kito et al. | |
| 8,372,720 B2 * | 2/2013 | Fukuzumi et al. ............ | 438/287 |
| 2010/0207195 A1 | 8/2010 | Fukuzumi et al. | |

FOREIGN PATENT DOCUMENTS

| | | |
|---|---|---|
| JP | 2009-146954 | 7/2009 |
| JP | 2009-224465 | 10/2009 |

* cited by examiner

*Primary Examiner* — David Nhu
(74) *Attorney, Agent, or Firm* — Oblon, Spivak, McClelland, Maier & Neustadt, L.L.P.

(57) ABSTRACT

According to one embodiment, a nonvolatile semiconductor memory device comprises a first conductive layer, a second conductive layer, a first inter-electrode insulating film, and a third conductive layer stacked above the first conductive layer, a memory film, a semiconductor layer, an insulating member, and a silicide layer. The memory film and the semiconductor layer is formed on the inner surface of through hole provided in the second conductive layer, the first inter-electrode insulating film, and the third conductive layer. The insulating member is buried in a slit dividing the second conductive layer, the first inter-electrode insulating film, and the third conductive layer. The silicide layer is formed on surfaces of the second conductive layer and the third conductive layer in the slit. The distance between the second conductive layer and the third conductive layer along the inner surface of the slit is longer than that of along the stacking direction.

14 Claims, 40 Drawing Sheets

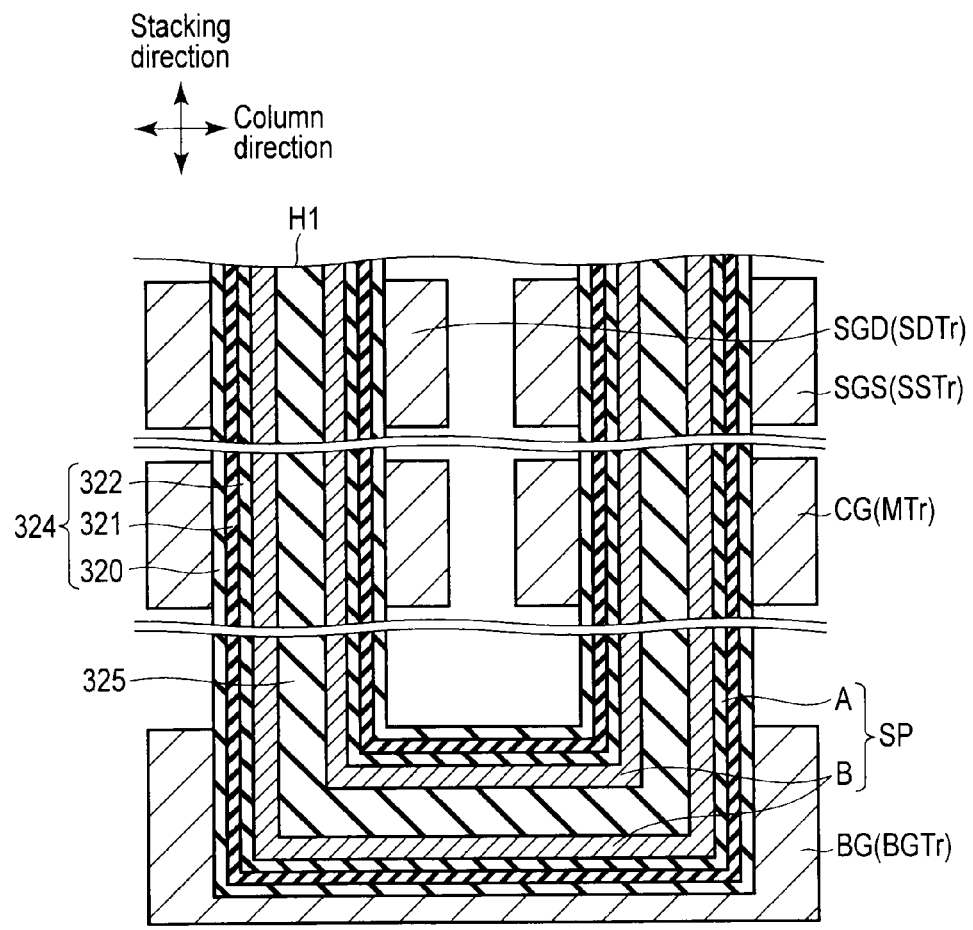
F I G. 3

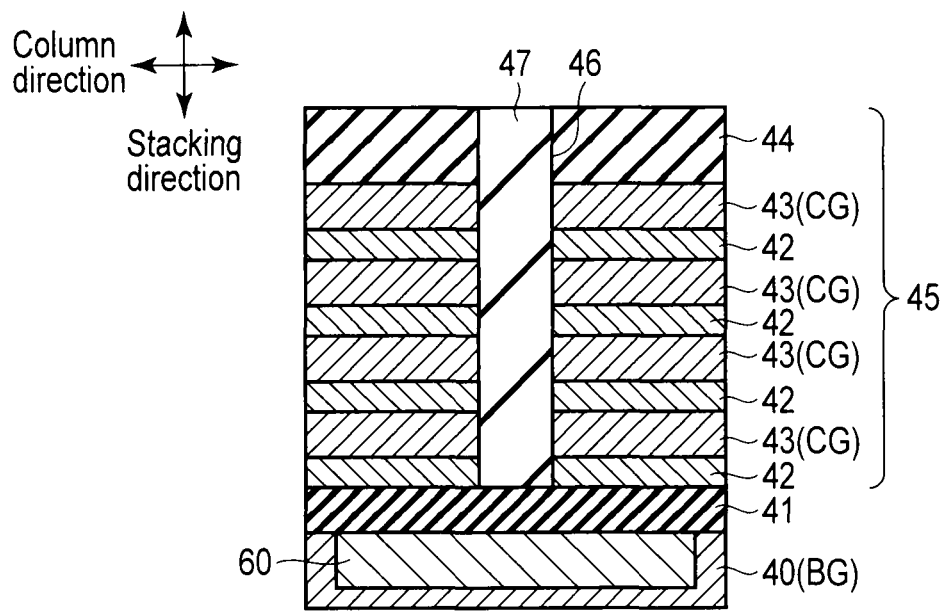
F I G. 8
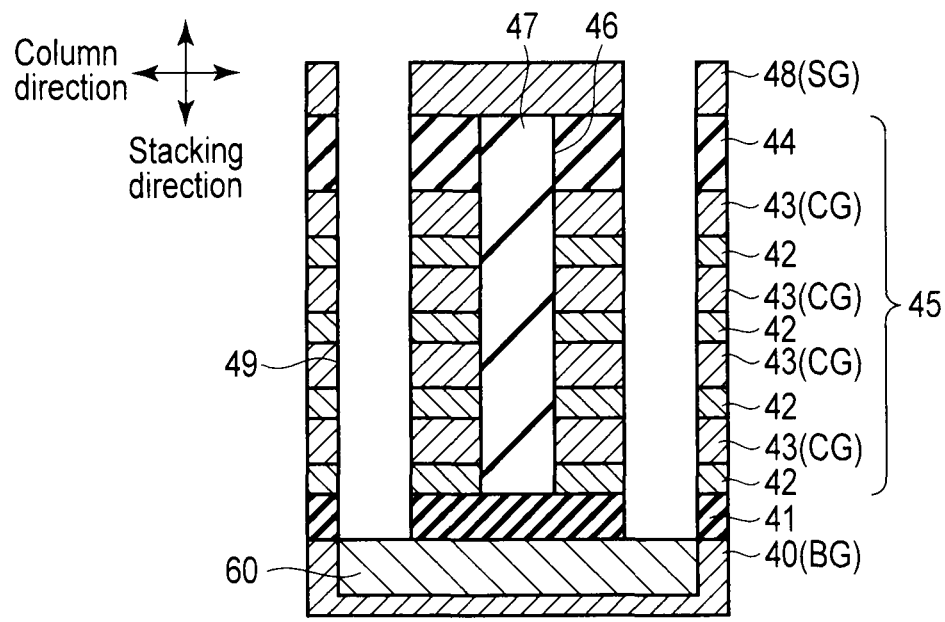
F I G. 9

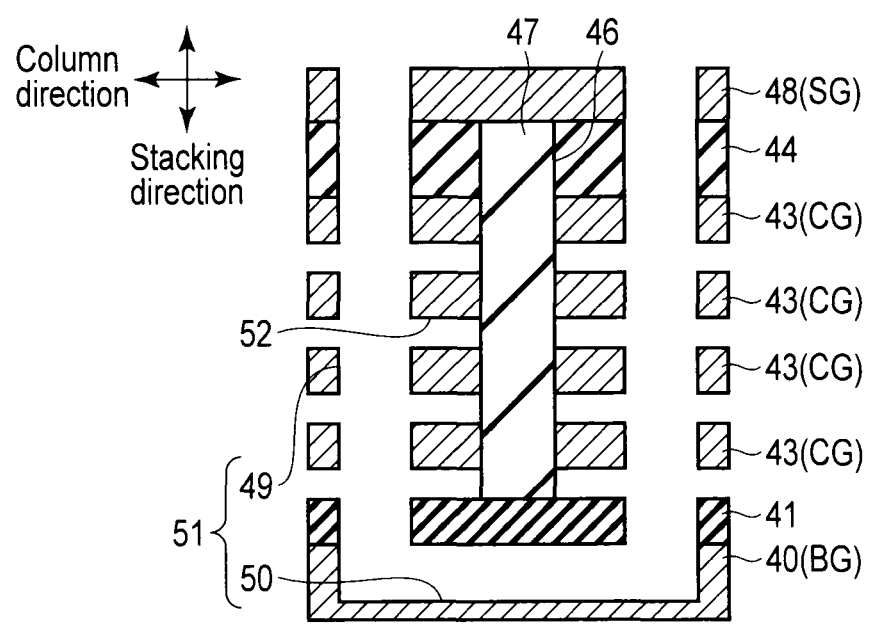
F I G. 10

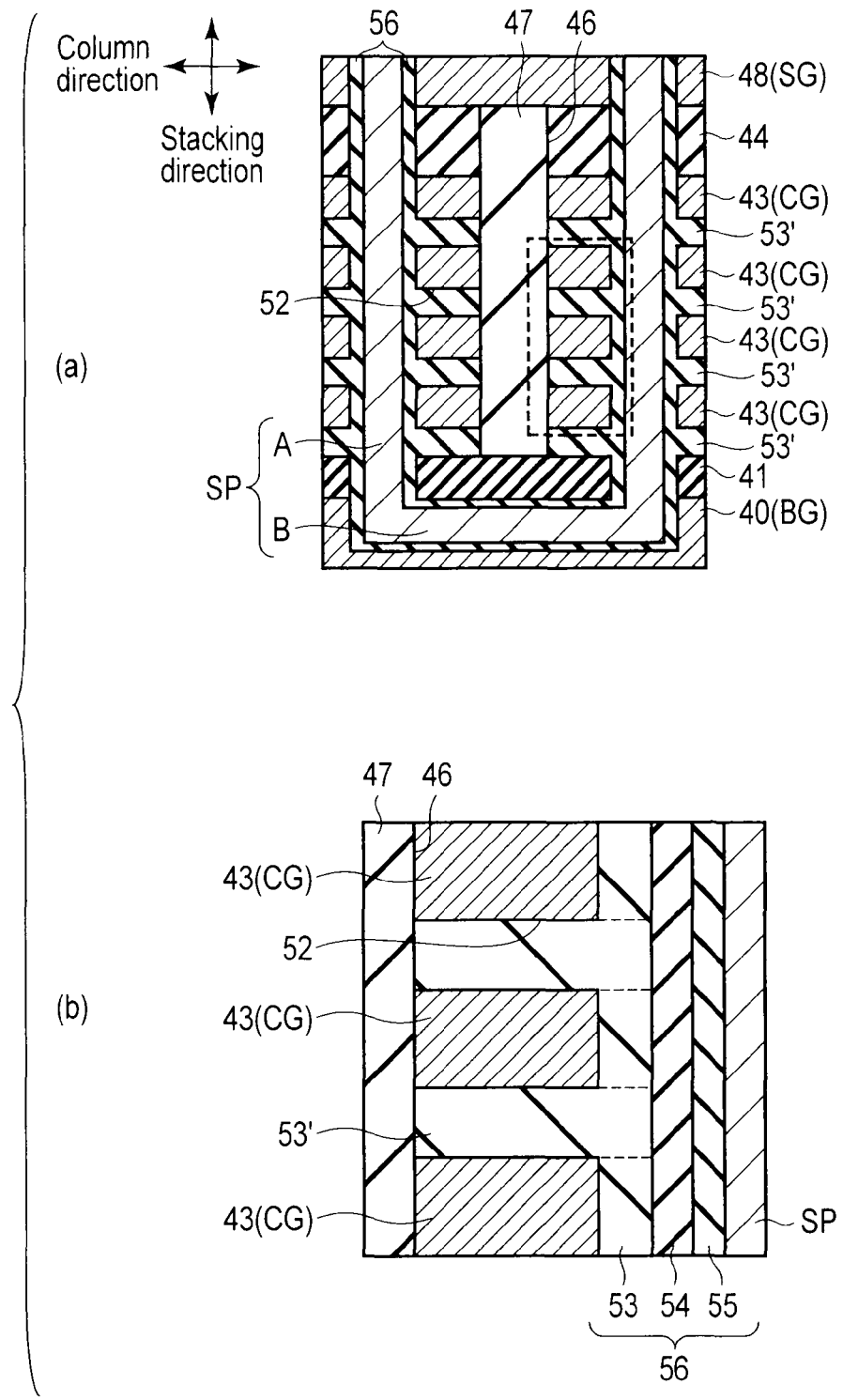
F I G. 11

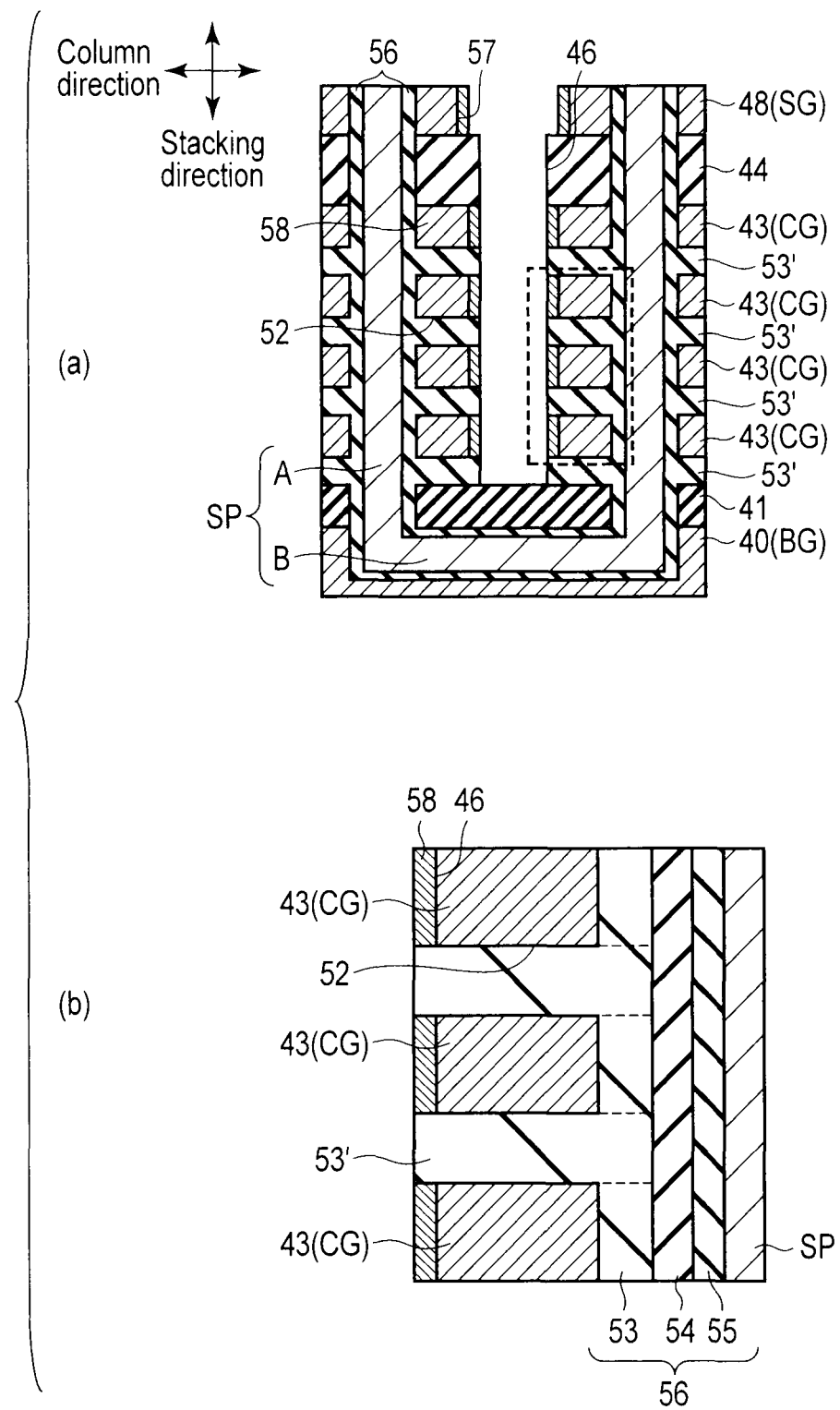
F I G. 13

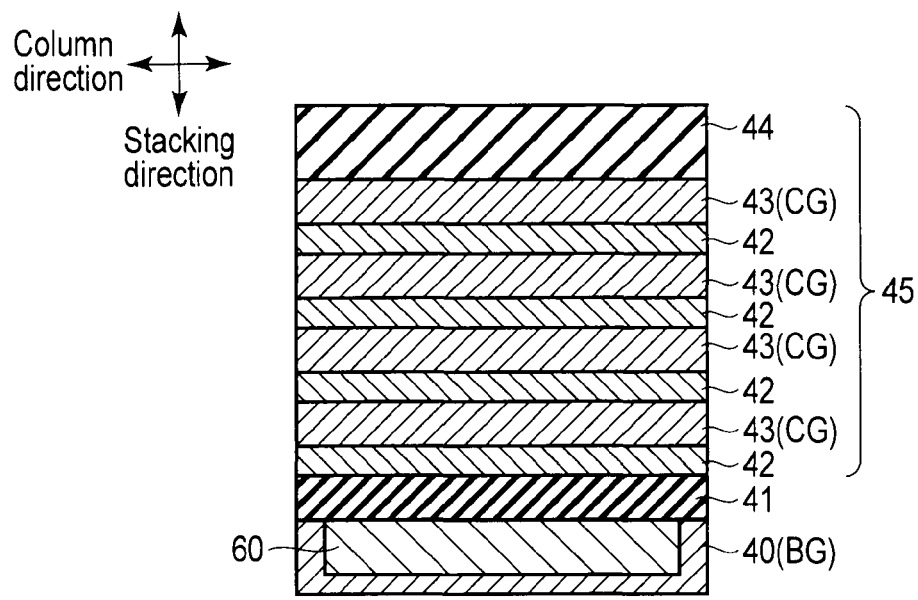
F I G. 16
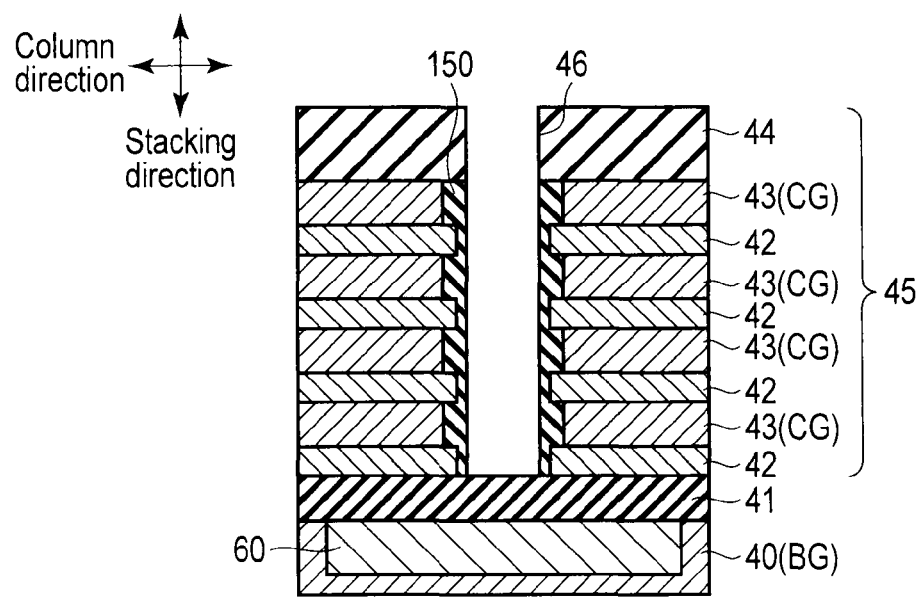
F I G. 17

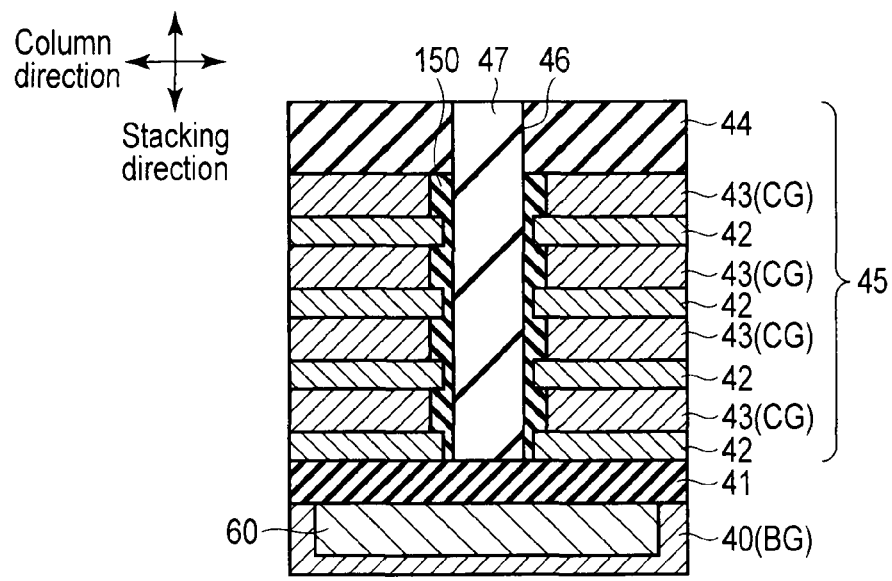
F I G. 18
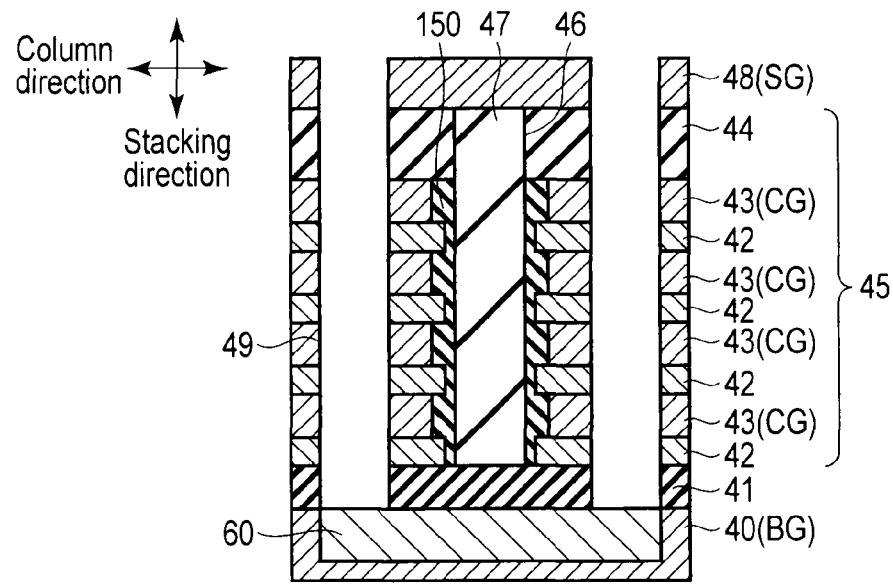
F I G. 19

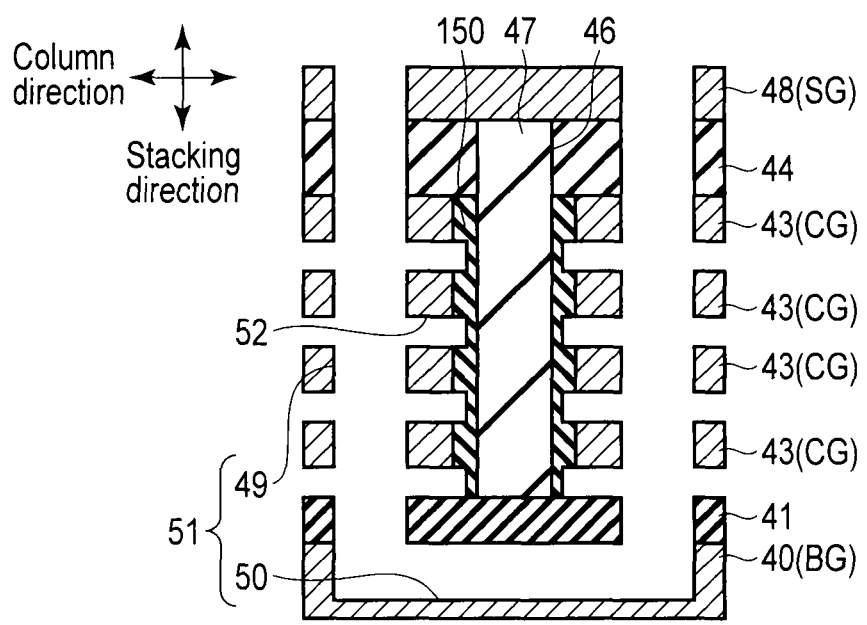
F I G. 20

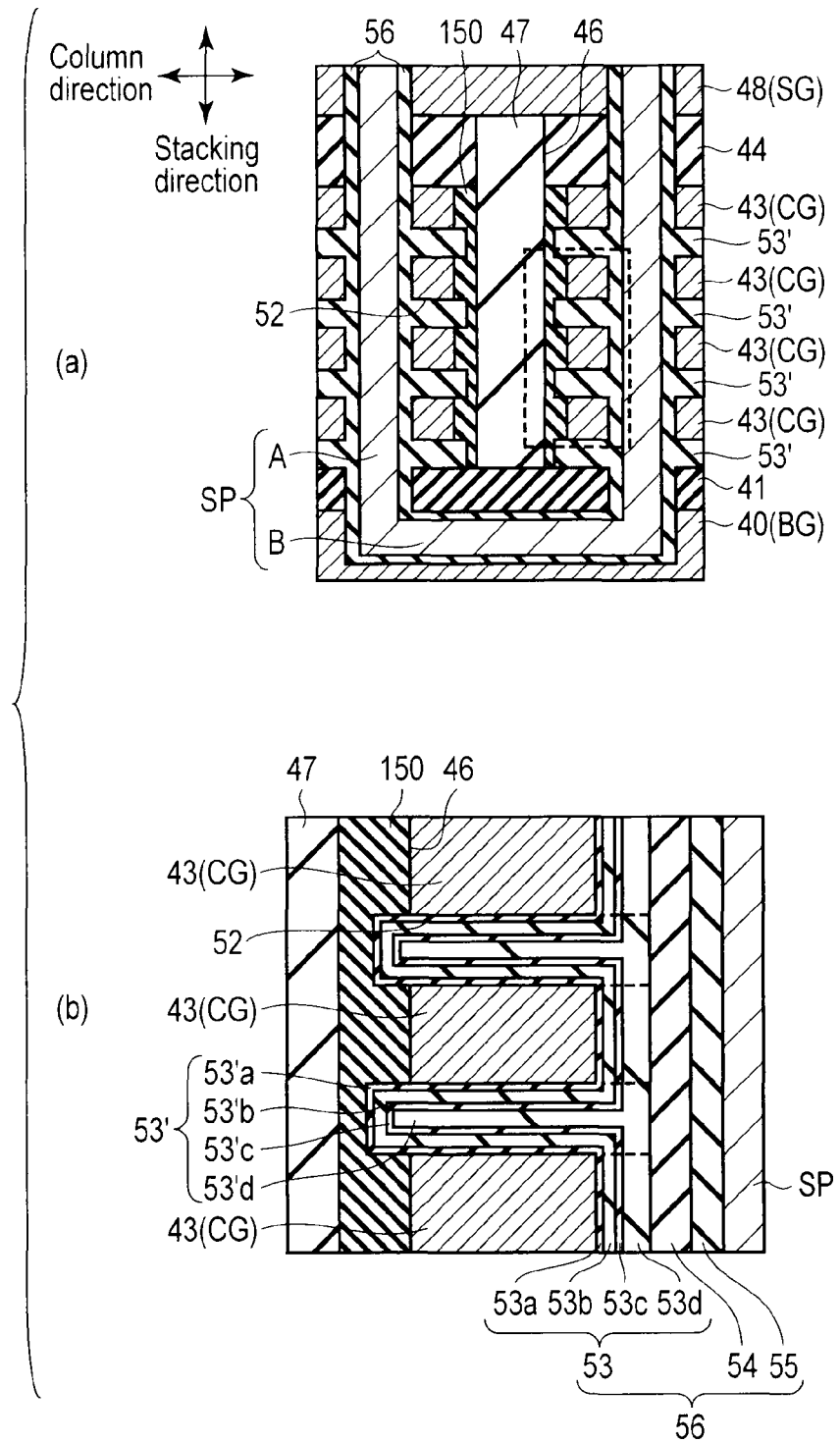
F I G. 21

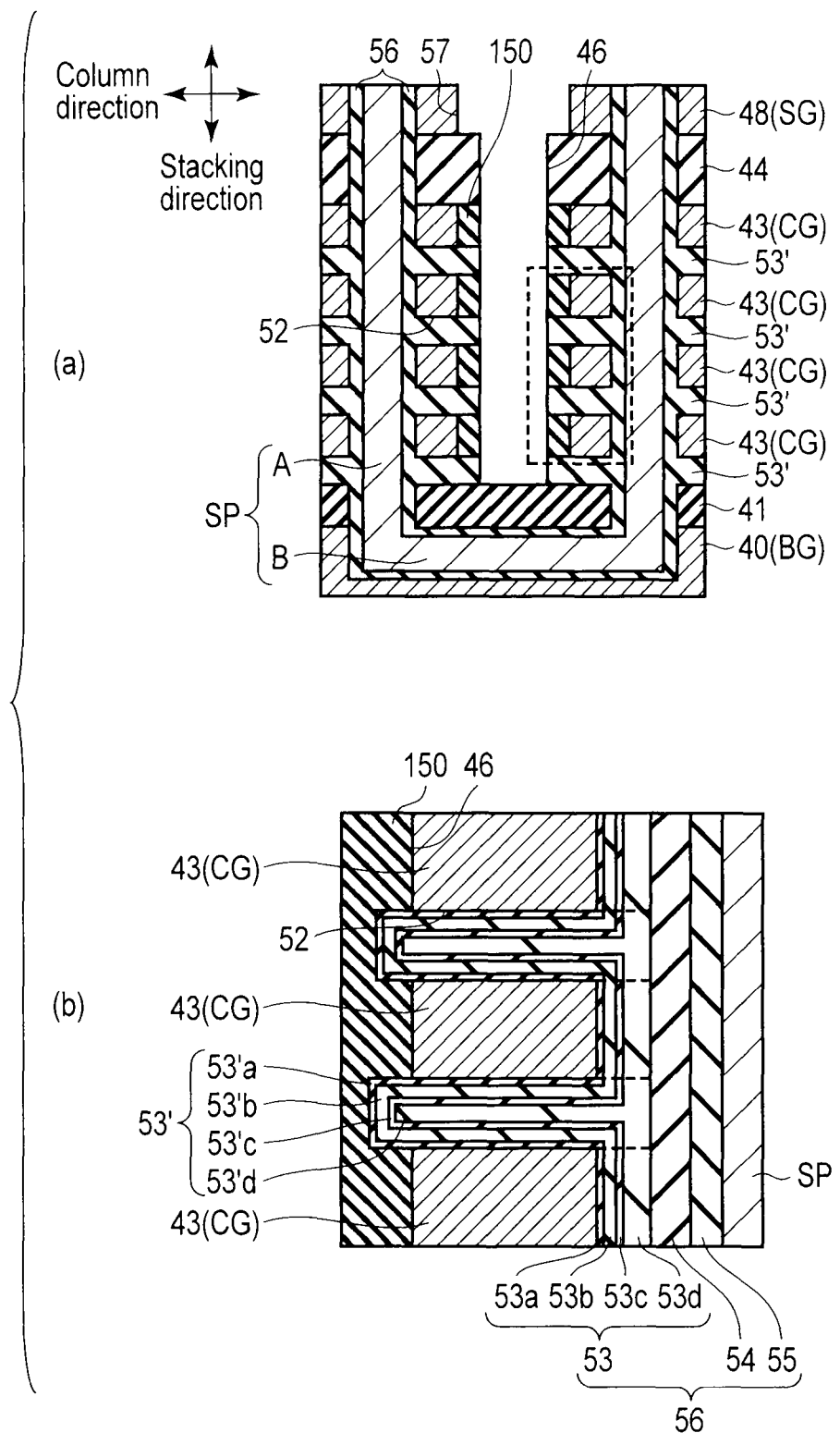
F I G. 22

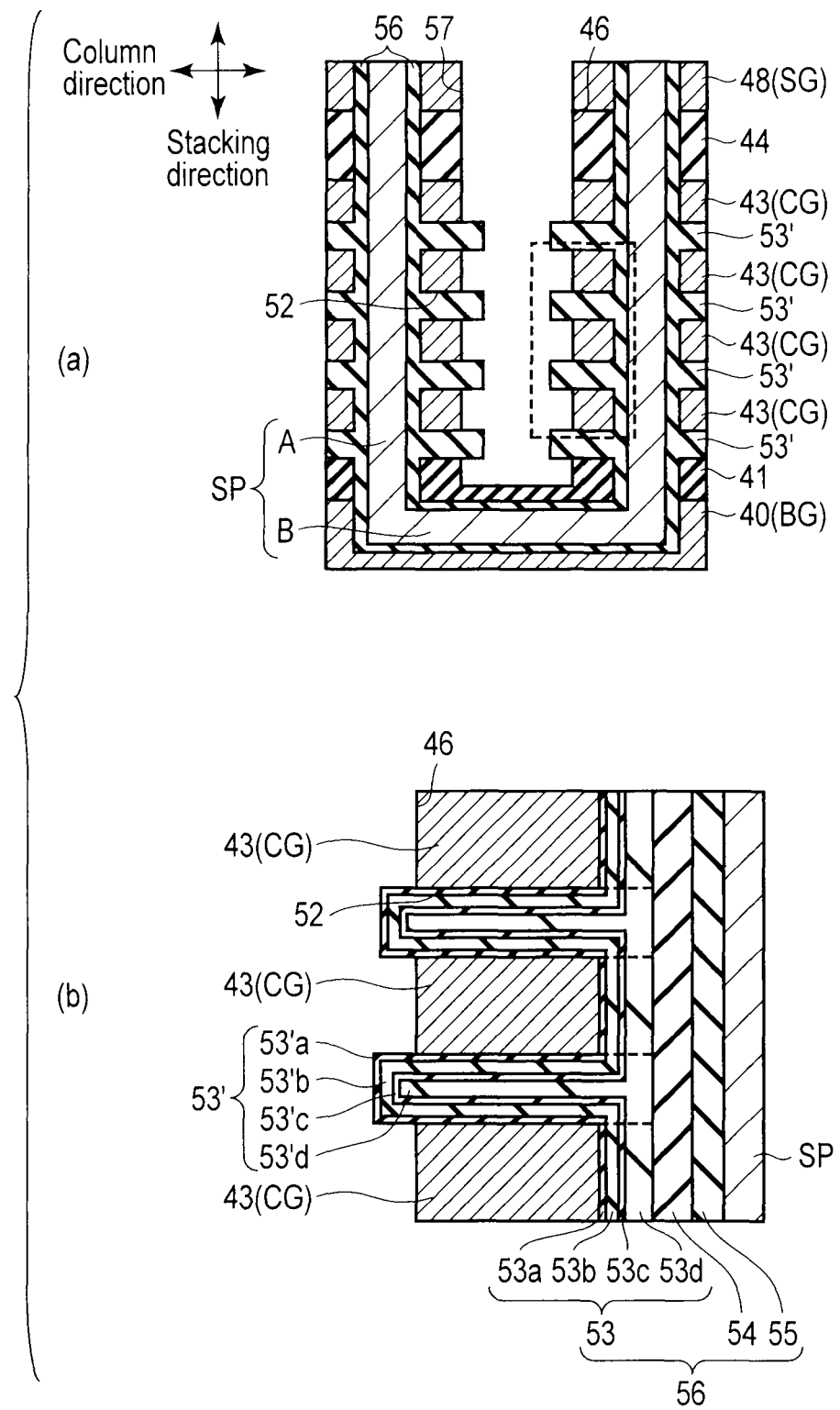
F I G. 23

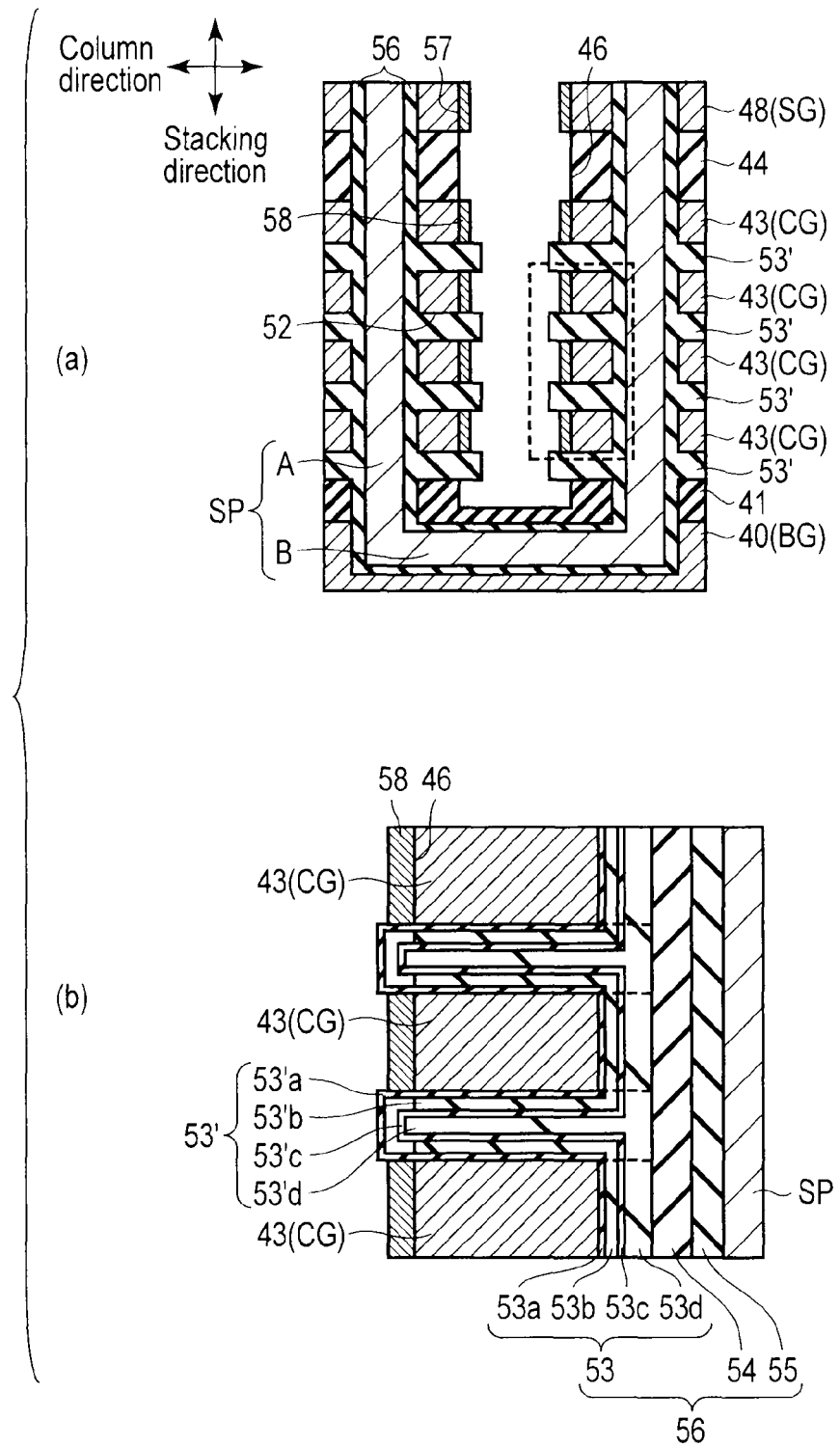
F I G. 24

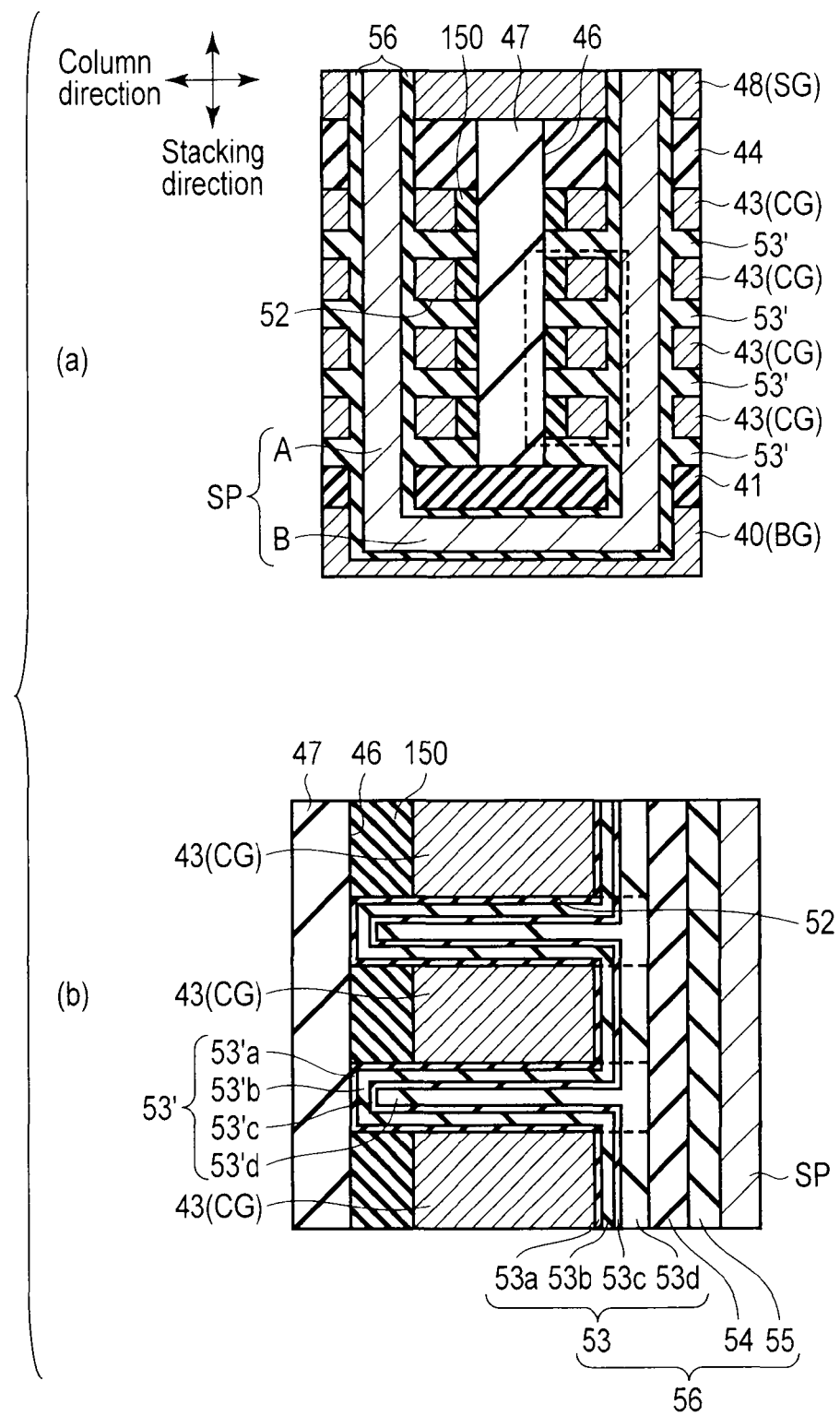
F I G. 26

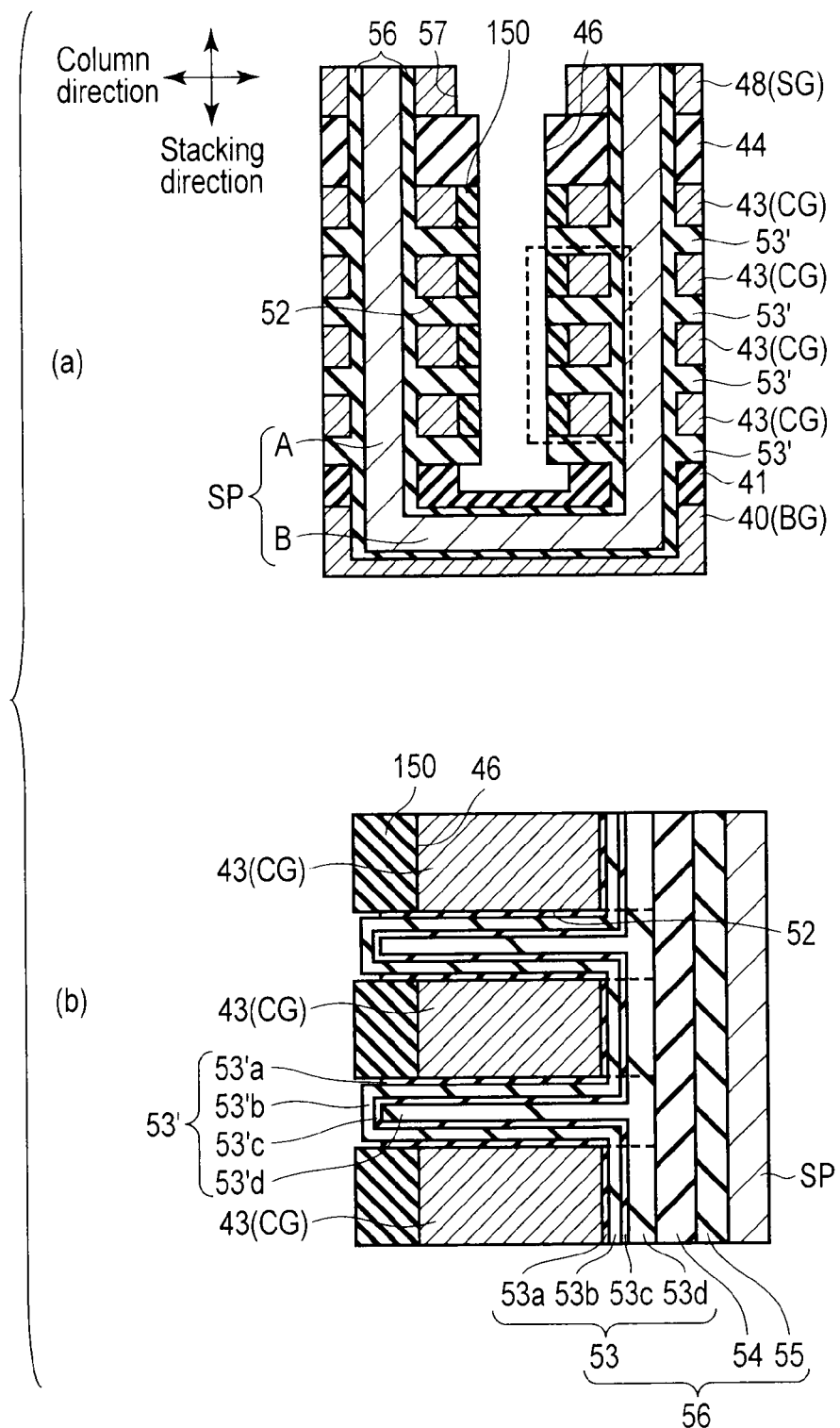
F I G. 27

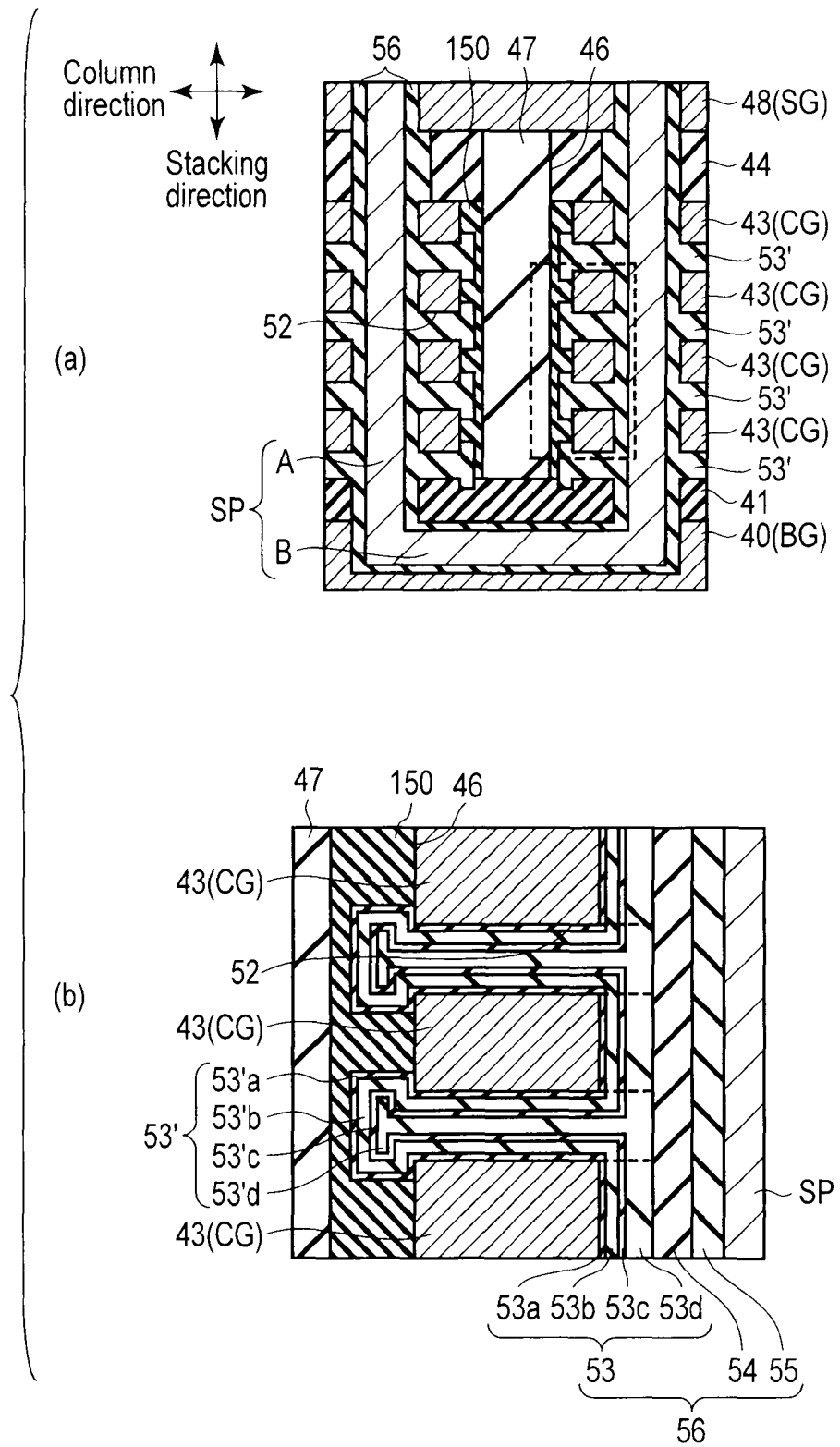
F I G. 3 1

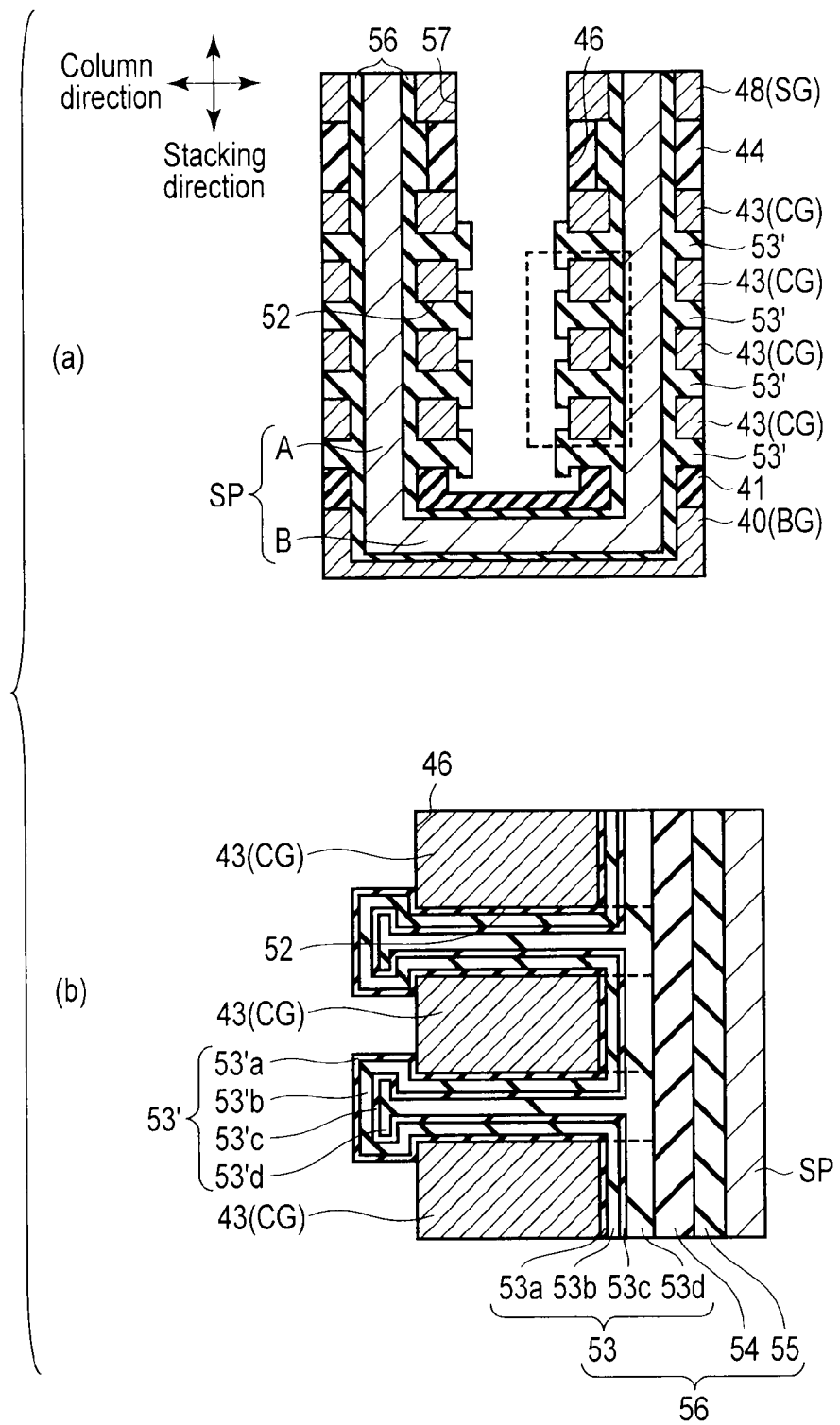
F I G. 33

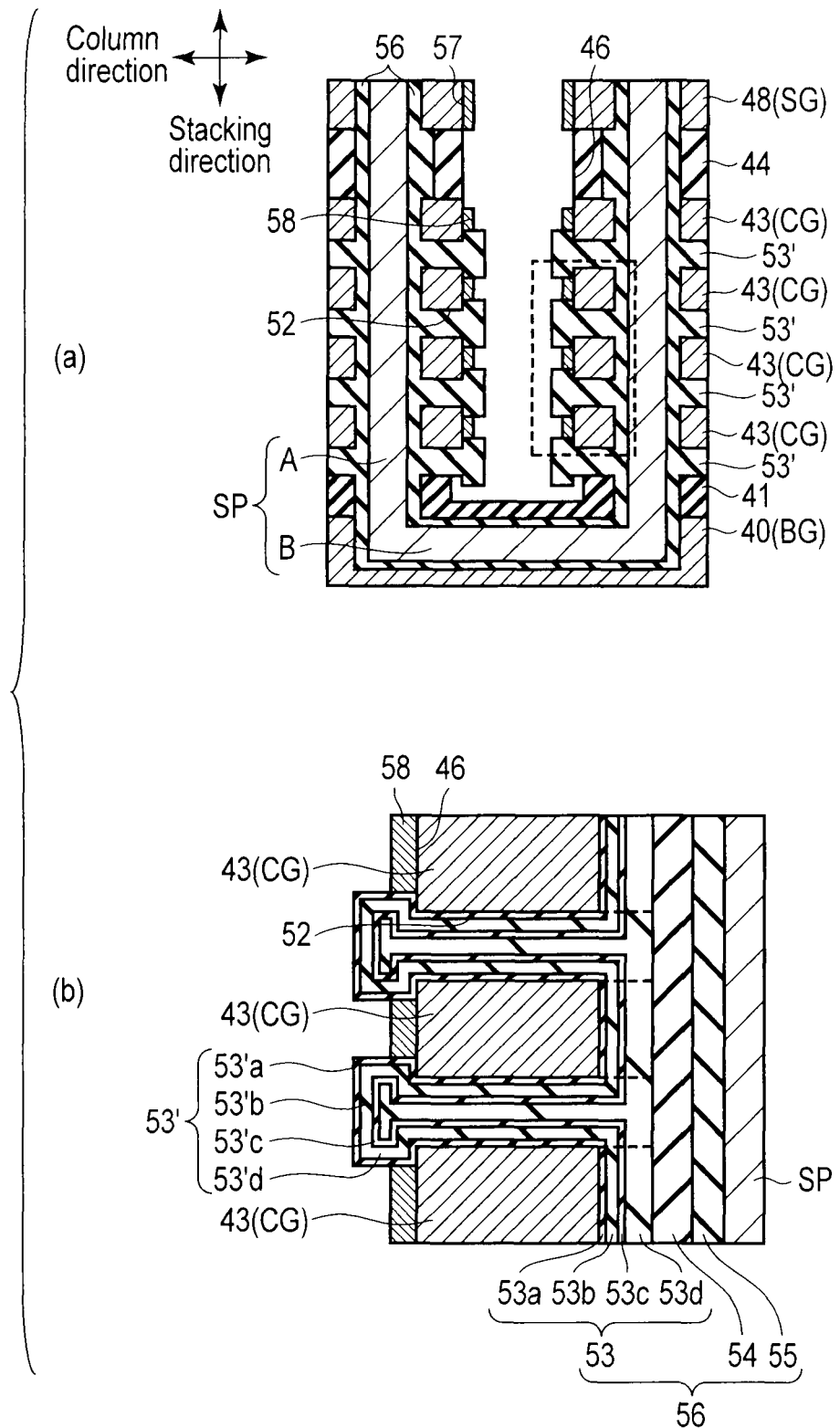
F I G. 34

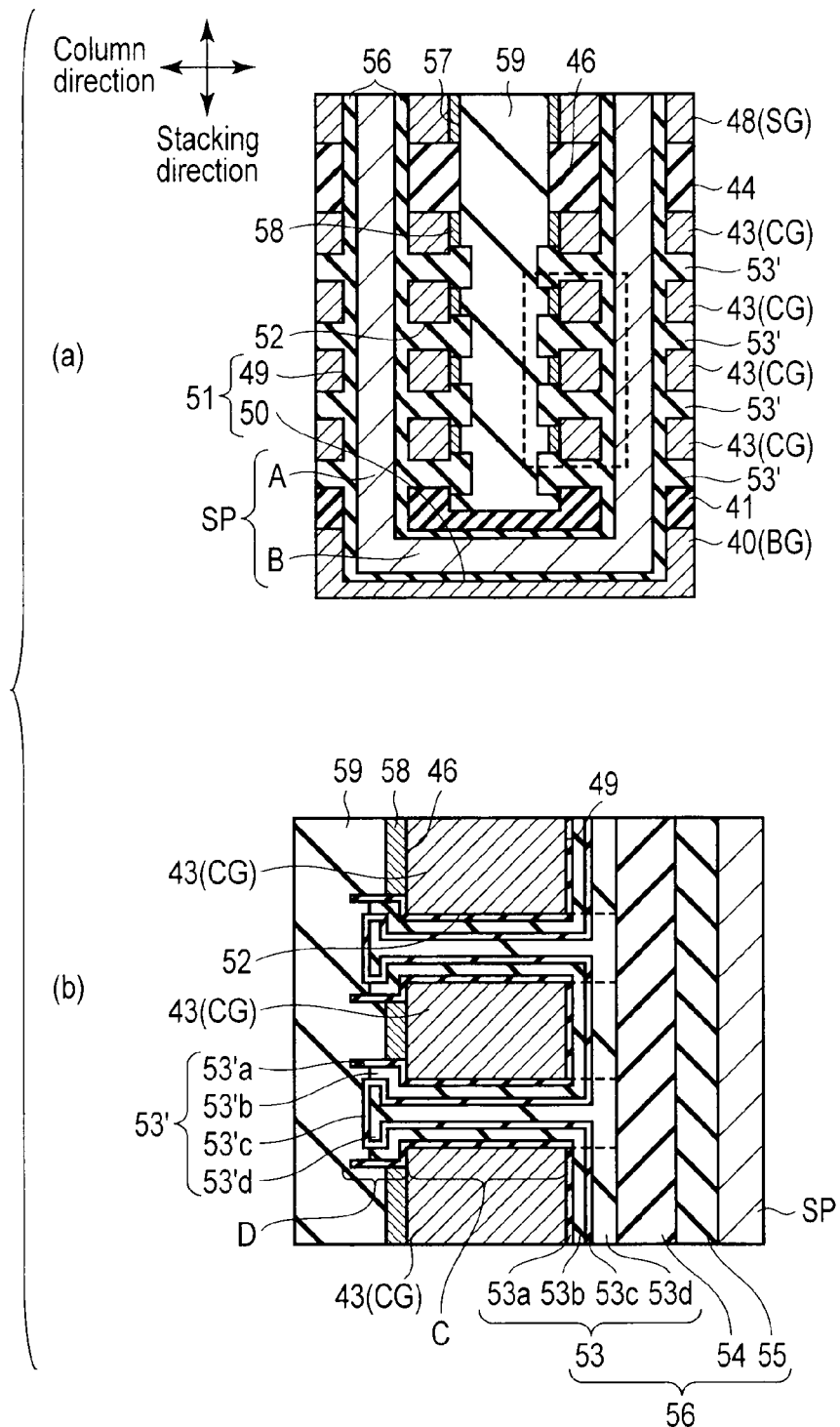
F I G. 3 5

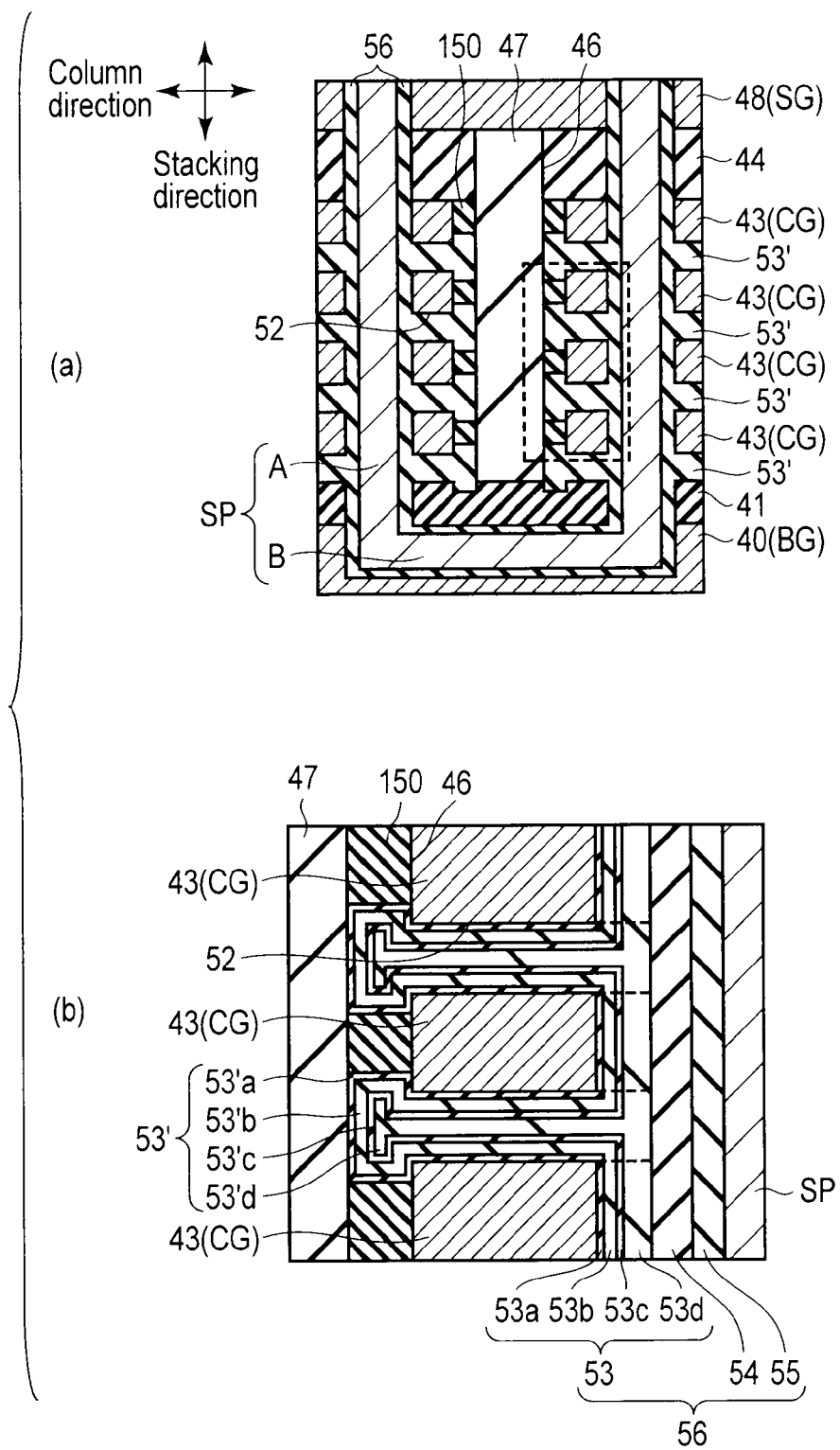
F I G. 36

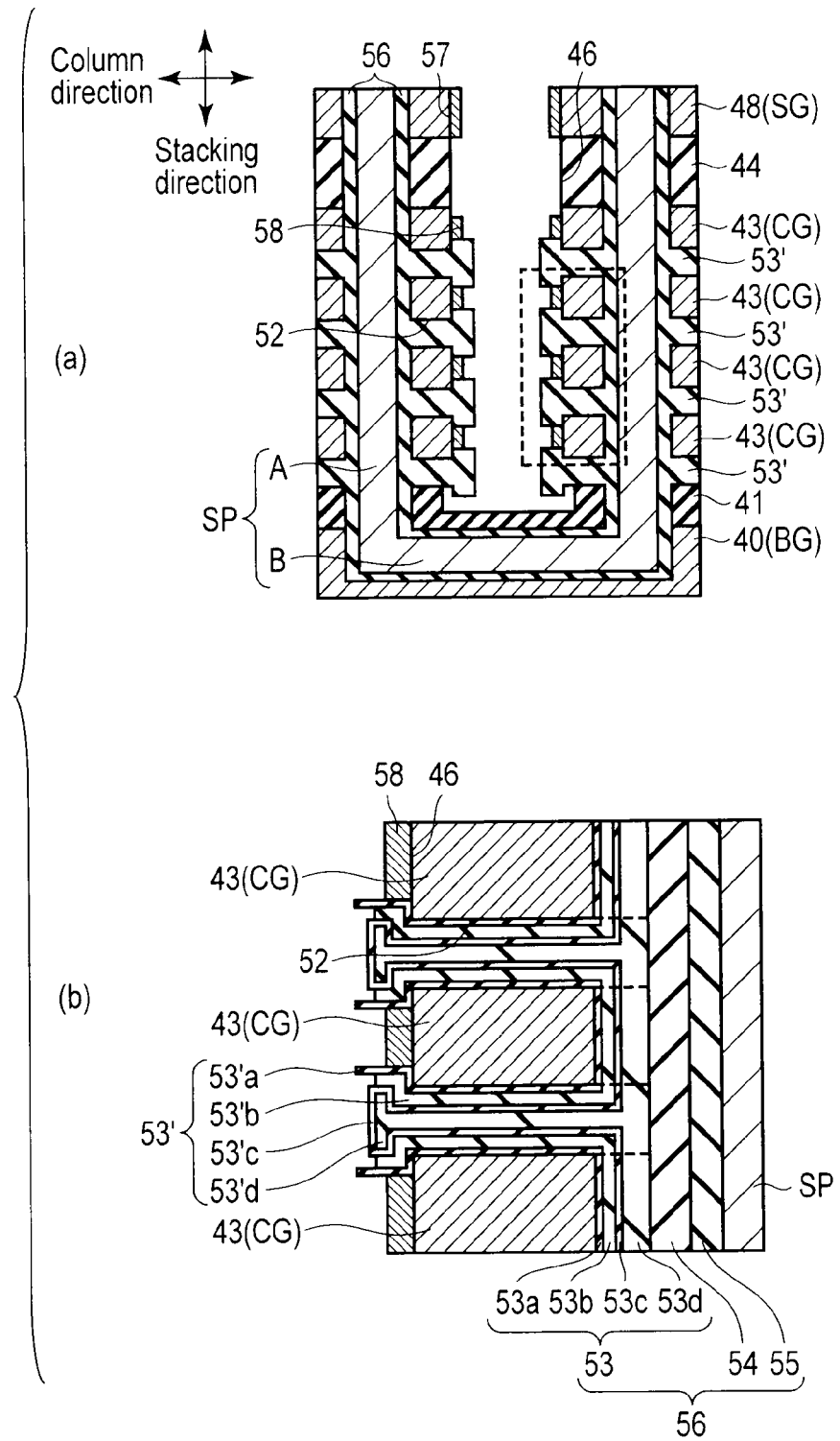
F I G. 39

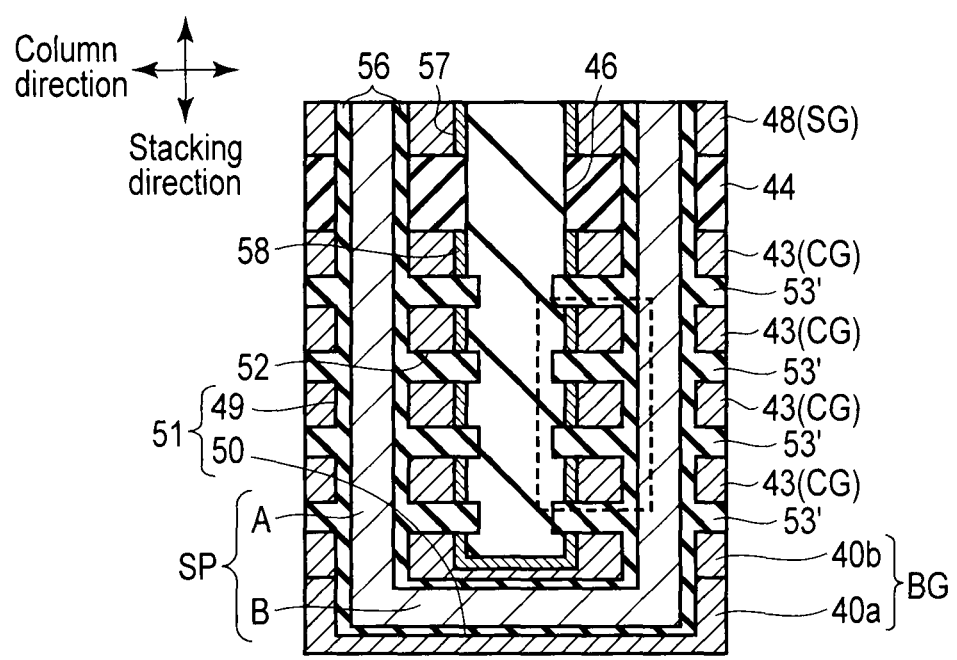
F I G. 40

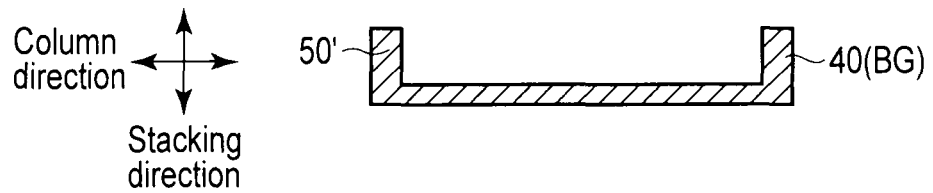
F I G. 4 1
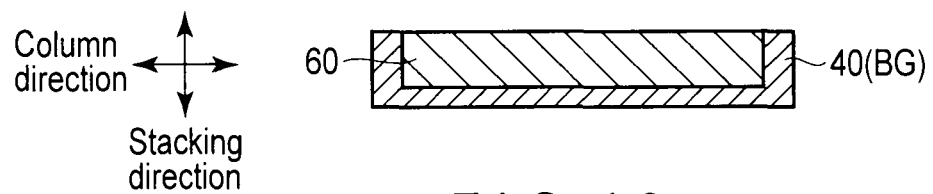
F I G. 4 2
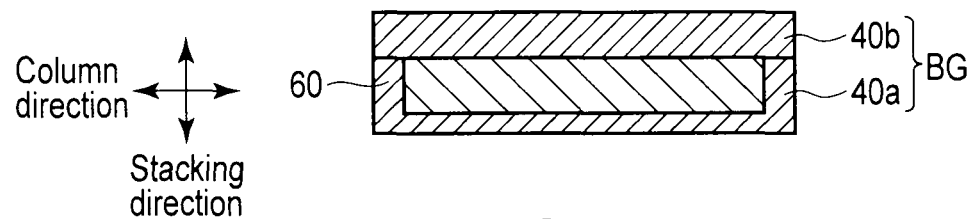
F I G. 4 3

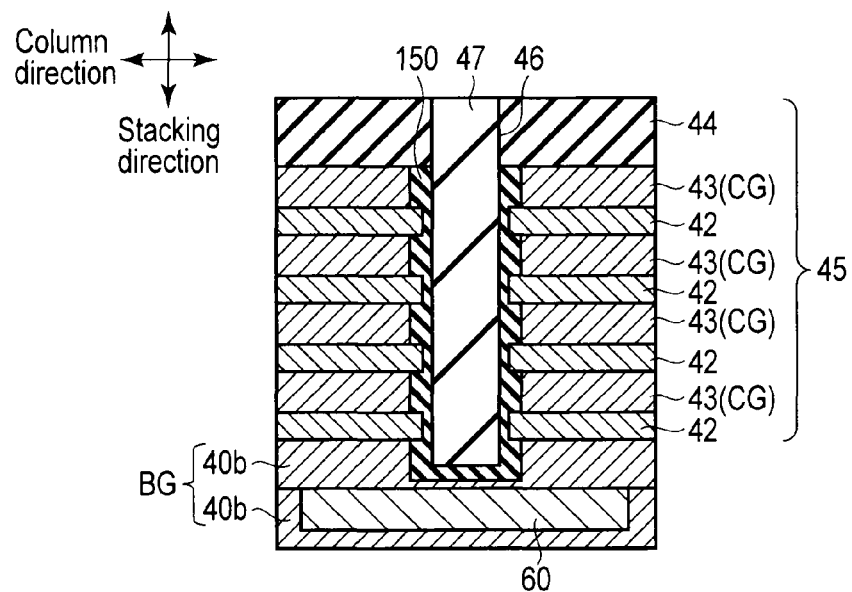
F I G. 46
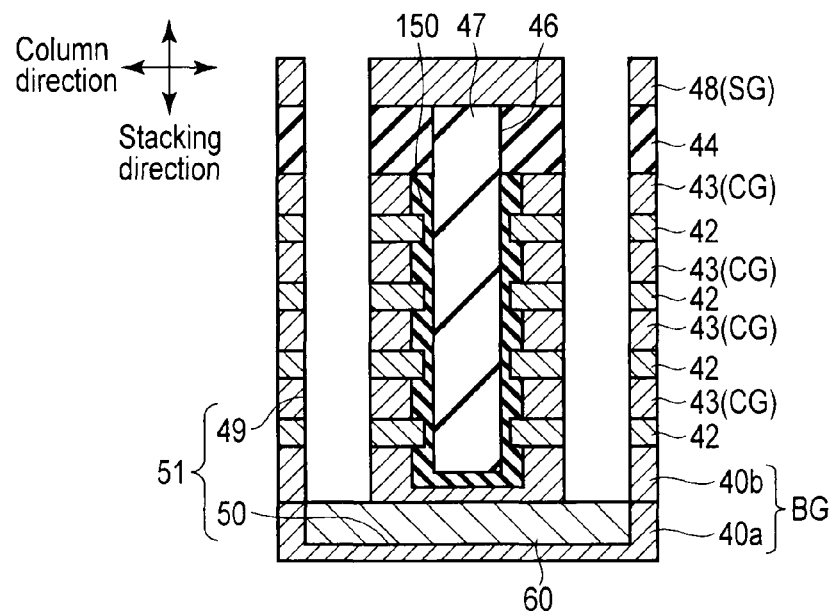
F I G. 47

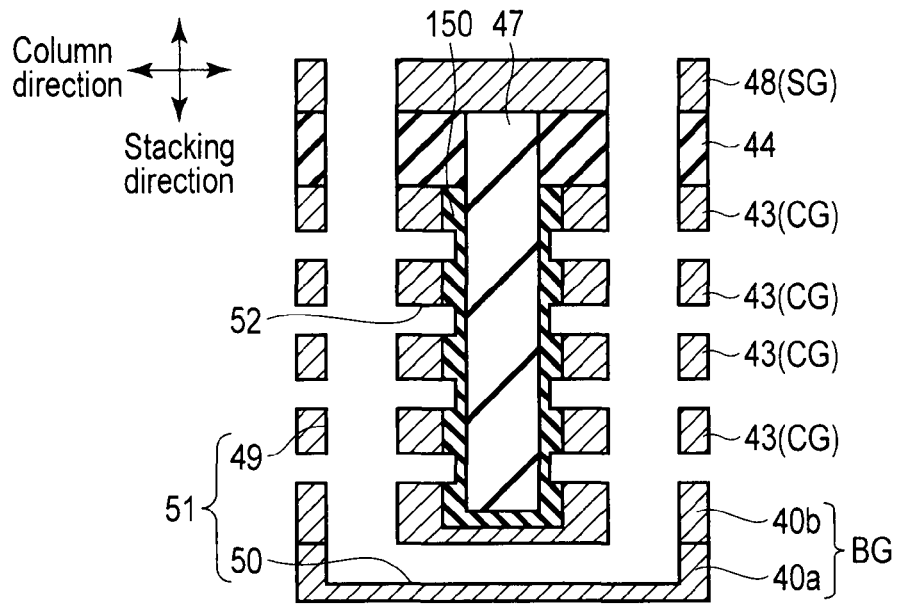
F I G. 4 8
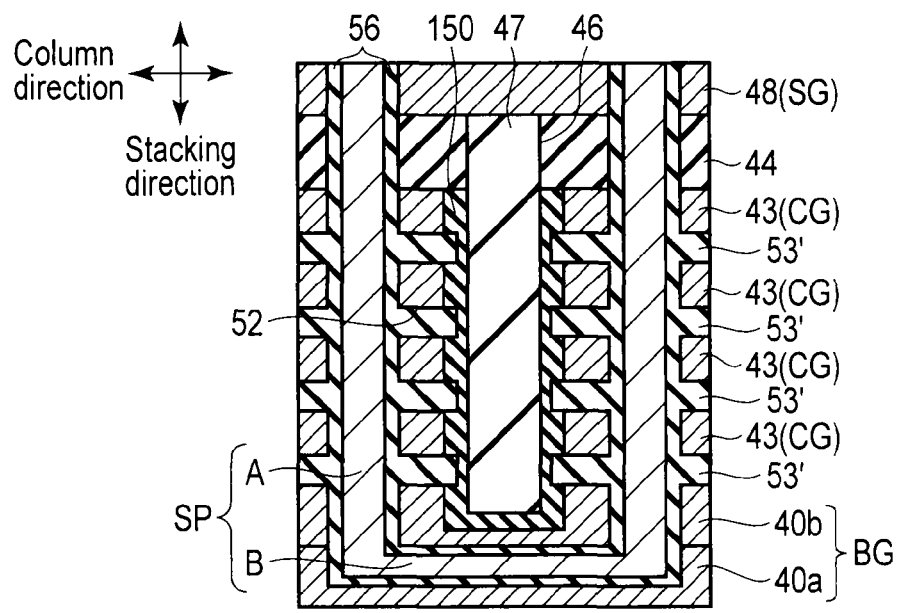
F I G. 4 9

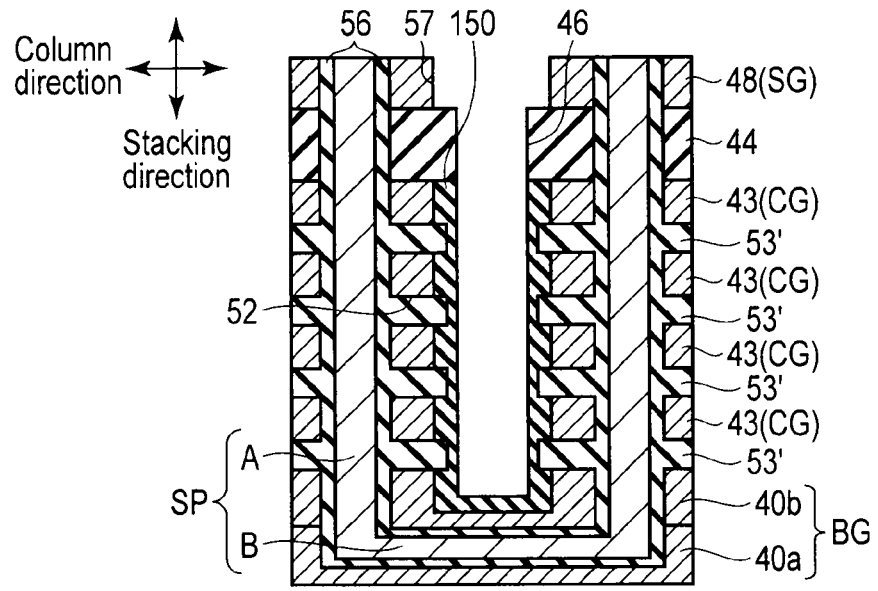
F I G. 5 0
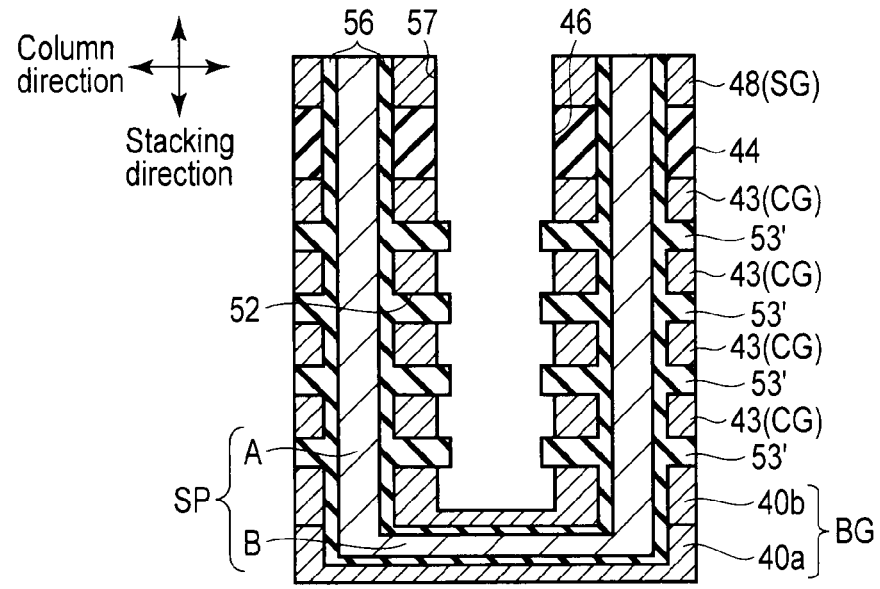
F I G. 5 1

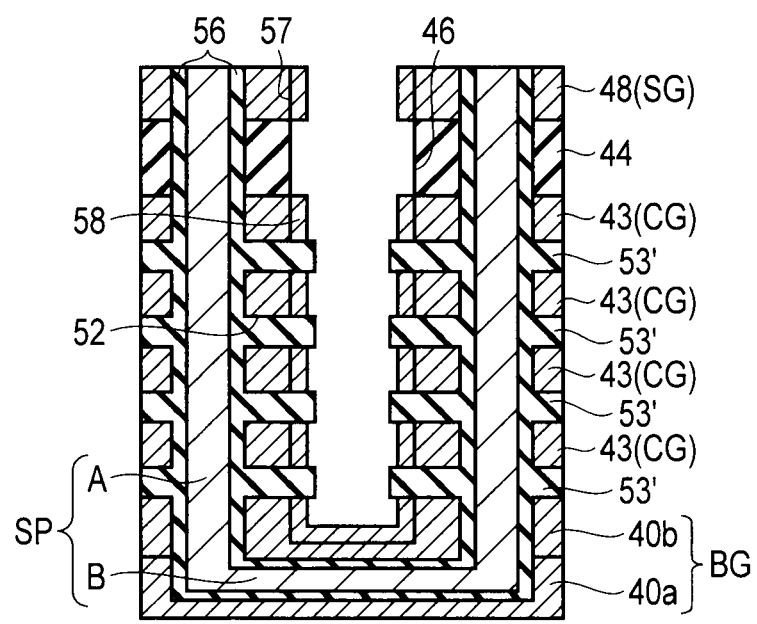
F I G. 52

NONVOLATILE SEMICONDUCTOR MEMORY DEVICE AND METHOD OF MANUFACTURING THE SAME

CROSS-REFERENCE TO RELATED APPLICATIONS

This application is based upon and claims the benefit of priority from prior Japanese Patent Application No. 2011-066180, filed Mar. 24, 2011, the entire contents of which are incorporated herein by reference.

FIELD

Embodiments described herein relate generally to a nonvolatile semiconductor memory device and a method of manufacturing the same.

BACKGROUND

In a conventional LSI, the elements are integrated in the two-dimensional plane on a silicon substrate. However, the storage capacity of a memory can be increased only by downsizing (micropatterning) each element. Recently, however, the micropatterning has also become difficult in terms of cost and technique.

To solve the problem, there is proposed an idea of manufacturing a three-dimensionally laminated memory by laminating memory layers three-dimensionally and collectively processing the memory layers. Further, there is proposed a pipe-shaped NAND type flash memory in which a U-shaped NAND string is formed in a laminate direction as the collectively-processed-type three-dimensionally laminated memory. In the pipe-shaped NAND type flash memory, a NAND string is configured of a pair of silicon pillars and a pipe for coupling the silicon pillars in lower ends.

More specifically, memory cell transistors are arranged at the intersections between the silicon pillars and a plurality of stacked word lines. Additionally, select transistors are arranged at the intersections between each of a pair of silicon pillars and two select gates. One of the two select transistors is connected to a bit line, and the other is connected to a source line.

Various manufacturing methods have been proposed as the method of manufacturing the collectively-processed-type three-dimensionally laminated memory.

BRIEF DESCRIPTION OF THE DRAWINGS

FIG. 3 is an enlarged sectional view of a NAND string shown in FIG. 2;

FIG. 8 is a sectional view showing a step in the manufacture of the nonvolatile semiconductor memory device related to each embodiment taken along the column direction following FIG. 7;

FIG. 9 is a sectional view showing a step in the manufacture of the nonvolatile semiconductor memory device related to each embodiment taken along the column direction following FIG. 8;

FIG. 10 is a sectional view showing a step in the manufacture of the nonvolatile semiconductor memory device related to each embodiment taken along the column direction following FIG. 9;

FIG. 11 is a sectional view showing a step in the manufacture of the nonvolatile semiconductor memory device related to each embodiment taken along the column direction following FIG. 10;

FIG. 13 is a sectional view showing a step in the manufacture of the nonvolatile semiconductor memory device related to each embodiment taken along the column direction following FIG. 12;

FIG. 16 is a sectional view showing a step in the manufacture of the nonvolatile semiconductor memory device according to the first embodiment taken along the column direction;

FIG. 17 is a sectional view showing a step in the manufacture of the nonvolatile semiconductor memory device according to the first embodiment taken along the column direction following FIG. 16;

FIG. 18 is a sectional view showing a step in the manufacture of the nonvolatile semiconductor memory device according to the first embodiment taken along the column direction following FIG. 17;

FIG. 19 is a sectional view showing a step in the manufacture of the nonvolatile semiconductor memory device according to the first embodiment taken along the column direction following FIG. 18;

FIG. 20 is a sectional view showing a step in the manufacture of the nonvolatile semiconductor memory device according to the first embodiment taken along the column direction following FIG. 19;

FIG. 21 is a sectional view showing a step in the manufacture of the nonvolatile semiconductor memory device according to the first embodiment taken along the column direction following FIG. 20;

FIG. 22 is a sectional view showing a step in the manufacture of the nonvolatile semiconductor memory device according to the first embodiment taken along the column direction following FIG. 21;

FIG. 23 is a sectional view showing a step in the manufacture of the nonvolatile semiconductor memory device according to the first embodiment taken along the column direction following FIG. 22;

FIG. 24 is a sectional view showing a step in the manufacture of the nonvolatile semiconductor memory device according to the first embodiment taken along the column direction following FIG. 23;

FIG. 26 is a sectional view showing a step in the manufacture of the nonvolatile semiconductor memory device according to the second embodiment taken along the column direction;

FIG. 27 is a sectional view showing a step in the manufacture of the nonvolatile semiconductor memory device according to the second embodiment taken along the column direction following FIG. 26;

FIG. 31 is a sectional view showing a step in the manufacture of the nonvolatile semiconductor memory device according to the third embodiment taken along the column direction;

FIG. 33 is a sectional view showing a step in the manufacture of the nonvolatile semiconductor memory device according to the third embodiment taken along the column direction following FIG. 32;

FIG. 34 is a sectional view showing a step in the manufacture of the nonvolatile semiconductor memory device according to the third embodiment taken along the column direction following FIG. 33;

FIG. 35 is a sectional view showing a nonvolatile semiconductor memory device according to the fourth embodiment taken along the column direction;

FIG. 36 is a sectional view showing a step in the manufacture of the nonvolatile semiconductor memory device according to the fourth embodiment taken along the column direction;

FIG. 39 is a sectional view showing a step in the manufacture of the nonvolatile semiconductor memory device according to the fourth embodiment taken along the column direction following FIG. 38;

FIG. 40 is a sectional view showing a nonvolatile semiconductor memory device according to the fifth embodiment taken along the column direction;

FIG. 41 is a sectional view showing a step in the manufacture of the nonvolatile semiconductor memory device according to the fifth embodiment taken along the column direction;

FIG. 42 is a sectional view showing a step in the manufacture of the nonvolatile semiconductor memory device according to the fifth embodiment taken along the column direction following FIG. 41;

FIG. 43 is a sectional view showing a step in the manufacture of the nonvolatile semiconductor memory device according to the fifth embodiment taken along the column direction following FIG. 42;

FIG. 46 is a sectional view showing a step in the manufacture of the nonvolatile semiconductor memory device according to the fifth embodiment taken along the column direction following FIG. 45;

FIG. 47 is a sectional view showing a step in the manufacture of the nonvolatile semiconductor memory device according to the fifth embodiment taken along the column direction following FIG. 46;

FIG. 48 is a sectional view showing a step in the manufacture of the nonvolatile semiconductor memory device according to the fifth embodiment taken along the column direction following FIG. 47;

FIG. 49 is a sectional view showing a step in the manufacture of the nonvolatile semiconductor memory device according to the fifth embodiment taken along the column direction following FIG. 48;

FIG. 50 is a sectional view showing a step in the manufacture of the nonvolatile semiconductor memory device according to the fifth embodiment taken along the column direction following FIG. 49;

FIG. 51 is a sectional view showing a step in the manufacture of the nonvolatile semiconductor memory device according to the fifth embodiment taken along the column direction following FIG. 50; and FIG. 52 is a sectional view showing a step in the manufacture of the nonvolatile semiconductor memory device according to the fifth embodiment taken along the column direction following FIG. 51.

DETAILED DESCRIPTION

Figure 1:
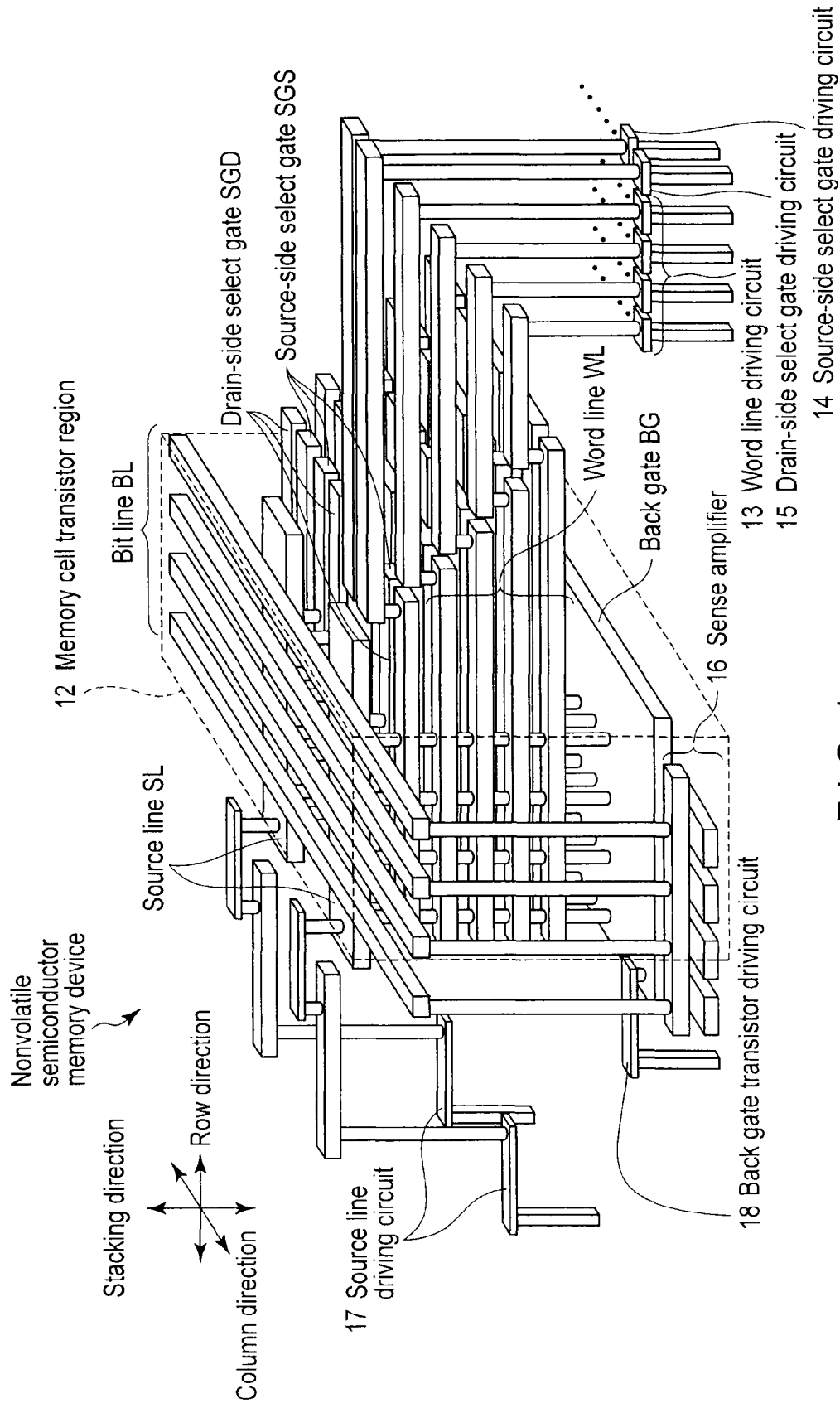
FIG. 1 is a perspective view showing the schematic arrangement of a nonvolatile semiconductor memory device according to each embodiment.

In general, according to one embodiment, a nonvolatile semiconductor memory device comprises: a semiconductor substrate; a first conductive layer; a second conductive layer, a first inter-electrode insulating film, and a third conductive layer sequentially stacked above the first conductive layer; a block insulating film; a charge storage layer; a tunnel insulating film; a semiconductor layer; an insulating member; and a silicide layer. The first conductive layer is formed above the semiconductor substrate. The block insulating film is formed on the inner surface of each of through holes provided in the second conductive layer, the first inter-electrode insulating film, and the third conductive layer and extending in the stacking direction. The charge storage layer is formed on the block insulating film. The tunnel insulating film is formed on the charge storage layer. The semiconductor layer is formed on the tunnel insulating film. The insulating member is buried in a slit located between the adjacent through holes to divide the second conductive layer, the first inter-electrode insulating film, and the third conductive layer. The silicide layer is formed on each of surfaces of the second conductive layer and the third conductive layer in the slit. The distance between the second conductive layer and the third conductive layer along the inner surface of the slit is longer than the distance between the second conductive layer and the third conductive layer along the stacking direction.

The embodiments will now be described with reference to the accompanying drawings. The same reference numerals denote the same parts throughout the drawings.

<Example of Overall Arrangement>

An example of the arrangement of a nonvolatile semiconductor memory device (collectively-processed-type three-dimensionally laminated memory) according to each embodiment will be explained with reference to FIGS. 1, 2, and 3.

FIG. 1 is a perspective view showing the schematic arrangement of a nonvolatile semiconductor memory device according to each embodiment.

As shown in FIG. 1, the nonvolatile semiconductor memory device comprises a memory cell transistor region 12, a plurality of word line driving circuits 13, a plurality of source-side select gate driving circuits 14, a plurality of drain-side select gate driving circuits 15, a sense amplifier 16, a plurality of source line driving circuits 17, and a back gate transistor driving circuit 18.

The memory cell transistor region 12 includes a plurality of word lines WL, a plurality of bit lines BL, a plurality of source lines SL, a back gate BG, a plurality of source-side select gates SGS, and a plurality of drain-side select gates SGD. In the memory cell transistor region 12, memory cell transistors for storing data are arranged at the intersections between the plurality of stacked word lines WL and U-shaped silicon pillars SP to be described later. Note that although FIG. 1 illustrates an example in which four layers of word lines WL are stacked, the present embodiment is not limited to this.

The word line driving circuits 13 are connected to the word lines WL to control the voltages to be applied to the word lines WL.

The source-side select gate driving circuits 14 are connected to the source-side select gates SGS to control the voltages to be applied to the source-side select gates SGS.

The drain-side select gate driving circuits 15 are connected to the drain-side select gates SGD to control the voltages to be applied to the drain-side select gates SGD.

The sense amplifier 16 is connected to the bit lines BL to amplify the potential read from the memory cell transistors. Bit line driving circuits (not shown) are connected to the bit lines BL to control the voltages to be applied to the bit lines BL.

The source line driving circuits 17 are connected to the source lines SL to control the voltages to be applied to the source lines SL.

The back gate driving circuit 18 is connected to the back gate BG to control the voltage to be applied to the back gate BG.

Figure 2:
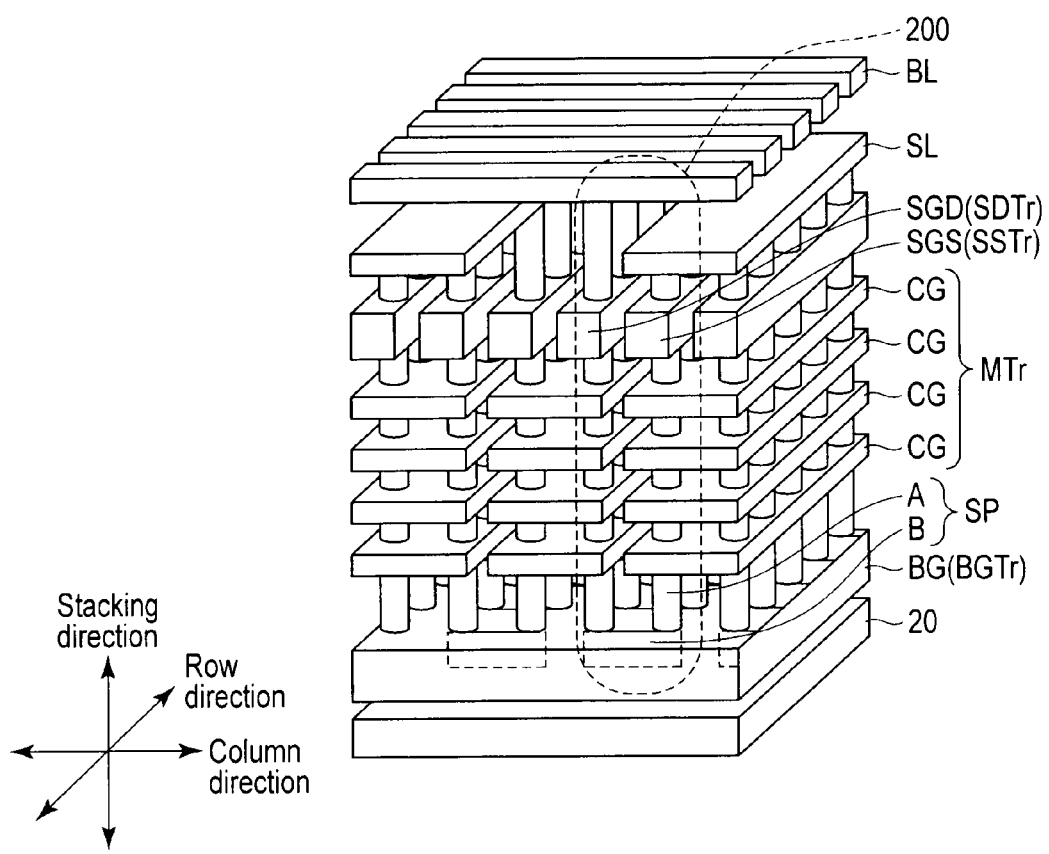
FIG. 2 is a perspective view of a memory cell transistor region shown in FIG. 1.

FIG. 2 is a perspective view of the memory cell transistor region shown in FIG. 1 and shows the structure of a NAND string (memory cell string).

FIG. 3 is an enlarged sectional view of the NAND string shown in FIG. 2.

As shown in FIG. 2, in the memory cell transistor region 12, a plurality of NAND strings 200 formed from the U-shaped silicon pillars SP are formed on a semiconductor substrate 20. The plurality of NAND strings 200 are arranged in a matrix in the row direction and the column direction.

Each NAND string 200 includes a plurality of memory cell transistors MTr, and two select transistors (a drain-side select transistor SDTr and a source-side select transistor SSTr) formed at the two ends.

The plurality of memory cell transistors MTr are formed at the intersections between the U-shaped silicon pillar SP and a plurality of control gates CG (word lines WL), and have the current paths connected in series. As shown in FIG. 3, each memory cell transistor MTr has a memory film 324 between the U-shaped silicon pillar SP and the control gate CG. The memory film 324 includes a tunnel insulating film 322, a charge storage layer 321, and a block insulating film 320 which are sequentially formed around the U-shaped silicon pillar SP.

The drain-side select transistor SDTr is formed at the intersection between the U-shaped silicon pillar SP and the drain-side select gate SGD. On the other hand, the source-side select transistor SSTr is formed at the intersection between the U-shaped silicon pillar SP and the source-side select gate SGS. As shown in FIG. 3, each of the drain-side select transistor SDTr and the source-side select transistor SSTr has the same structure as that of the memory cell transistor MTr.

The U-shaped silicon pillar SP is formed into a U shape along the section in the column direction. The U-shaped silicon pillar SP includes a pair of columnar portions A running in the stacking direction (in the direction perpendicular to the semiconductor substrate 20) and a pipe portion B formed to connect the lower ends of the pair of columnar portions A. The pipe portion B is provided in the back gate BG to form a back gate transistor BGTr. The U-shaped silicon pillar SP is arranged such that the line connecting the central axes of the pair of columnar portions A becomes parallel to the column direction. The U-shaped silicon pillars SP are arranged in a matrix within a row- and column-direction plane. As shown in FIG. 3, the U-shaped silicon pillar SP has a hollow H1 which is filled with an insulating portion 325.

The plurality of control gates CG are stacked above the back gate BG and arranged to be perpendicular to the columnar portions A of the U-shaped silicon pillars SP. Each control gate CG runs in the row direction. Each control gate CG is formed to be shared by two adjacent columnar portions A of the U-shaped silicon pillars SP in two NAND strings 200 adjacent in the column direction.

The back gate BG is provided under the lowermost word lines WL. The back gate BG two-dimensionally spreads in the row direction and the column direction so as to cover the pipe portions B of the U-shaped silicon pillars SP.

The drain-side select gates SGD and the source-side select gates SGS are provided above the uppermost control gates CG. The drain-side select gates SGD and the source-side select gates SGS parallelly run in the row direction. The drain-side select gates SGD and the source-side select gates SGS are formed to intersect the columnar portions A of the U-shaped silicon pillars SP, and isolated from each other in the column direction to have a line-and-space configuration.

The source lines SL are provided above the source-side select gates SGS. Each source line SL is formed to be shared by two adjacent columnar portions A of the U-shaped silicon pillars SP in two NAND strings 200 adjacent in the column direction. The source lines SL parallelly run in the row direction and are isolated from each other in the column direction to have a line-and-space configuration.

The plurality of bit lines BL are provided above the source lines SL. The bit lines BL run in the column direction and are isolated from each other in the row direction to have a line-and-space configuration.

[Example of Manufacturing Method]

As an example of a method of manufacturing the above-described collectively-processed-type three-dimensionally laminated memory, the present inventors have proposed a method comprising stacking p-type polysilicon and undoped polysilicon, forming memory holes extending through the polysilicon layers, etching the undoped polysilicon layer from the memory holes using a wet process, and burying an insulating film in the etched layer, thereby forming a stacked structure of the conductive layer (p-type polysilicon) and the insulating film.

The method of manufacturing the above-described collectively-processed-type three-dimensionally laminated memory will be described below in detail with reference to FIGS. 4, 5, 6, 7, 8, 9, 10, 11, 12, 13, 14.

FIGS. 4, 5, 6, 7, 8, 9, 10, 11, 12, 13, 14 are sectional views showing steps in the manufacture of the nonvolatile semiconductor memory device related to each embodiment taken along the column direction. FIGS. 11(b), 12(b), 13(b), and 14(b) are enlarged views of the broken line portions in FIGS. 11(a), 12(a), 13(a), and 14(a), respectively. Note that one NAND string of the nonvolatile semiconductor memory device will mainly be explained with reference to FIGS. 4, 5, 6, 7, 8, 9, 10, 11, 12, 13, 14.

Figure 4:
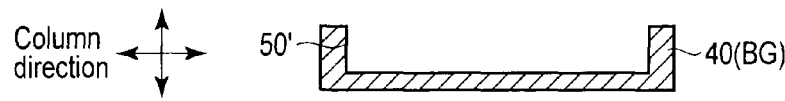
FIG. 4 is a sectional view showing a step in the manufacture of the nonvolatile semiconductor memory device related to each embodiment taken along the column direction.

As shown in FIG. 4, a conductive layer 40 that is a prospective back gate BG is formed above a semiconductor substrate (not shown). The conductive layer 40 is made of, for example, phosphorus-doped polysilicon. A trench 50' is formed in the conductive layer 40 by photolithography and etching. The trench 50' runs in the column direction and serves as a connection hole 50 to be described later in a subsequent process. A plurality of trenches 50' are arranged in a matrix within a row- and column-direction plane.

Figure 5:
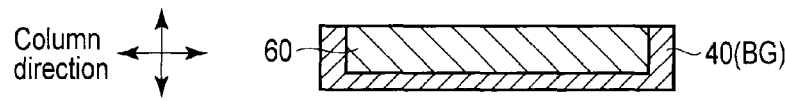
FIG. 5 is a sectional view showing a step in the manufacture of the nonvolatile semiconductor memory device related to each embodiment taken along the column direction following FIG. 4.

As shown in FIG. 5, an undoped polysilicon member containing no impurity is formed on the entire surface. After that, the undoped polysilicon member is removed from the upper surface of the conductive layer 40 outside the trench 50' by etching and remains only in the trench 50'. A dummy layer 60 made of undoped polysilicon and buried in the trench 50' is thus formed.

Figure 6:
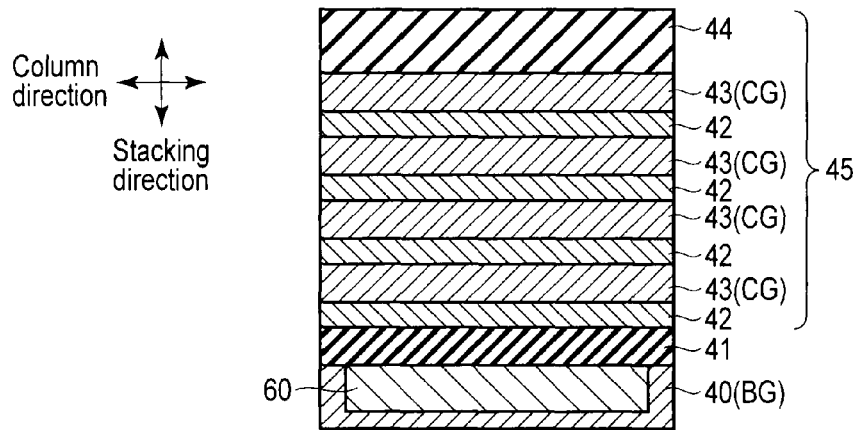
FIG. 6 is a sectional view showing a step in the manufacture of the nonvolatile semiconductor memory device related to each embodiment taken along the column direction following FIG. 5.

As shown in FIG. 6, a silicon oxide film 41 serving as an insulating film is formed on the conductive layer 40 including the dummy layer 60. The silicon oxide film 41 is so thick that the breakdown voltage can be ensured between the back gate BG and lowermost control gates CG formed on the silicon oxide film 41 in a subsequent process.

Undoped polysilicon layers 42 containing no impurity and doped polysilicon layers (p-type polysilicon layers) 43 containing boron and serving as the control gates CG are alternately stacked on the silicon oxide film 41. Each undoped polysilicon layer 42 is replaced with an inter-electrode insulating film in the subsequent process. Note that although FIG. 6 illustrates an example in which the undoped polysilicon layers 42 and the doped polysilicon layers 43 are stacked in four layers, the number of stacked layers is not limited to four.

A silicon oxide film 44 serving as an insulating film is formed on the uppermost doped polysilicon layer 43. The silicon oxide film 44 is so thick that the breakdown voltage can be ensured between the uppermost control gates CG and select gates SG to be formed on the silicon oxide film 44 in the subsequent process.

A stacked body 45 including the undoped polysilicon layers 42, the doped polysilicon layers 43, and the silicon oxide film 44 is formed in this way.

Figure 7:
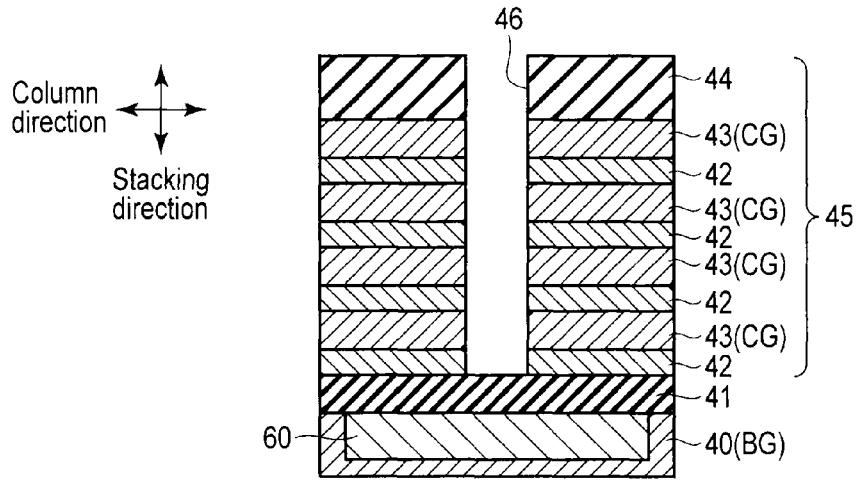
FIG. 7 is a sectional view showing a step in the manufacture of the nonvolatile semiconductor memory device related to each embodiment taken along the column direction following FIG. 6.
Figure 12:
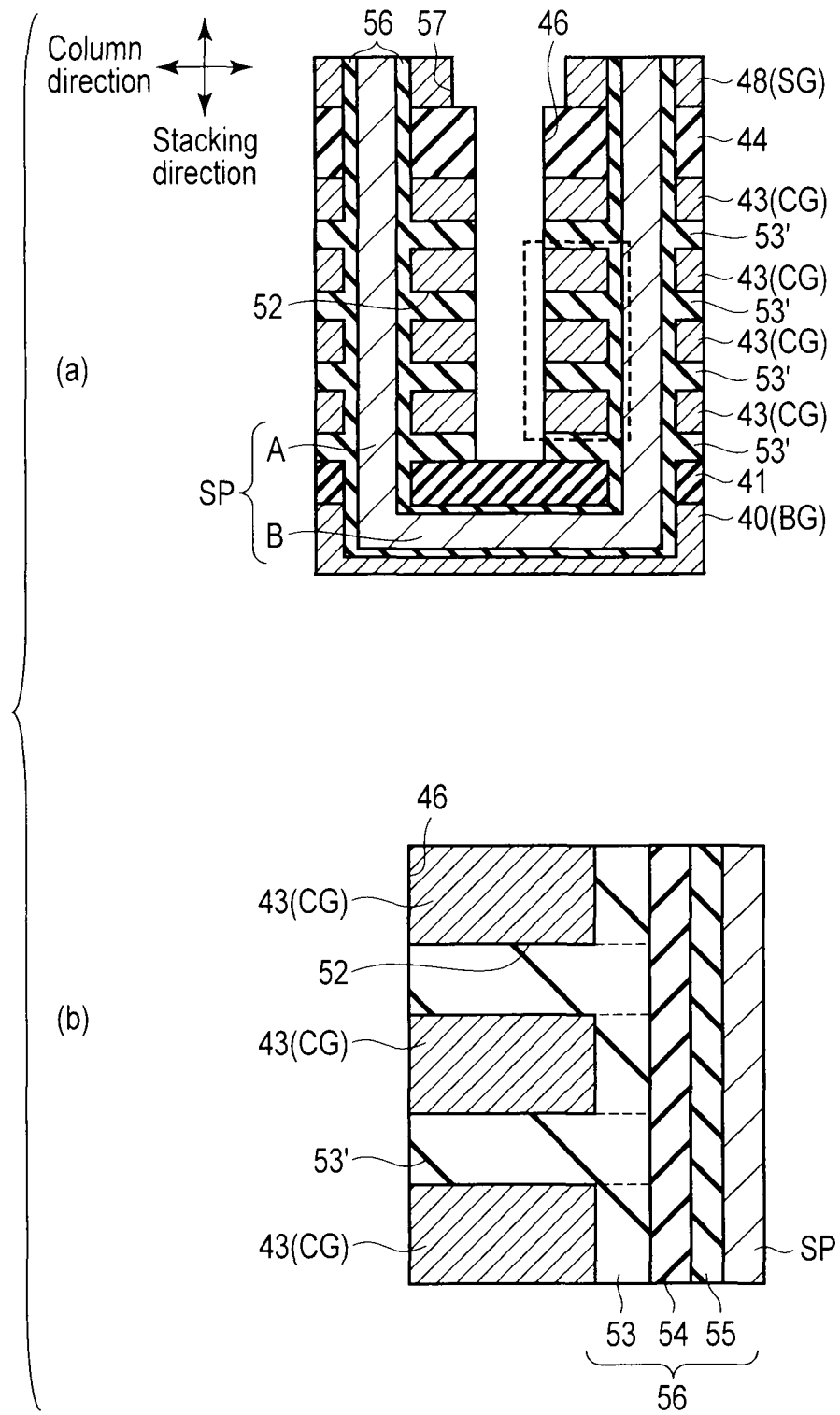
FIG. 12 is a sectional view showing a step in the manufacture of the nonvolatile semiconductor memory device related to each embodiment taken along the column direction following FIG. 11.
Figure 14:
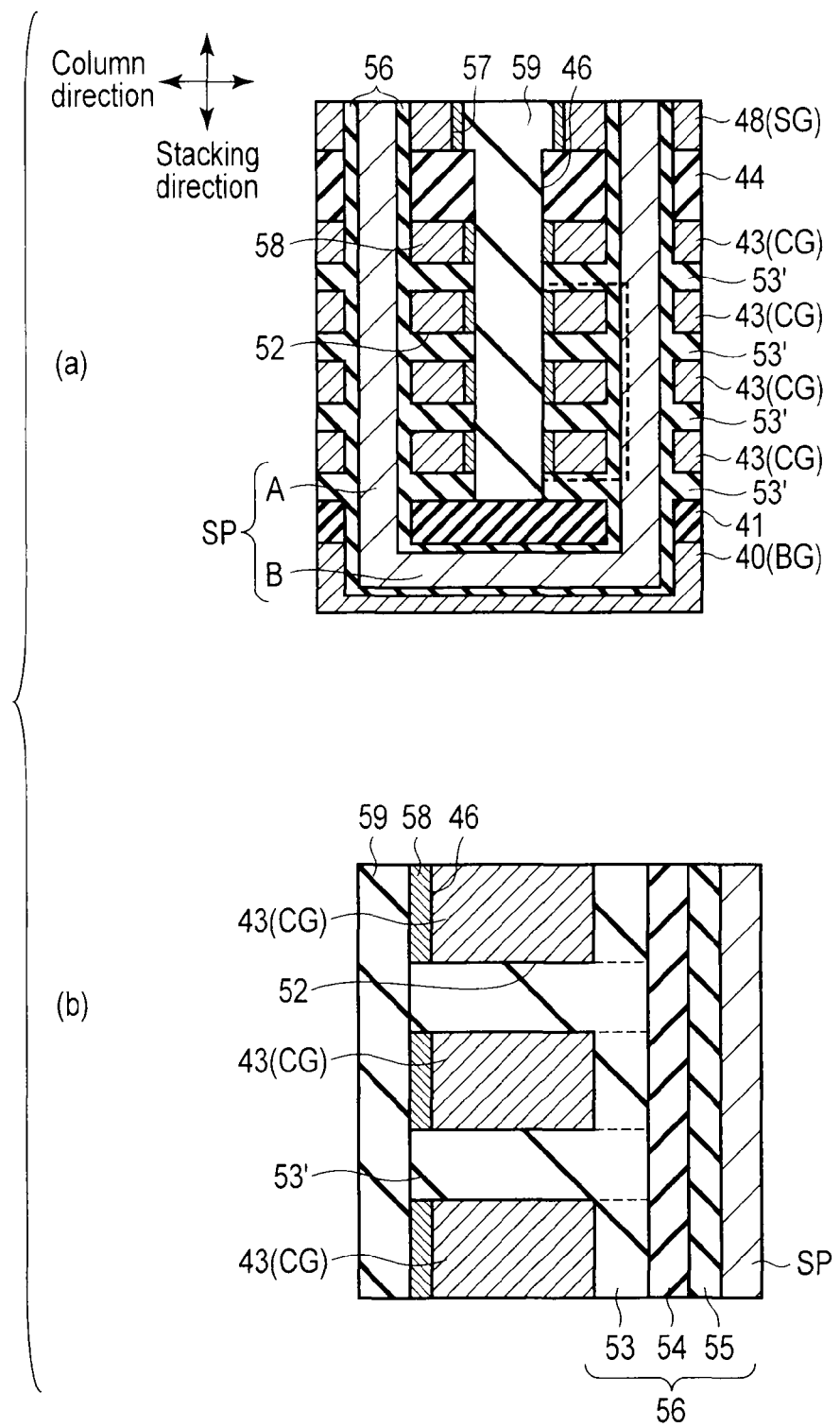
FIG. 14 is a sectional view showing a step in the manufacture of the nonvolatile semiconductor memory device related to each embodiment taken along the column direction following FIG. 13.

As shown in FIG. 7, a slit 46 is formed in the stacked body 45 by photolithography and etching. The slit 46 extends through the stacked body 45 and is formed along the row direction (the depth direction of the drawing surface of FIG. 7). That is, the slit 46 is formed to spread in the row direction and the stacking direction and divides the stacked body 45. The slit 46 is formed to be located above the central portion of the dummy layer 60 in the column direction. The silicon oxide film 41 is exposed to the bottom surface of the slit 46.

As shown in FIG. 8, a sacrifice member 47 made of a silicon nitride film is buried in the slit 46. More specifically, the silicon nitride film is formed on the entire surface until the slit 46 is filled. Then, the silicon nitride film on the silicon oxide film 44 is removed. The silicon nitride film thus remains in the slit 46, thereby forming the sacrifice member 47 spreading in the row direction and the stacking direction.

As shown in FIG. 9, a doped polysilicon layer (p-type polysilicon layer) 48 containing boron and serving as prospective select gates SG (a drain-side select gate SGD and a source-side select gate SGS) is formed on the silicon oxide film 44. After that, a pair of through holes 49 are formed in the doped polysilicon layer 48, the stacked body 45, and the silicon oxide film 41. At this time, the pair of through holes 49 are formed so as to reach the two ends of the dummy layer 60 in the column direction. The doped polysilicon layer 48, the stacked body 45, the silicon oxide film 41, and the dummy layer 60 are thus exposed through the through holes 49.

Each through hole 49 is formed into, for example, a circular shape when viewed from the stacking direction. The pair of through holes 49 are arranged in the column direction and extend through the doped polysilicon layer 48, the stacked body 45, and the silicon oxide film 41 in the stacking direction.

As shown in FIG. 10, wet etching is performed through the through holes 49. This wet etching is performed using, for example, an alkaline etchant. With this process, the undoped polysilicon layers 42 of the stacked body 45 are removed. As a result, a gap 52 is formed between two control gates CG adjacent in the stacking direction. The sacrifice member 47 is exposed through the gaps 52.

At the same time, the dummy layer 60 made of undoped polysilicon is also removed. A connection hole 50 that extends in the column direction and connects the lower ends of the pair of through holes 49 in the conductive layer 40 is thus formed. That is, a U-shaped memory hole 51 including the pair of through holes 49 and the connection hole 50 is formed in the doped polysilicon layer 48, the stacked body 45, the silicon oxide film 41, and the conductive layer 40.

At this time, appropriately selecting the etchant allows to implement a high etching selectivity between the doped silicon layers 43 and 48 and the undoped silicon layers 42 and the dummy layer 60. Hence, the doped polysilicon layers 43 and 48 are rarely etched and remain. The control gates CG are supported by the sacrifice member 47.

As shown in FIGS. 11(a) and (b), a memory film 56 including a block insulating film 53, a charge storage layer 54, and a tunnel insulating film 55, and a U-shaped silicon pillar SP including a pair of columnar portions A and a connection portion B are formed in the U-shaped memory hole 51.

More specifically, the block insulating film 53 made of a silicon oxide film is formed on the inner surfaces of the through holes 49 by, for example, ALD (Atomic Layer Deposition). That is, the block insulating film 53 is formed on the surfaces of the control gates CG exposed in the through holes 49.

The silicon oxide film is also formed on the inner surfaces of the gaps 52 through the through holes 49. That is, the silicon oxide film is also formed on the surfaces of the control gates CG and the surfaces of the sacrifice member 47, which are exposed in the gaps 52. Inter-electrode insulating films 53' integrated with the block insulating film 53 thus fill the gaps 52.

Next, the charge storage layer 54 made of a silicon nitride film is formed on the surface of the block insulating film 53

(and the inter-electrode insulating films 53') in the through holes 49. After that, the tunnel insulating film 55 made of a silicon oxide film is formed on the surface of the charge storage layer 54 in the through holes 49. In this way, the memory film 56 including the block insulating film 53, the charge storage layer 54, and the tunnel insulating film 55 is formed.

Polysilicon containing an impurity, for example, phosphorus is buried on the surface of the memory film 56 in the through holes 49. The columnar portions of the silicon pillar SP are thus formed in the through holes 49. Note that FIGS. 11(a) and (b) illustrate an example in which polysilicon fills the through holes 49. However, a hollow structure may be formed, as shown in FIG. 3.

The same structure is formed on the inner surface of the connection hole 50 as well at the same time as the above-described process. That is, the block insulating film 53, the charge storage layer 54, the tunnel insulating film 55, and polysilicon (U-shaped silicon pillar SP) are sequentially formed on the surface of the silicon oxide film 41 and the surface of the back gate BG in the connection hole 50 as well.

As shown in FIGS. 12(a) and (b), an opening portion 57 is formed in the doped polysilicon layer 48 by RIE. The opening portion 57 extends through the doped polysilicon layer 48 and is formed along the row direction (the depth direction of the drawing surface of FIGS. 12(a) and (b)). That is, the opening portion 57 divides the doped polysilicon layer 48. In addition, since the opening portion 57 is formed on the sacrifice member 47, the sacrifice member 47 is exposed to the bottom surface of the opening portion 57.

Next, wet etching is performed through the opening portion 57. The sacrifice member 47 in the slit 46 is thus removed. As a result, the control gates CG and the inter-electrode insulating films 53' are exposed in the slit 46.

As shown in FIGS. 13(a) and (b), a metal layer of nickel or cobalt is formed on the inner surface of the slit 46 and that of the opening portion 57. After that, annealing is performed to form a silicide on the surface of silicon exposed in the slit 46 and the opening portion 57. That is, silicide layers 58 are formed on the surfaces of the control gates CG in the slit 46 and the surfaces of the select gates SG in the opening portion 57.

Note that the metal to be deposited is not limited to nickel and cobalt. Any other metal is also usable if it reacts with silicon to form a metal silicide and make the electric resistance lower than that of the doped polysilicon layer 43 before reaction.

As shown in FIGS. 14(a) and (b), an insulating member 59 made of a silicon oxide film is buried in the slit 46 and the opening portion 57. More specifically, a silicon oxide film is formed on the entire surface until the slit 46 and the opening portion 57 are filled. Then, the silicon oxide film on the doped polysilicon layer 48 is removed. The silicon oxide film thus remains in the slit 46 and the opening portion 57, thereby forming the insulating member 59 spreading in the row direction and the stacking direction. In this way, a collectively-processed-type three-dimensionally laminated memory having U-shaped NAND strings is manufactured.

As described above, in the collectively-processed-type three-dimensionally laminated memory, to reduce the resistance of polysilicon of the control gates CG, the silicide layers 58 are formed on the sidewalls (the surfaces of the control gates CG) in the slit 46. When forming the silicide layers 58, if the surfaces of the control gates CG in the slit 46 project into the slit 46 more than the surface of the inter-electrode insulating films 53', the control gates CG adjacent in the stacking direction may cause shorts due to bridging between them, resulting in an operation error. Even if the control gates CG do not largely project into the slit, the inter-electrode insulating films 53' made of oxide films react with the metal of a silicide material. A silicide is thus formed even on the surfaces of the inter-electrode insulating films 53', and this may cause shorts by bridging.

Under the circumstances, the embodiments provide a collectively-processed-type three-dimensionally laminated memory that prevents shorts by bridging between the adjacent control gates CG as described above.

<First Embodiment>

A nonvolatile semiconductor memory device according to the first embodiment will be described with reference to FIGS. 15, 16, 17, 18, 19, 20, 21, 22, 23, 24. In the first embodiment, the surfaces of the inter-electrode insulating films project more than the surfaces of the control gates in the slit.

Note that in the first embodiment, a description of the same points as in the above-described example of the manufacturing method will be omitted, and different points will mainly be explained.

[Structure]

The structure of the nonvolatile semiconductor memory device according to the first embodiment will be described below with reference to FIG. 15.

Figure 15:
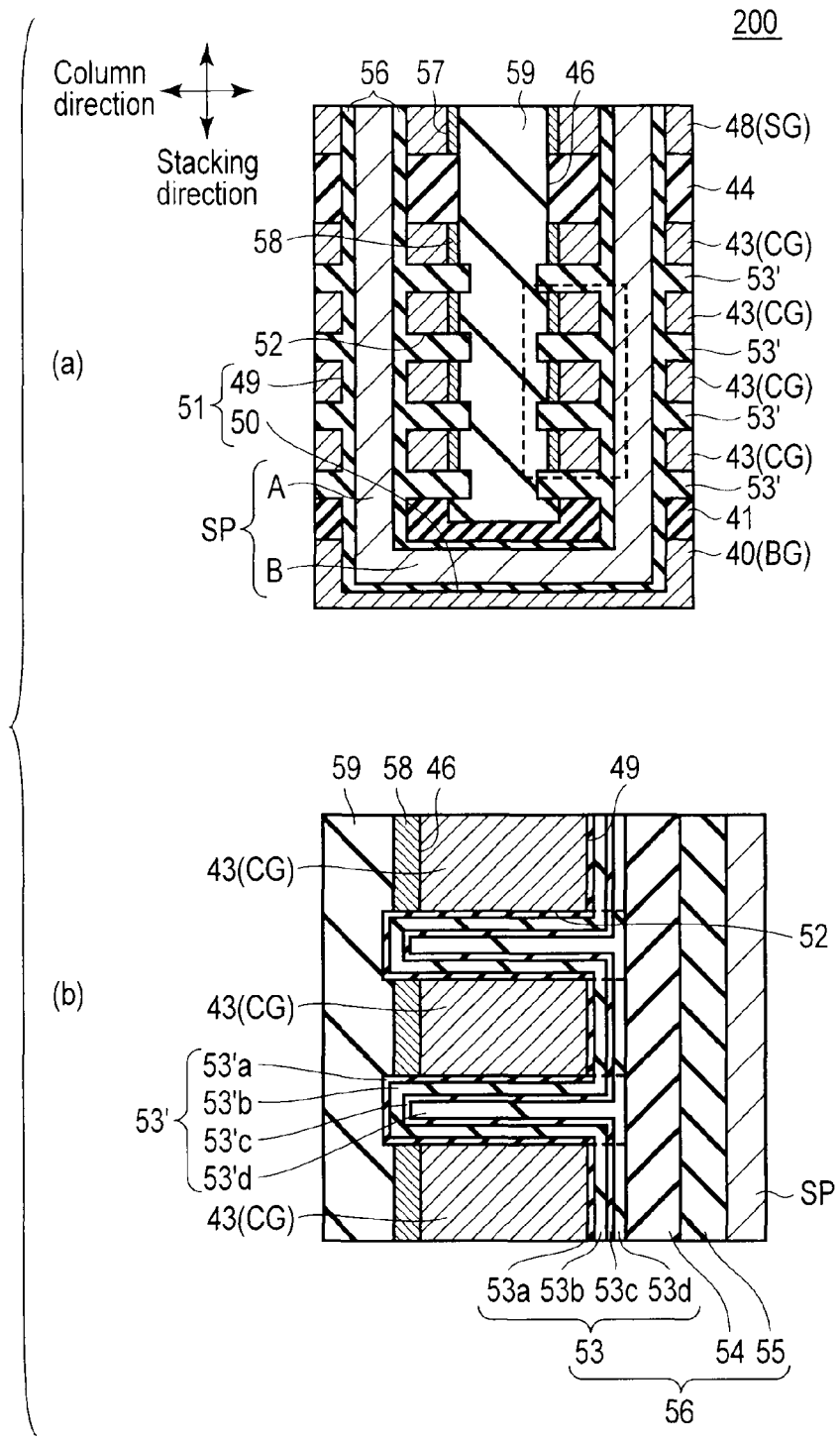
FIG. 15 is a sectional view showing a nonvolatile semiconductor memory device according to the first embodiment taken along the column direction.

FIG. 15(a) is a sectional view of the nonvolatile semiconductor memory device according to the first embodiment taken along the column direction. FIG. 15(b) is an enlarged view of the broken line portion in FIG. 15(a). Note that one NAND string of the nonvolatile semiconductor memory device will mainly be explained with reference to FIG. 15.

As shown in FIG. 15(a), a NAND string 200 comprises a conductive layer 40, doped silicon layers 43 and 48, inter-electrode insulating films 53', a memory film 56, a U-shaped silicon pillar SP, silicide layers 58, and an insulating member 59 formed on a semiconductor substrate (not shown).

The conductive layer 40 is formed above the semiconductor substrate (not shown) and made of, for example, phosphorus-doped polysilicon. The conductive layer 40 is a prospective back gate BG, and forms a back gate transistor BGTr by having the U-shaped silicon pillar SP and the memory film 56 formed in it.

The plurality of doped silicon layers 43 and the plurality of inter-electrode insulating films 53' are alternately stacked on a silicon oxide film 41 on the conductive layer 40. The doped silicon layers 43 are prospective control gates CG, and form memory cell transistors MTr by having the U-shaped silicon pillar SP and the memory film 56 formed in them. That is, the inter-electrode insulating films 53' are formed between the control gates CG (in gaps 52) adjacent in the stacking direction. The doped silicon layers 43 and the inter-electrode insulating films 53' will be described later in more detail.

The doped silicon layers 48 are formed on silicon oxide films 44 on the uppermost control gates CG. The doped silicon layers 48 are prospective select gates SG, and form select transistors SDTr and SSTr by having the U-shaped silicon pillar SP and the memory film 56 formed in them.

A U-shaped memory hole 51 is formed in the select gates SG the control gates CG, the back gate BG, and the inter-electrode insulating films 53'. The U-shaped memory hole 51 includes a pair of through holes 49 arranged in the column direction and a connection hole 50 that connects the pair of through holes 49. The through holes 49 extend through the select gates SG and the control gates CG in the stacking direction. The connection hole extends through the back gate BG in the column direction.

The control gates CG and the inter-electrode insulating films 53' have a slit 46 that spreads in the row direction and the stacking direction and is provided between the pair of through holes 49. The control gates CG and the inter-electrode insulating films 53' are thus divided along the row direction. The select gates SG have, on the slit 46, an opening portion 57 that spreads in the row direction and the stacking direction. The select gates SG are thus divided along the row direction.

The memory film 56 is formed on the inner surface of the U-shaped memory hole 51, that is, on the surfaces of the select gates SG, the control gates CG, and the back gate BG in the U-shaped memory hole 51. The memory film 56 is partially integrated with the inter-electrode insulating films 53', and details will be described later.

The U-shaped silicon pillar SP is formed on the surface of the memory film 56 in the U-shaped memory hole 51 and made of polysilicon containing an impurity, for example, phosphorus. That is, the U-shaped silicon pillar SP includes a pair of columnar portions A formed on the surface of the memory film 56 in the pair of through holes 49 and a connection portion B formed on the surface of the memory film 56 in the connection hole 50. Note that FIG. 15 illustrate an example in which polysilicon serving as the U-shaped silicon pillar SP fills the U-shaped memory hole 51. However, a hollow structure may be formed, as shown in FIG. 3.

The silicide layers 58 are formed on the surfaces of the control gates CG in the slit 46 and the surfaces of the select gates SG in the opening portion 57. In other words, the silicide layers 58 are formed between the insulating member 59 to be described later and the control gates CG and the select gates SG.

The insulating member 59 is buried in the slit 46 and the opening portion 57. The insulating member 59 isolates the control gates CG and the select gates SG divided by the slit 46 and the opening portion 57.

In this embodiment, as shown in FIG. 15(b), the interfaces between the inter-electrode insulating films 53' and the insulating member 59 (the surfaces of the inter-electrode insulating films 53' in the slit 46) project into the slit 46 more than at least the interfaces between the control gates CG and the silicide layers 58 (the surfaces of the control gates CG in the slit 46). Note that the interfaces between the inter-electrode insulating films 53' and the insulating member 59 preferably project into the slit 46 more than the interfaces between the silicide layers 58 and the insulating member 59.

The memory film 56 includes a block insulating film 53 formed on the surfaces of the control gates CG in the through holes 49, a charge storage layer 54 formed on the surface of the block insulating film 53, and a tunnel insulating film 55 formed on the surface of the charge storage layer 54.

The block insulating film 53 of this embodiment has a multilayered structure. More specifically, the block insulating film 53 has a multilayered structure including a silicon nitride film 53a, a silicon oxide film 53b, a silicon nitride film 53c, and a silicon oxide film 53d sequentially formed on the surfaces of the control gates CG in the through holes 49. That is, the block insulating film 53 has a structure in which the silicon nitride films and the silicon oxide film are alternately stacked. Note that the block insulating film 53 is formed so that the outermost layer (uppermost surface layer) is made of a silicon nitride film in the through holes 49, although the number of stacked layers is not limited to four.

The inter-electrode insulating films 53' are integrated with the block insulating film 53 and have a multilayered structure. That is, each inter-electrode insulating film 53' has a multilayered structure including a silicon nitride film 53'a, a silicon oxide film 53'b, a silicon nitride film 53'c, and a silicon oxide film 53'd sequentially formed on the inner surfaces of the gaps 52 (on the surfaces of the control gates CG, the surfaces of the silicide layers 58, and the surfaces of the insulating member 59 in the gaps 52). In other words, the inter-electrode insulating films 53' have a structure in which the block insulating film 53 is buried in the gaps 52 through the through holes 49. In the example shown in FIG. 15, the gaps 52 are filled in the stage of forming the silicon oxide film 53'd.

As described above, the uppermost surface layer of the block insulating film 53 is formed from a silicon nitride film in the through holes 49. For this reason, the uppermost surface layer of each inter-electrode insulating films 53' in the gap 52 is also formed from a silicon nitride film.

<Manufacturing Method>

A method of manufacturing the nonvolatile semiconductor memory device according to the first embodiment will be described below with reference to FIGS. 16, 17, 18, 19, 20, 21, 22, 23, and 24. FIGS. 16, 17, 18, 19, 20, 21, 22, 23A, and 24 are sectional views showing steps in the manufacture of the nonvolatile semiconductor memory device according to the first embodiment taken along the column direction. FIGS. 21(b), 22(b), 23(b), and 24(b) are enlarged views of the broken line portions in FIGS. 21(a), 22(a), 23(a), and 24(a), respectively. Note that one NAND string of the nonvolatile semiconductor memory device will mainly be explained with reference to FIGS. 16, 17, 18, 19, 20, 21, 22, 23, and 24.

As shown in FIG. 16, a conductive layer 40 that is a prospective back gate BG is formed above a semiconductor substrate (not shown). A dummy layer 60 made of undoped polysilicon is formed in the conductive layer 40. A silicon oxide film 41 serving as an insulating film is formed on the conductive layer 40 including the dummy layer 60.

Undoped polysilicon layers 42 containing no impurity and doped polysilicon layers (p-type polysilicon layers) 43 containing boron and serving as control gates CG are alternately stacked on the silicon oxide film 41. A silicon oxide film 44 serving as an insulating film is formed on the uppermost doped polysilicon layer 43.

A stacked body 45 including the undoped polysilicon layers 42, the doped polysilicon layers 43, and the silicon oxide film 44 is formed in this way.

As shown in FIG. 17, a slit 46 is formed in the stacked body 45 by photolithography and etching. The slit 46 extends through the stacked body 45 and is formed along the row direction (the depth direction of the drawing surface of FIG. 17). That is, the slit 46 is formed to spread in the row direction and the stacking direction and divides the stacked body 45. The silicon oxide film 41 is thus exposed to the bottom surface of the slit 46.

Next, the sidewalls (side surfaces) in the slit 46 are thermally oxidized. That is, the surfaces of the undoped polysilicon layers 42 and the doped polysilicon layers 43 exposed in the slit 46 are thermally oxidized. A silicon oxide film 150 is thus formed on the surfaces of the undoped polysilicon layers 42 and the doped polysilicon layers 43 in the slit 46. At this time, the rate of oxidation of the doped polysilicon layers 43 is higher than that of the undoped polysilicon layers 42. For this reason, the silicon oxide film 150 is formed thicker on the surfaces of the doped polysilicon layers 43 than on the surfaces of the undoped polysilicon layers 42 in the slit 46. In other words, the surfaces of the undoped polysilicon layers 42 project into the slit 46 more than the surfaces of the doped polysilicon layers 43 in the slit 46.

As shown in FIG. 18, a sacrifice member 47 made of a silicon nitride film is buried in the slit 46, thereby forming the sacrifice member 47 spreading in the row direction and the stacking direction. That is, the sacrifice member 47 is formed on the surface of the silicon oxide film 150 in the slit 46.

As shown in FIG. 19, a doped polysilicon layer (p-type polysilicon layer) 48 containing boron and serving as prospective select gates SG is formed on the silicon oxide film 44. After that, a pair of through holes 49 are formed in the doped polysilicon layer 48, the stacked body 45, and the silicon oxide film 41.

As shown in FIG. 20, wet etching is performed through the through holes 49. This wet etching is performed using, for example, an alkaline etchant. With this process, the undoped polysilicon layers 42 of the stacked body 45 are removed. As a result, a gap 52 is formed between two control gates CG adjacent in the stacking direction. At this time, the sacrifice member 47 is not exposed through the gaps 52 because the silicon oxide film 150 is formed on the sidewalls in the slit 46.

At the same time, the dummy layer 60 made of undoped polysilicon is also removed. A U-shaped memory hole 51 including the pair of through holes 49 and a connection hole 50 is formed in the doped polysilicon layer 48, the stacked body 45, the silicon oxide film 41, and the conductive layer 40.

As shown in FIGS. 21(a) and (b), a memory film 56 including a block insulating film 53, a charge storage layer 54, and a tunnel insulating film 55, and a U-shaped silicon pillar SP including a pair of columnar portions A and a connection portion B are formed in the U-shaped memory hole 51.

More specifically, a dilute hydrofluoric acid treatment is performed first to remove a native oxide film (not shown) sticking to the surface. With the dilute hydrofluoric acid treatment, the sacrifice member 47 that fills the slit 46 is prevented from being exposed through the gaps 52. That is, the dilute hydrofluoric acid treatment is adjusted not to remove the silicon oxide film 150.

After that, the block insulating film 53 including a silicon nitride film 53a, a silicon oxide film 53b, a silicon nitride film 53c, and a silicon oxide film 53d is formed on the inner surfaces of the through holes 49 by, for example, ALD. That is, a multilayered structure of the silicon nitride film 53a, the silicon oxide film 53b, the silicon nitride film 53c, and the silicon oxide film 53d is formed sequentially on the surfaces of the control gates CG in the through holes 49.

The block insulating film 53 is also formed on the inner surfaces of the gaps 52 through the through holes 49. That is, the multilayered structure of the silicon nitride film 53a, the silicon oxide film 53b, the silicon nitride film 53c, and the silicon oxide film 53d is also formed on the surfaces of the control gates CG and the surfaces of the silicon oxide films 150 in the gaps 52. Inter-electrode insulating films 53' integrated with the block insulating film 53 are thus buried in the gaps 52. In the example shown in FIG. 21(b), the gaps 52 are filled in the stage of forming a silicon oxide film 53'd.

At this time, since the sacrifice member 47 is not exposed through the gaps 52, the inter-electrode insulating films 53' (silicon oxide film 53'd) are not in direct contact with the sacrifice member 47. The inter-electrode insulating films 53' are formed at the same positions as those of the above-described undoped polysilicon layers 42. For this reason, the surfaces of the inter-electrode insulating films 53' in the slit 46 project into the slit 46 more than the surfaces of the control gates CG.

Next, the charge storage layer 54 made of a silicon nitride film is formed on the surface of the block insulating film 53 (and the inter-electrode insulating films 53') in the through holes 49. After that, the tunnel insulating film 55 made of a silicon oxide film is formed on the surface of the charge storage layer 54 in the through holes 49. In this way, the memory film 56 including the block insulating film 53, the charge storage layer 54, and the tunnel insulating film 55 is formed.

Note that although FIG. 21(b) illustrates an example in which the gaps 52 are filled in the stage of forming the silicon oxide film 53'd, the gaps 52 may be filled in the stage of forming the charge storage layer 54 or the tunnel insulating film 55.

Polysilicon containing an impurity, for example, phosphorus is buried on the surface of the memory film 56 in the through holes 49. The columnar portions of the U-shaped silicon pillar SP are thus formed in the through holes 49.

The same structure is formed on the inner surface of the connection hole 50 as well at the same time as the above-described process. That is, the block insulating film 53, the charge storage layer 54, the tunnel insulating film 55, and polysilicon (U-shaped silicon pillar SP) are sequentially formed on the surface of the silicon oxide film 41 and the surface of the back gate BG in the connection hole 50 as well.

As shown in FIGS. 22(a) and (b), an opening portion 57 is formed in the doped polysilicon layer 48 by RIE. The opening portion 57 extends through the doped polysilicon layer 48 and is formed along the row direction (the depth direction of the drawing surface of FIGS. 22(a) and (b)). That is, the opening portion 57 divides the doped polysilicon layer 48. In addition, since the opening portion 57 is formed on the sacrifice member 47, the sacrifice member 47 is exposed to the bottom surface of the opening portion 57.

Next, wet etching is performed through the opening portion 57. The sacrifice member 47 in the slit 46 is thus removed. As a result, the silicon oxide film 150 is exposed in the slit 46.

As shown in FIGS. 23(a) and (b), the silicon oxide film 150 in the slit 46 is removed by, for example, a dilute hydrofluoric acid treatment. The control gates CG and the inter-electrode insulating films 53' are thus exposed in the slit 46. At this time, since the silicon oxide film 150 is formed thicker on the surfaces of the control gates CG than on the surfaces of the inter-electrode insulating films 53' in the slit 46, the surfaces of the inter-electrode insulating films 53' project into the slit 46 more than the surfaces of the control gates CG. The silicon oxide films 41 and 44 are also removed in almost the same amount as that of the silicon oxide film 150.

As shown in FIGS. 24(a) and (b), a metal layer of nickel or cobalt is formed on the inner surface of the slit 46 and that of the opening portion 57. After that, annealing is performed to form a silicide in a self-aligned manner only on the surface of silicon exposed in the slit 46 and the opening portion 57. That is, silicide layers 58 are formed on the surfaces of the control gates CG in the slit 46 and the surfaces of the select gates SG in the opening portion 57. Note that the surfaces of the silicide layers 58 in the slit 46 are preferably formed not to project more than the surfaces of the inter-electrode insulating films 53'.

At this time, the surfaces of the inter-electrode insulating films 53' exposed in the slit 46 have silicon nitride films 53'a. Hence, the silicide layers 58 are not formed on the surfaces of the inter-electrode insulating films 53' in the slit 46. That is, it is possible to prevent bridging by the silicide layers 58.

Next, as shown in FIGS. 15(a) and (b), the insulating member 59 made of a silicon oxide film is buried in the slit 46 and the opening portion 57. More specifically, a silicon oxide film is formed on the entire surface until the slit 46 and the opening portion 57 are filled. Then, the silicon oxide film on the doped polysilicon layer 48 is removed. The silicon oxide film thus remains in the slit 46 and the opening portion 57, thereby forming the insulating member 59 spreading in the row direction and the stacking direction. In this way, the collectively-processed-type three-dimensionally laminated memory according to the first embodiment is manufactured.
[Effects]

According to the first embodiment, the surfaces (end faces) of the inter-electrode insulating films 53' in the slit 46 project into the slit 46 more than the surfaces (end faces) of the control gates CG. Hence, the surface area of each inter-electrode insulating film 53' exposed in the slit 46 between two control gates CG adjacent in the stacking direction increases. That is, the distance between the control gates CG along the inner surface of the slit 46 (the size of the interface between the inter-electrode insulating film 53' and the insulating member 59) can be made longer by the projecting length of the control gates CG into the slit 46 than the actual distance between the control gates CG along the stacking direction (the size of the inter-electrode insulating film 53' in the stacking direction). Hence, when forming the silicide layers 58 on the surfaces of the control gates CG in the slit 46, it is possible to prevent shorts by bridging between the control gates CG and leakage currents between the control gates CG.

Additionally, in the slit 46, the silicon nitride film 53'a is formed as the uppermost surfaces of the inter-electrode insulating films 53'. This allows to prevent reaction with a metal that is a silicide material as compared to a case in which the uppermost surface is formed from a silicon oxide film. It is consequently possible to more effectively prevent shorts by bridging between the control gates CG.

<Second Embodiment>

A nonvolatile semiconductor memory device according to the second embodiment will be described with reference to FIGS. 25, 26, 27, 28, and 29. In the second embodiment, the surfaces of the inter-electrode insulating films in the slit are uneven.

Note that in the second embodiment, a description of the same points as in the above-described first embodiment will be omitted, and different points will mainly be explained.
[Structure]

The structure of the nonvolatile semiconductor memory device according to the second embodiment will be described below with reference to FIG. 25.

Figure 25:
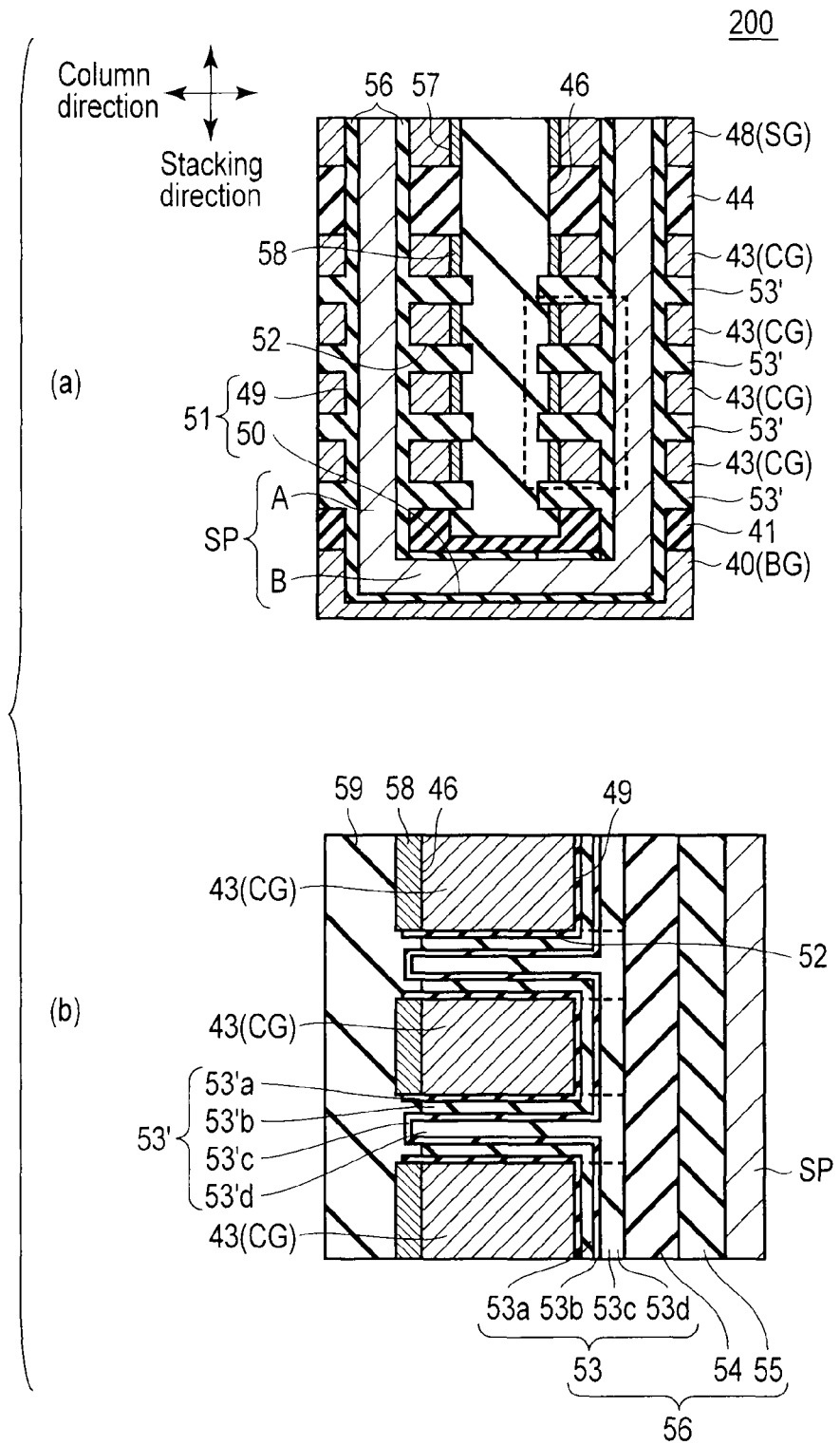
FIG. 25 is a sectional view showing a nonvolatile semiconductor memory device according to the second embodiment taken along the column direction.
Figure 28:
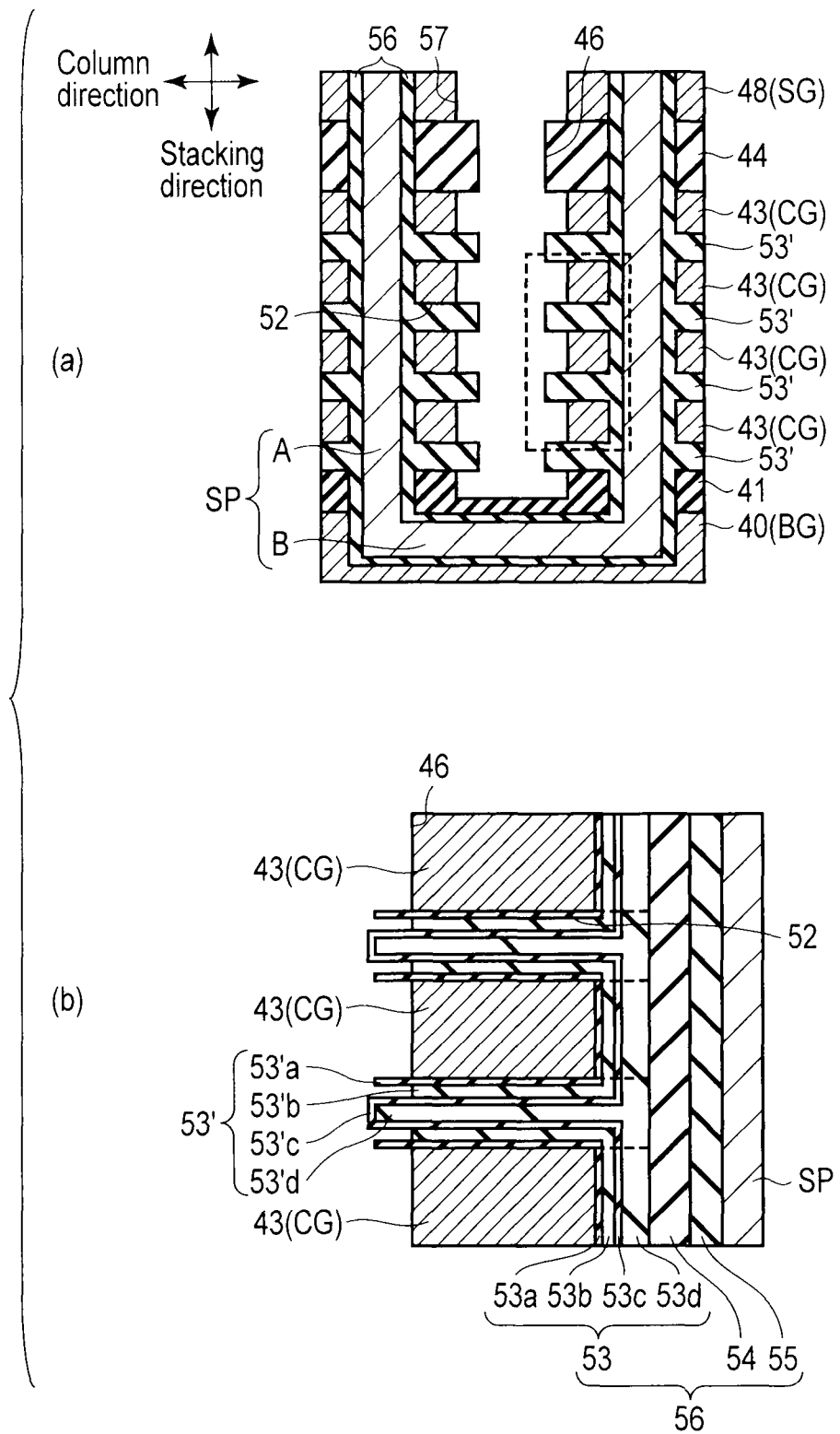
FIG. 28 is a sectional view showing a step in the manufacture of the nonvolatile semiconductor memory device according to the second embodiment taken along the column direction following FIG. 27.
Figure 29:
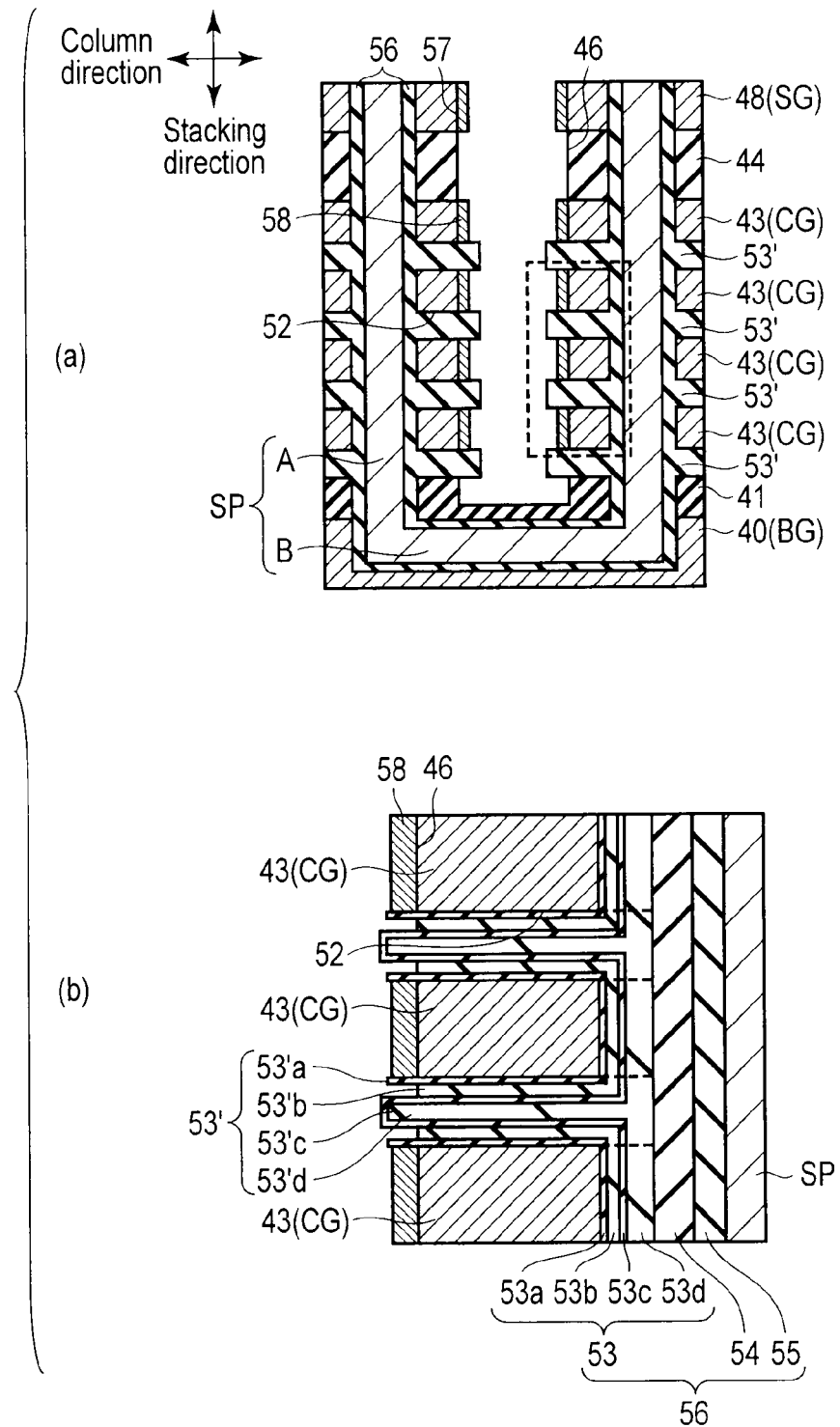
FIG. 29 is a sectional view showing a step in the manufacture of the nonvolatile semiconductor memory device according to the second embodiment taken along the column direction following FIG. 28.

FIG. 25(a) is a sectional view of the nonvolatile semiconductor memory device according to the second embodiment taken along the column direction. FIG. 25(b) is an enlarged view of the broken line portion in FIG. 25(a). Note that one NAND string of the nonvolatile semiconductor memory device will mainly be explained with reference to FIG. 25.

As shown in FIGS. 25(a) and (b), the second embodiment is different from the first embodiment in that the surface of each inter-electrode insulating film 53' in a slit 46 has unevenness at the interfaces between films adjacent in the stacking direction.

More specifically, the inter-electrode insulating films 53' are integrated with a block insulating film 53 and have a multilayered structure, as in the first embodiment. That is, each inter-electrode insulating film 53' has a multilayered structure including a silicon nitride film 53'a, a silicon oxide film 53'b, a silicon nitride film 53'c, and a silicon oxide film 53'd sequentially formed on the inner surface of a gap 52.

In this embodiment, the silicon nitride film 53'a serving as the uppermost surface in the gap 52 and the silicon oxide film 53'b in contact with the silicon nitride film 53' on the inner surface side are divided on the surface in the slit 46. In other words, the silicon nitride film 53'c is exposed in the slit 46 so as to be in contact with an insulating member 59 without being covered with the silicon nitride film 53'a and the silicon oxide film 53'b.

Additionally, on the surface of each inter-electrode insulating film 53' in the slit 46, steps are provided at the interfaces between the films adjacent in the stacking direction. That is, steps are provided at the interface between the silicon nitride film 53'a and the silicon oxide film 53'b and at the interface between the silicon oxide film 53'b and the silicon nitride film 53'c.

Note that the surfaces of the inter-electrode insulating films 53' need not project into the slit 46 more than the surfaces of control gates CG (the interfaces between the control gates CG and silicide layers 58) in the slit 46.
[Manufacturing Method]

A method of manufacturing the nonvolatile semiconductor memory device according to the second embodiment will be described below with reference to FIGS. 26, 27, 28, and 29.

FIGS. 26, 27, 28, and 29 are sectional views showing steps in the manufacture of the nonvolatile semiconductor memory device according to the second embodiment taken along the column direction. FIGS. 26(b), 27(b), 28(b), and 29(b) are enlarged views of the broken line portions in FIGS. 26(a), 27(a), 28(a), and 29(a), respectively.

First, the processes in FIGS. 16, 17, 18, 19, and 20 of the first embodiment are performed.

Then, as shown in FIG. 26, a memory film 56 including a block insulating film 53, a charge storage layer 54, and a tunnel insulating film 55, and a U-shaped silicon pillar SP including a pair of columnar portions A and a connection portion B are formed in a U-shaped memory hole 51.

More specifically, a dilute hydrofluoric acid treatment is performed first to remove a native oxide film (not shown) sticking to the surface. With the dilute hydrofluoric acid treatment, a silicon oxide film 150 is partially removed to expose, through gaps 52, a sacrifice member 47 that fills a slit 46. That is, the dilute hydrofluoric acid treatment is adjusted to remove the silicon oxide film 150 in the gaps 52.

After that, the block insulating film 53 including a silicon nitride film 53a, a silicon oxide film 53b, a silicon nitride film 53c, and a silicon oxide film 53d is formed on the inner surfaces of through holes 49 by, for example, ALD.

The block insulating film 53 is also formed on the inner surfaces of the gaps 52 through the through holes 49. That is, the multilayered structure of the silicon nitride film 53a, the silicon oxide film 53b, the silicon nitride film 53c, and the silicon oxide film 53d is also formed on the surfaces of control gates CG and the surfaces of the sacrifice member 47 in the gaps 52. Inter-electrode insulating films 53' integrated with the block insulating film 53 are thus buried in the gaps 52.

At this time, since the sacrifice member 47 is exposed through the gaps 52, the inter-electrode insulating films 53' (silicon nitride film 53'a) is in direct contact with the sacrifice member 47 made of a silicon nitride film.

Next, the charge storage layer 54 made of a silicon nitride film is formed on the surface of the block insulating film 53 (and the inter-electrode insulating films 53') in the through holes 49. After that, the tunnel insulating film 55 made of a silicon oxide film is formed on the surface of the charge storage layer 54 in the through holes 49. In this way, the memory film 56 including the block insulating film 53, the charge storage layer 54, and the tunnel insulating film 55 is formed.

Polysilicon containing an impurity, for example, phosphorus is buried on the surface of the memory film 56 in the through holes 49. The columnar portions of a U-shaped silicon pillar SP are thus formed in the through holes 49.

The same structure is formed on the inner surface of a connection hole 50 as well at the same time as the above-described process. That is, the block insulating film 53, the charge storage layer 54, the tunnel insulating film 55, and polysilicon (silicon pillar SP) are sequentially formed on the surface of a silicon oxide film 41 and the surface of a back gate BG in the connection hole 50 as well.

As shown in FIGS. 27(a) and (b), an opening portion 57 is formed in the doped polysilicon layer 48 by RIE so that the sacrifice member 47 is exposed to the bottom surface of the opening portion 57.

Next, wet etching is performed through the opening portion 57. The sacrifice member 47 in the slit 46 is thus removed. As a result, the silicon oxide films 150 are exposed in the layers corresponding to the control gates CG in the slit 46.

At this time, the silicon nitride film 53'a made of the same material as that of the sacrifice member 47 is also partially removed and divided on the surface in the slit 46. The silicon oxide film 53'b formed on the inner surface of the silicon nitride film 53'a is thus exposed in the slit 46. Note that the silicon nitride film 53'a is preferably removed not to retreat from the surfaces of the control gates CG.

As shown in FIGS. 28(a) and (b), the silicon oxide films 150 in the slit 46 are removed by, for example, a dilute hydrofluoric acid treatment. The control gates CG are thus exposed in the slit 46.

At this time, the silicon oxide film 53'b is also partially removed and divided on the surface in the slit 46. The silicon nitride film 53'c formed on the inner side of the silicon nitride film 53'a is thus exposed in the slit 46. In addition, on the surface of each inter-electrode insulating film 53' in the slit 46, steps (unevenness) are formed at the interfaces between the films adjacent in the stacking direction. Note that the silicon oxide film 53'b is preferably removed not to retreat into the through holes 49.

As shown in FIGS. 29(a) and (b), a metal layer of nickel or cobalt is formed on the inner surface of the slit 46 and that of the opening portion 57. After that, annealing is performed to form silicide layers 58 on the surfaces of the control gates CG in the slit 46 and the surfaces of the select gates SG in the opening portion 57.

As shown in FIGS. 25(a) and (b), an insulating member 59 made of a silicon oxide film is buried in the slit 46 and the opening portion 57. In this way, the collectively-processed-type three-dimensionally laminated memory according to the second embodiment is manufactured.

[Effects]

According to the second embodiment, the same effects as in the first embodiment can be obtained.

Additionally, in the second embodiment, on the surface (end face) of each inter-electrode insulating film 53' in the slit 46, unevenness (steps) is provided at the interfaces between the films adjacent in the stacking direction. This increases the surface area of each inter-electrode insulating film 53' exposed in the slit 46 between two control gates CG adjacent in the stacking direction as compared to the first embodiment. As a result, when forming the silicide layers 58 on the surfaces of the control gates CG in the slit 46, it is possible to more effectively prevent shorts by bridging between the control gates CG and leakage currents between the control gates CG.

<Third Embodiment>

A nonvolatile semiconductor memory device according to the third embodiment will be described with reference to FIGS. 30, 31, 32, 33, and 34. In the third embodiment, the size in the stacking direction is larger in the portion of each inter-electrode insulating film projecting into the slit than in the portion sandwiched between control gates.

Note that in the third embodiment, a description of the same points as in the above-described first embodiment will be omitted, and different points will mainly be explained.

[Structure]

The structure of the nonvolatile semiconductor memory device according to the third embodiment will be described below with reference to FIG. 30.

Figure 30:
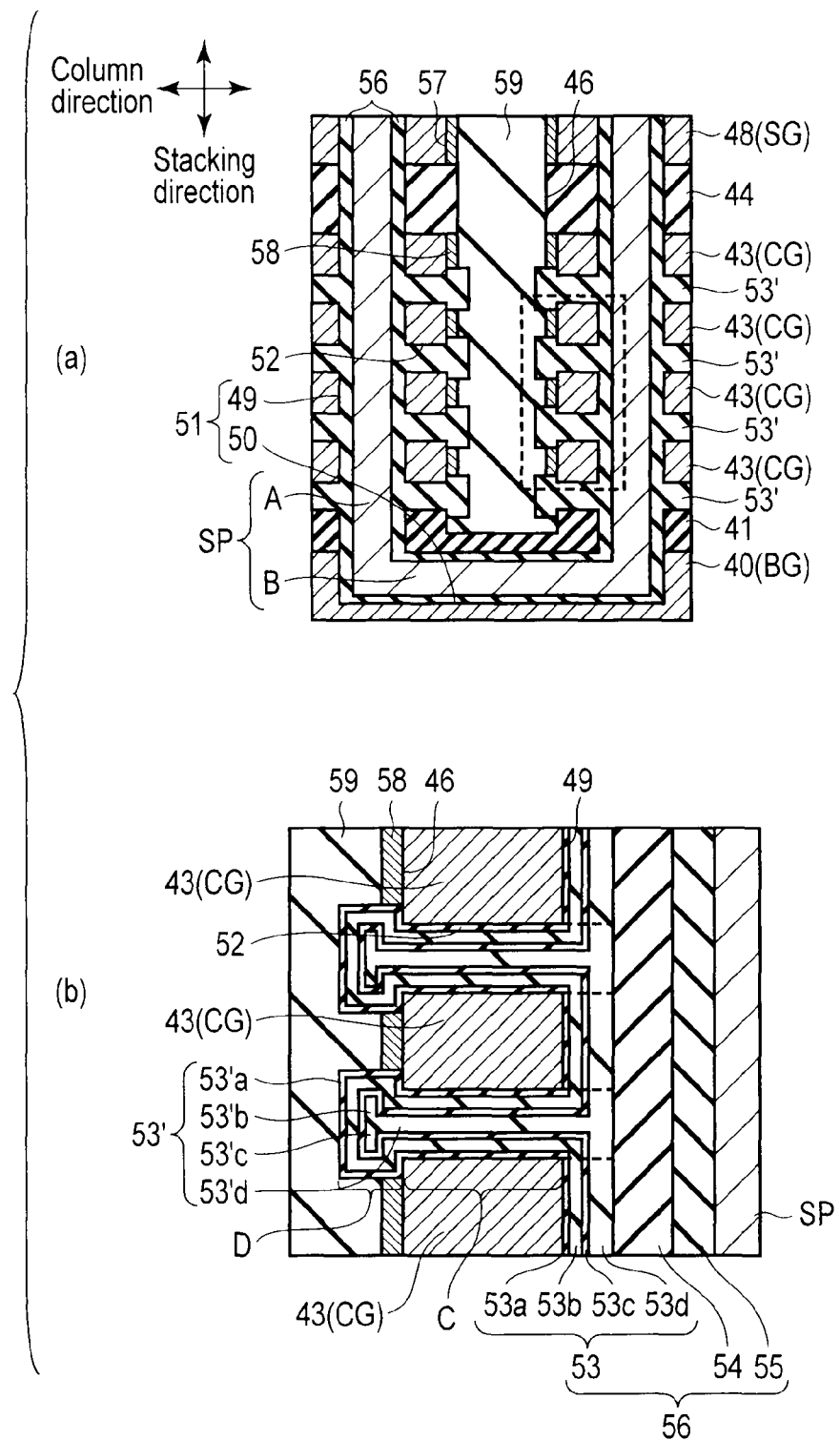
FIG. 30 is a sectional view showing a nonvolatile semiconductor memory device according to the third embodiment taken along the column direction.

FIG. 30(a) is a sectional view of the nonvolatile semiconductor memory device according to the third embodiment taken along the column direction. FIG. 30(b) is an enlarged view of the broken line portion in FIG. 30(a). Note that one NAND string of the nonvolatile semiconductor memory device will mainly be explained with reference to FIG. 30.

As shown in FIGS. 30(a) and (b), the third embodiment is different from the first embodiment in that the size in the stacking direction is larger in a second portion D of each inter-electrode insulating film 53' projecting into the slit than in a first portion C sandwiched between control gates CG.

More specifically, the interfaces between the inter-electrode insulating films 53' and an insulating member 59 project into a slit 46 more than at least the interfaces between the control gates CG and silicide layers 58, as in the first embodiment.

In this embodiment, the second portion D (the portion sandwiched between the silicide layer 58 and the insulating member 59 in the stacking direction) of the inter-electrode insulating film 53' projecting into the slit 46 is formed to be larger in the stacking direction than the first portion C of the inter-electrode insulating film 53' sandwiched between the two control gates CG adjacent in the stacking direction. For this reason, parts (mainly corner portions) of the surfaces of control gates CG in the slit 46 are covered by the second portions D of the inter-electrode insulating films 53'.

[Manufacturing Method]

A method of manufacturing the nonvolatile semiconductor memory device according to the third embodiment will be described below with reference to FIGS. 31, 32, 33, and 34.

FIGS. 31, 32, 33, and 34 are sectional views showing steps in the manufacture of the nonvolatile semiconductor memory device according to the third embodiment taken along the column direction. FIGS. 31(b), 32(b), 33(b), and 34(b) are enlarged views of the broken line portions in FIGS. 31(a), 32(a), 33(a), and 34(a), respectively.

First, the processes in FIGS. 16, 17, 18, 19, and 20 of the first embodiment are performed.

Then, as shown in FIGS. 31(a) and (b), a memory film 56 including a block insulating film 53, a charge storage layer 54, and a tunnel insulating film 55, and a U-shaped silicon pillar SP including a pair of columnar portions A and a connection portion B are formed in a U-shaped memory hole 51.

More specifically, a dilute hydrofluoric acid treatment is performed first to remove a native oxide film (not shown) sticking to the surface. The dilute hydrofluoric acid treatment is performed not to expose, through gaps 52, a sacrifice member 47 that fills a slit 46. Simultaneously, a silicon oxide film 150 is also etched in the stacking direction through the gaps 52. That is, the silicon oxide films 150 between the sacrifice member 47 and the corner portions (the end portions in the stacking direction) of control gates CG are also removed.

Hence, the size of each gap 52 is larger between the silicon oxide films 150 than between the control gates CG in the stacking direction. Note that the dilute hydrofluoric acid treatment is adjusted to leave the silicon oxide film 150 located between the sacrifice member 47 and the central portion of each control gate CG in the stacking direction. That is, the dilute hydrofluoric acid treatment is adjusted not to completely remove the silicon oxide film 150.

After that, the block insulating film 53 including a silicon nitride film 53*a*, a silicon oxide film 53*b*, a silicon nitride film 53*c*, and a silicon oxide film 53*d* is formed on the inner surfaces of through holes 49 by, for example, ALD.

The block insulating film 53 is also formed on the inner surfaces of the gaps 52 through the through holes 49. That is, the multilayered structure of the silicon nitride film 53*a*, the silicon oxide film 53*b*, the silicon nitride film 53*c*, and the silicon oxide film 53*d* is also formed on the surfaces of the control gates CG and the surfaces of the sacrifice member 47 in the gaps 52. Inter-electrode insulating films 53' integrated with the block insulating film 53 are thus buried in the gaps 52.

At this time, since the size of each gap 52 is larger between the silicon oxide films 150 than between the control gates CG in the stacking direction, each inter-electrode insulating film 53' is formed to have the first portion between the control gates CG and the larger second portion between the silicon oxide films 150.

Next, the charge storage layer 54 made of a silicon nitride film is formed on the surface of the block insulating film 53 (and the inter-electrode insulating films 53') in the through holes 49. After that, the tunnel insulating film 55 made of a silicon oxide film is formed on the surface of the charge storage layer 54 in the through holes 49. In this way, the memory film 56 including the block insulating film 53, the charge storage layer 54, and the tunnel insulating film 55 is formed.

Polysilicon containing an impurity, for example, phosphorus is buried on the surface of the memory film 56 in the through holes 49. The columnar portions of a U-shaped silicon pillar SP are thus formed in the through holes 49.

The same structure is formed on the inner surface of a connection hole 50 as well at the same time as the above-described process. That is, the block insulating film 53, the charge storage layer 54, the tunnel insulating film 55, and polysilicon (silicon pillar SP) are sequentially formed on the surface of a silicon oxide film 41 and the surface of a back gate BG in the connection hole 50 as well.

Figure 32:
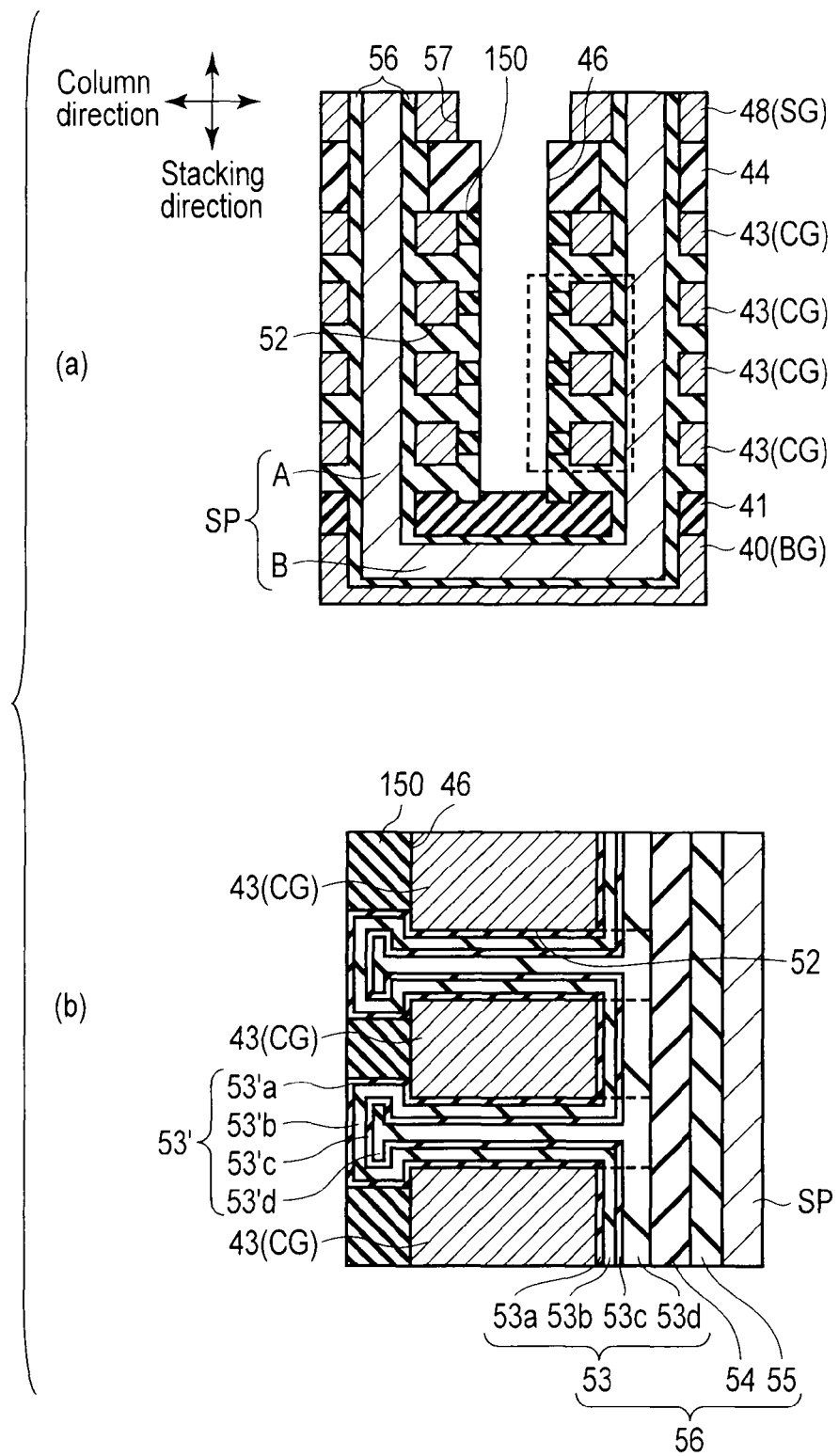
FIG. 32 is a sectional view showing a step in the manufacture of the nonvolatile semiconductor memory device according to the third embodiment taken along the column direction following FIG. 31.
Figure 37:
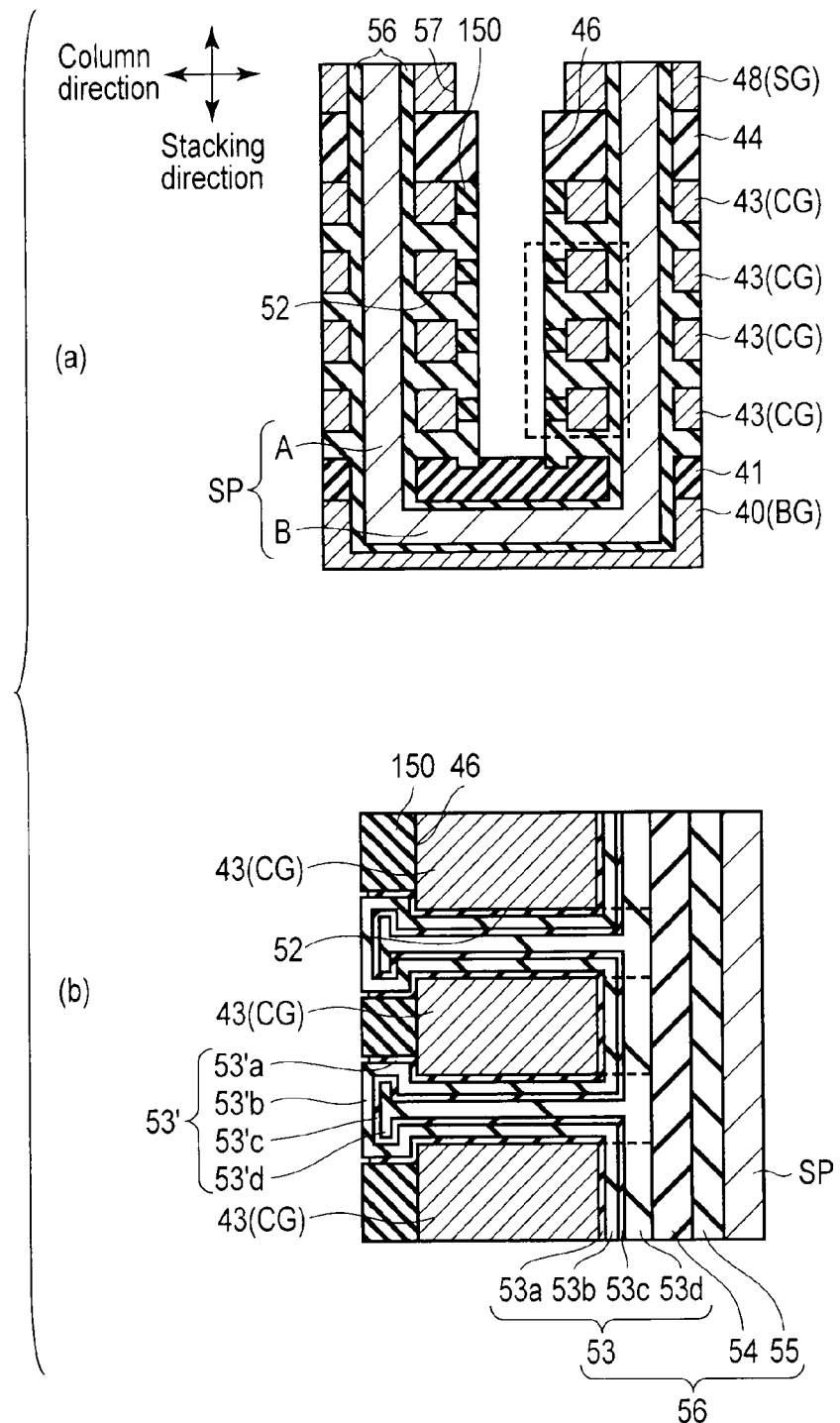
FIG. 37 is a sectional view showing a step in the manufacture of the nonvolatile semiconductor memory device according to the fourth embodiment taken along the column direction following FIG. 36.
Figure 38:
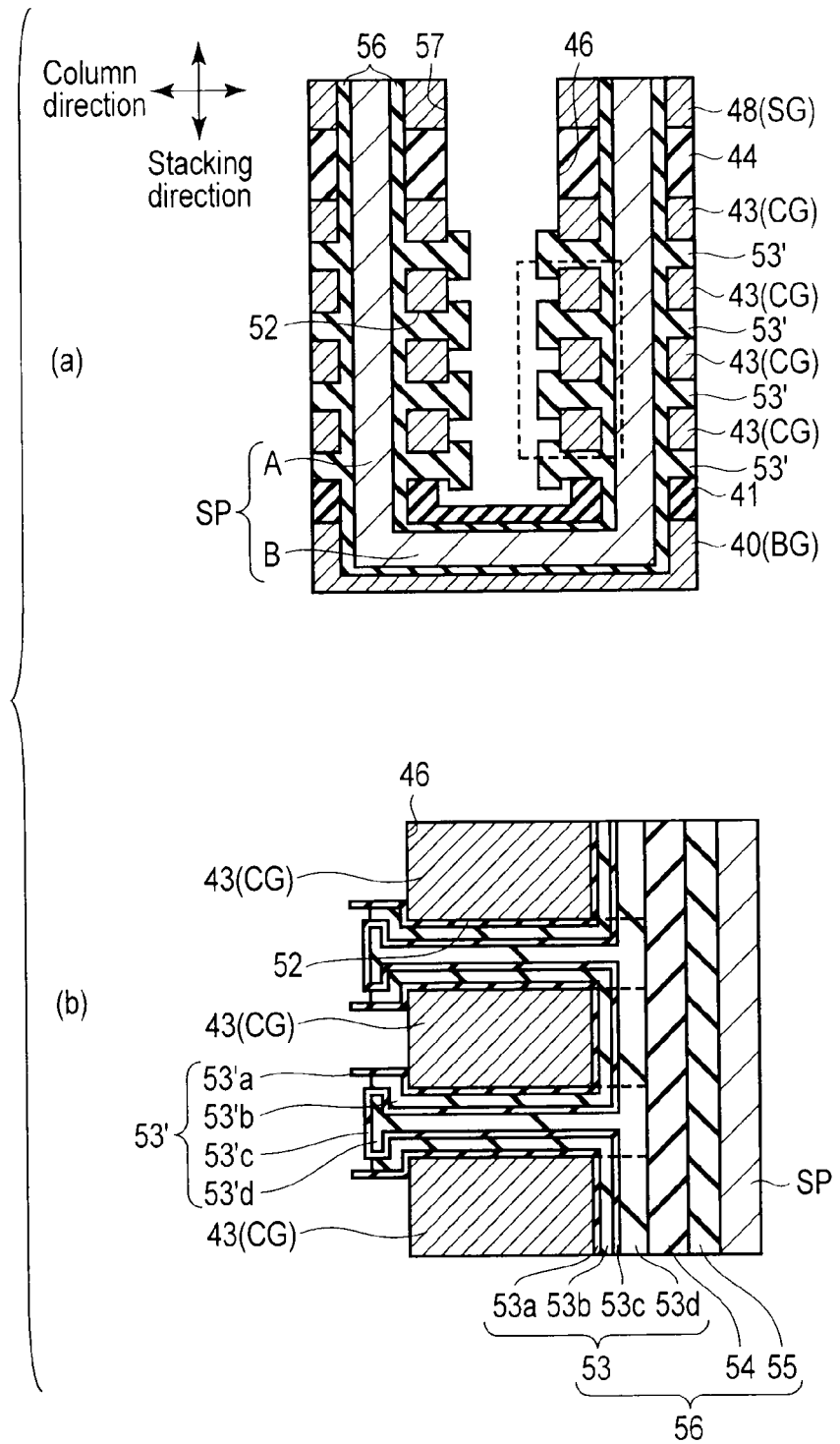
FIG. 38 is a sectional view showing a step in the manufacture of the nonvolatile semiconductor memory device according to the fourth embodiment taken along the column direction following FIG. 37.

As shown in FIGS. 32(*a*) and (*b*), an opening portion 57 is formed in the doped polysilicon layer 48 by RIE so that the sacrifice member 47 is exposed to the bottom surface of the opening portion 57.

Next, wet etching is performed through the opening portion 57. The sacrifice member 47 in the slit 46 is thus removed. As a result, the side surfaces of the silicon oxide films 150 are exposed in the layers corresponding to the control gates CG in the slit 46. At this time, the dilute hydrofluoric acid treatment is adjusted not to remove a silicon nitride film 53'*a* that is the uppermost surface layer of the inter-electrode insulating film 53'. In other words, the silicon nitride film 53'*a* is removed not to retreat from the surface of the silicon oxide film 150 in the slit 46.

As shown in FIGS. 33(*a*) and (*b*), the silicon oxide films 150 in the slit 46 are removed by, for example, a dilute hydrofluoric acid treatment. The control gates CG are thus exposed in the slit 46.

As shown in FIGS. 34(*a*) and (*b*), a metal layer of nickel or cobalt is formed on the inner surface of the slit 46 and that of the opening portion 57. After that, annealing is performed to form silicide layers 58 on the surfaces of the control gates CG in the slit 46 and the surfaces of the select gates SG in the opening portion 57.

As shown in FIGS. 30(*a*) and (*b*), an insulating member 59 made of a silicon oxide film is buried in the slit 46 and the opening portion 57. In this way, the collectively-processed-type three-dimensionally laminated memory according to the third embodiment is manufactured.

[Effects]

According to the third embodiment, the same effects as in the first embodiment can be obtained.

Additionally, in the third embodiment, each inter-electrode insulating film 53' is formed such that the size in the stacking direction is larger in the second portion D projecting into the slit 46 than in the first portion C between the control gates CG. This increases the surface area of each inter-electrode insulating film 53' exposed in the slit 46 between two control gates CG adjacent in the stacking direction as compared to the first embodiment. As a result, when forming the silicide layers 58 on the surfaces of the control gates CG in the slit 46, it is possible to more effectively prevent shorts by bridging between the control gates CG and leakage currents between the control gates CG.

<Fourth Embodiment>

A nonvolatile semiconductor memory device according to the fourth embodiment will be described with reference to FIGS. 35, 36, 37, 38, and 39. The fourth embodiment is a modification of the second and third embodiments which are combined.

Note that in the fourth embodiment, a description of the same points as in the above-described embodiments will be omitted, and different points will mainly be explained.

[Structure]

The structure of the nonvolatile semiconductor memory device according to the fourth embodiment will be described below with reference to FIGS. 35(*a*) and (*b*).

FIG. 35(*a*) is a sectional view of the nonvolatile semiconductor memory device according to the fourth embodiment taken along the column direction. FIG. 35(*b*) is an enlarged view of the broken line portion in FIG. 35(*a*). Note that one NAND string of the nonvolatile semiconductor memory device will mainly be explained with reference to FIG. 35.

As shown in FIGS. 35(*a*) and (*b*), as in the first embodiment, inter-electrode insulating films 53' are integrated with a block insulating film 53 and have a multilayered structure including a silicon nitride film 53'*a*, a silicon oxide film 53'*b*, a silicon nitride film 53'*c*, and a silicon oxide film 53'*d* sequentially formed on the inner surfaces of gaps 52. In addition, the interfaces between an insulating member 59 and the inter-electrode insulating films 53' at least partially project into a slit 46 more than the interfaces between control gates CG and silicide layers 58.

In this embodiment, the size in the stacking direction is larger in a second portion D of each inter-electrode insulating film 53' projecting into the slit 46 than in a first portion C sandwiched the control gates CG, as in the third embodiment.

Additionally, as in the second embodiment, the surfaces (the surfaces on the second portion side) of the silicon nitride film 53'*a* that is the uppermost surface of each gap 52 and the silicon oxide film 53'*b* in contact on the inner surface side in the slit 46 are divided. Furthermore, on the surface of each inter-electrode insulating film 53' in the slit 46, steps are provided at the interfaces between the films adjacent in the stacking direction.

Note that the surfaces of the inter-electrode insulating films 53' need not project into the slit 46 more than the interfaces between the control gates CG and silicide layers 58.

[Manufacturing Method]

A method of manufacturing the nonvolatile semiconductor memory device according to the fourth embodiment will be described below with reference to FIGS. 36, 37, 38, and 39.

FIGS. 36, 37, 38, and 39 are sectional views showing steps in the manufacture of the nonvolatile semiconductor memory device according to the fourth embodiment taken along the column direction. FIGS. 36(b), 37(b), 38(b), and 39(b) are enlarged views of the broken line portions in FIGS. 36(a), 37(a), 38(a), and 39(a), respectively.

First, the processes in FIGS. 16, 17, 18, 19, and 20 of the first embodiment are performed.

Then, as shown in FIGS. 36(a) and (b), a memory film 56 including a block insulating film 53, a charge storage layer 54, and a tunnel insulating film 55, and a U-shaped silicon pillar SP including a pair of columnar portions A and a connection portion B are formed in a U-shaped memory hole 51.

More specifically, a dilute hydrofluoric acid treatment is performed first to remove a native oxide film (not shown) sticking to the surface. With the dilute hydrofluoric acid treatment, a silicon oxide film 150 is partially removed to expose, through gaps 52, a sacrifice member 47 that fills a slit 46. Simultaneously, the silicon oxide film 150 is also etched in the stacking direction through the gaps 52. That is, the silicon oxide films 150 between the sacrifice member 47 and the corner portions (the end portions in the stacking direction) of control gates CG are also removed.

Hence, the size of each gap 52 is larger between the silicon oxide films 150 than between the control gates CG in the stacking direction. Note that the dilute hydrofluoric acid treatment is adjusted to leave the silicon oxide film 150 located between the sacrifice member 47 and the central portion of each control gate CG in the stacking direction.

After that, the block insulating film 53 including a silicon nitride film 53a, a silicon oxide film 53b, a silicon nitride film 53c, and a silicon oxide film 53d is formed on the inner surfaces of through holes 49 by, for example, ALD.

The block insulating film 53 is also formed on the inner surfaces of the gaps 52 through the through holes 49. That is, the multilayered structure of the silicon nitride film 53a, the silicon oxide film 53b, the silicon nitride film 53c, and the silicon oxide film 53d is also formed on the surfaces of the control gates CG and the surfaces of the sacrifice member 47 in the gaps 52. Inter-electrode insulating films 53' integrated with the block insulating film 53 are thus buried in the gaps 52.

At this time, since the size of each gap 52 is larger between the silicon oxide films 150 than between the control gates CG in the stacking direction, each inter-electrode insulating film 53' is formed to have the first portion between the control gates CG and the larger second portion between the silicon oxide films 150.

Since the sacrifice member 47 is exposed through the gaps 52, the inter-electrode insulating films 53' (silicon nitride film 53'a) is in direct contact with the sacrifice member 47 made of a silicon nitride film.

Next, the charge storage layer 54 made of a silicon nitride film is formed on the surface of the block insulating film 53 (and the inter-electrode insulating films 53') in the through holes 49. After that, the tunnel insulating film 55 made of a silicon oxide film is formed on the surface of the charge storage layer 54 in the through holes 49. In this way, the memory film 56 including the block insulating film 53, the charge storage layer 54, and the tunnel insulating film 55 is formed.

Polysilicon containing an impurity, for example, phosphorus is buried on the surface of the memory film 56 in the through holes 49. The columnar portions of a U-shaped silicon pillar SP are thus formed in the through holes 49.

The same structure is formed on the inner surface of a connection hole 50 as well at the same time as the above-described process. That is, the block insulating film 53, the charge storage layer 54, the tunnel insulating film 55, and polysilicon (silicon pillar SP) are sequentially formed on the surface of a silicon oxide film 41 and the surface of a back gate BG in the connection hole 50 as well.

As shown in FIGS. 37(a) and (b), an opening portion 57 is formed in the doped polysilicon layer 48 by RIE so that the sacrifice member 47 is exposed to the bottom surface of the opening portion 57.

Next, wet etching is performed through the opening portion 57. The sacrifice member 47 in the slit 46 is thus removed. As a result, the silicon oxide films 150 are exposed in the layers corresponding to the control gates CG in the slit 46.

At this time, a silicon nitride film 53'a made of the same material as that of the sacrifice member 47 is also partially removed and divided on the surface in the slit 46. A silicon oxide film 53'b formed on the inner surface of the silicon nitride film 53'a is thus exposed in the slit 46. Note that the silicon nitride film 53'a is preferably removed not to retreat from the surfaces of the control gates CG.

As shown in FIGS. 38(a) and (b), the silicon oxide films 150 in the slit 46 are removed by, for example, a dilute hydrofluoric acid treatment. The control gates CG are thus exposed in the slit 46.

At this time, the silicon oxide film 53'b is also partially removed and divided on the surface in the slit 46. A silicon nitride film 53'c formed on the inner side of the silicon nitride film 53'a is thus exposed in the slit 46. In addition, on the surface of each inter-electrode insulating film 53' in the slit 46, steps (unevenness) are formed at the interfaces between the films adjacent in the stacking direction. Note that the silicon oxide film 53'b is preferably removed not to retreat into the through holes 49.

As shown in FIGS. 39(a) and (b), a metal layer of nickel or cobalt is formed on the inner surface of the slit 46 and that of the opening portion 57. After that, annealing is performed to form silicide layers 58 on the surfaces of the control gates CG in the slit 46 and the surfaces of the select gates SG in the opening portion 57.

As shown in FIGS. 35(a) and (b), an insulating member 59 made of a silicon oxide film is buried in the slit 46 and the opening portion 57. In this way, the collectively-processed-type three-dimensionally laminated memory according to the fourth embodiment is manufactured.

[Effects]

According to the fourth embodiment, each inter-electrode insulating film 53' is formed such that the size in the stacking direction is larger in the second portion D projecting into the slit 46 than in the first portion C between the control gates CG. In addition, on the end face (the end face of the second portion D) of each inter-electrode insulating film 53' in the slit 46, unevenness (steps) is provided at the interfaces between the adjacent films. This increases the surface area of each inter-electrode insulating film 53' exposed in the slit 46 between two control gates CG adjacent in the stacking direction as compared to the second and third embodiments. As a result, when forming the silicide layers 58 on the side surfaces of the control gates CG in the slit 46, it is possible to more effectively prevent shorts by bridging between the control gates CG and leakage currents between the control gates CG.

<Fifth Embodiment>

A nonvolatile semiconductor memory device according to the fifth embodiment will be described with reference to FIGS. 40, 41, 42, 43, 44, 45, 46, 47, 48, 49, 50, 51, and 52. In the fifth embodiment, a silicide layer is formed on the surface of the back gate as well, and the control gates are formed on the inter-electrode insulating film on the back gate.

Note that in the fifth embodiment, a description of the same points as in the above-described first embodiment will be omitted, and different points will mainly be explained.

[Structure]

The structure of the nonvolatile semiconductor memory device according to the fifth embodiment will be described below with reference to FIG. 40.

FIG. 40 is a sectional view of the nonvolatile semiconductor memory device according to the fifth embodiment taken along the column direction. Note that one NAND string of the nonvolatile semiconductor memory device will mainly be explained with reference to FIG. 40.

As shown in FIG. 40, the fifth embodiment is different from the first embodiment in that a plurality of doped silicon layers 43 and a plurality of inter-electrode insulating films 53' are alternately stacked directly on a back gate BG.

In the fifth embodiment, the back gate BG includes a first conductive layer 40a formed on a semiconductor substrate (not shown), and a second conductive layer 40b formed on the first conductive layer 40a. The first conductive layer 40a and the second conductive layer 40b are made of the same material, for example, phosphorus-doped polysilicon. In the back gate BG, a pipe portion B of a U-shaped silicon pillar SP is provided in the first conductive layer 40a, and columnar portions A of the U-shaped silicon pillar SP are provided in the second conductive layer 40b. Inter-electrode insulating films 53' are formed on the back gate BG (second conductive layer 40b) without intervening the silicon oxide film 41 shown in FIG. 15A, and lowermost control gates CG are formed on the inter-electrode insulating films 53'.

Silicide layers 58 are formed not only the surfaces of the control gates CG in a slit 46 and the surfaces of select gates SG in an opening portion 57 but also on the surface of the back gate BG in the slit 46. In other words, the silicide layer 58 is also formed between the back gate BG and an insulating member 59.

The lowermost inter-electrode insulating films 53' formed on the back gate BG have almost the same film thickness as that of the inter-electrode insulating films 53' from the second layer. In other words, the interval between the back gate BG and the lowermost control gates CG is almost the same as the interval between two adjacent control gates CG above the lowermost layers.

[Manufacturing Method]

A method of manufacturing the nonvolatile semiconductor memory device according to the fifth embodiment will be described below with reference to FIGS. 41, 42, 43, 44, 45, 46, 47, 48, 49, 50, 51, and 52.

FIGS. 41, 42, 43, 44, 45, 46, 47, 48, 49, 50, 51, and 52 are sectional views showing steps in the manufacture of the nonvolatile semiconductor memory device according to the fifth embodiment taken along the column direction. Note that one NAND string of the nonvolatile semiconductor memory device will mainly be explained with reference to FIGS. 41, 42, 43, 44, 45, 46, 47, 48, 49, 50, 51, and 52.

As shown in FIG. 41, a first conductive layer 40a is formed on a semiconductor substrate (not shown). A trench 50' is formed in the first conductive layer 40a by photolithography and etching. The trench 50' runs in the column direction and serves as a connection hole 50 to be described later in a subsequent process.

As shown in FIG. 42, an undoped polysilicon member containing no impurity is formed on the entire surface. After that, the undoped polysilicon member is removed from the upper surface of the first conductive layer 40a outside the trench 50' by etching and remains only in the trench 50'. A dummy layer 60 made of undoped polysilicon and buried in the trench 50' is thus formed.

As shown in FIG. 43, a second conductive layer 40b is formed on the first conductive layer 40a including the dummy layer 60. A back gate BG including the first conductive layer 40a and the second conductive layer 40b is thus formed.

Figure 44:
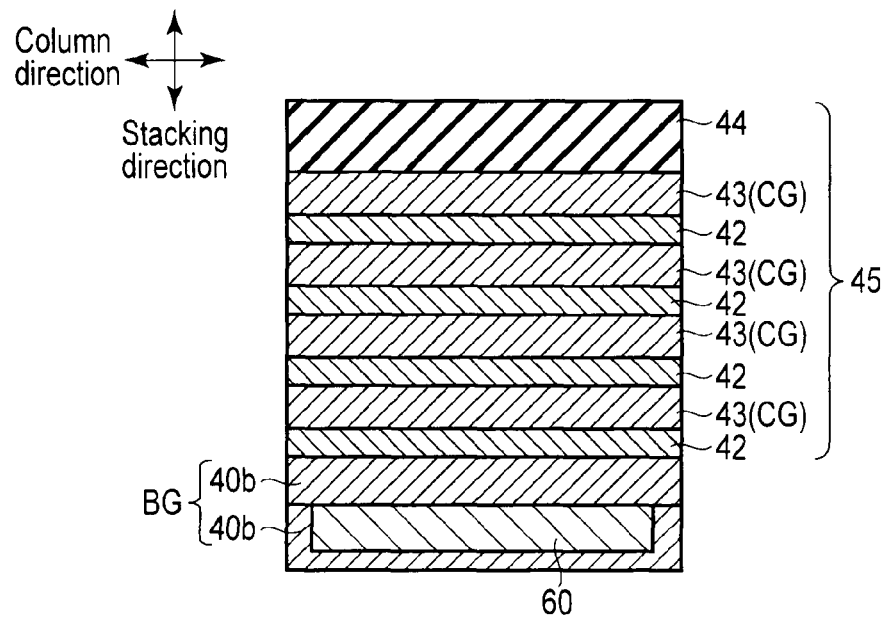
FIG. 44 is a sectional view showing a step in the manufacture of the nonvolatile semiconductor memory device according to the fifth embodiment taken along the column direction following FIG. 43.

As shown in FIG. 44, undoped polysilicon layers 42 containing no impurity and doped polysilicon layers (p-type polysilicon layers) 43 containing boron and serving as control gates CG are alternately stacked on the second conductive layer 40b. At this time, the layers are stacked such that the undoped polysilicon layer 42 is formed immediately on the second conductive layer 40b. In addition, a silicon oxide film 44 is formed on the uppermost doped polysilicon layer 43.

A stacked body 45 including the undoped polysilicon layers 42, the doped polysilicon layers 43, and the silicon oxide film 44 is formed in this way.

Figure 45:
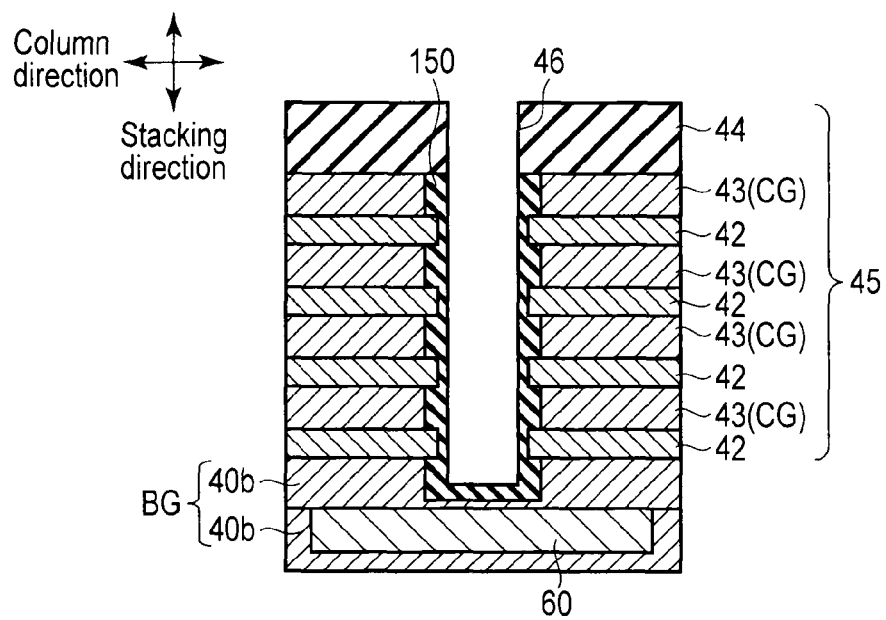
FIG. 45 is a sectional view showing a step in the manufacture of the nonvolatile semiconductor memory device according to the fifth embodiment taken along the column direction following FIG. 44.

As shown in FIG. 45, a slit 46 is formed in the stacked body 45 and the second conductive layer 40b by photolithography and etching. The slit 46 is formed midway through the second conductive layer 40b. The second conductive layer 40b is thus exposed to the bottom surface of the slit 46 while the first conductive layer 40a (dummy layer 60) is not exposed. The slit 46 is formed while making an adjustment such that the second conductive layer 40b remains on the bottom surface of the slit 46 after thermal oxidation in the subsequent process.

The sidewalls (side surfaces) in the slit 46 are thermally oxidized. That is, the surfaces of the undoped polysilicon layers 42 and the doped polysilicon layers 43 exposed in the slit 46 are thermally oxidized. A silicon oxide film 150 is thus formed on the surfaces of the undoped polysilicon layers 42 and the doped polysilicon layers 43 exposed in the slit 46.

At this time, the surface of the second conductive layer 40b exposed in the slit 46 is also thermally oxidized to form the silicon oxide film 150. The second conductive layer 40b is made of polysilicon doped with an impurity. For this reason, the rate of oxidation of the second conductive layer 40b is lower than that of the undoped polysilicon layers 42 but almost equal to that of the doped polysilicon layers 43. At this time, the thermal oxidation is adjusted not to oxidize the dummy layer 60 located under the second conductive layer 40b. The thermal oxidation is performed so as to leave the second conductive layer 40b between the dummy layer 60 and the silicon oxide film 150.

As shown in FIG. 46, a sacrifice member 47 made of a silicon nitride film is buried in the slit 46, thereby forming the sacrifice member 47 spreading in the row direction and the stacking direction.

As shown in FIG. 47, a doped polysilicon layer (p-type polysilicon layer) 48 containing boron and serving as prospective select gates SG is formed on the silicon oxide film 44. After that, a pair of through holes 49 are formed in the doped polysilicon layer 48, the stacked body 45, and the second conductive layer 40b. At this time, the pair of through holes 49 are formed so as to reach the two ends of the dummy layer 60 in the column direction. The doped polysilicon layer 48, the stacked body 45, the second conductive layer 40b, and the dummy layer 60 are thus exposed through the through holes 49.

As shown in FIG. 48, wet etching is performed through the through holes 49. This wet etching is performed using, for example, an alkaline etchant. With this process, the undoped polysilicon layers 42 of the stacked body 45 are removed. As a result, a gap 52 is formed between two control gates CG adjacent in the stacking direction.

At the same time, the dummy layer 60 made of undoped polysilicon is also removed. A connection hole 50 that extends in the column direction and connects the lower ends of the pair of through holes 49 in the first conductive layer 40a is thus formed. That is, a U-shaped memory hole 51 including the pair of through holes 49 and the connection hole 50 is formed in the doped polysilicon layer 48, the stacked body 45, the first conductive layer 40a, and the second conductive layer 40b.

As shown in FIG. 49, a memory film 56 including a block insulating film 53, a charge storage layer 54, and a tunnel insulating film 55, and a U-shaped silicon pillar SP including a pair of columnar portions A and a connection portion B are formed in the U-shaped memory hole 51.

As shown in FIG. 50, an opening portion 57 is formed in the doped polysilicon layer 48 by RIE. The sacrifice member 47 is exposed to the bottom surface of the opening portion 57.

Next, wet etching is performed through the opening portion 57. The sacrifice member 47 in the slit 46 is thus removed. As a result, the silicon oxide film 150 is exposed in the slit 46.

As shown in FIG. 50, the silicon oxide film 150 in the slit 46 is removed by, for example, a dilute hydrofluoric acid treatment. The control gates CG and inter-electrode insulating films 53' are thus exposed in the slit 46.

As shown in FIG. 52, a metal layer of nickel or cobalt is formed on the inner surface of the slit 46 and that of the opening portion 57. After that, annealing is performed to form a silicide on the surface of silicon exposed in the slit 46 and the opening portion 57. That is, silicide layers 58 are formed on the surfaces of the control gates CG in the slit 46 and the surfaces of the select gates SG in the opening portion 57. Simultaneously, the silicide layer 58 is also formed on the surface of the back gate BG in the slit 46.

As shown in FIG. 40, an insulating member 59 made of a silicon oxide film is buried in the slit 46 and the opening portion 57. In this way, the collectively-processed-type three-dimensionally laminated memory according to the fifth embodiment is manufactured.

[Effects]

According to the fifth embodiment, the silicide layer 58 is formed on the surface of the back gate BG in the slit 46. This allows to reduce the resistance of the back gate BG and improve the operation.

The lowermost control gates CG are formed on the inter-electrode insulating film 53' on the back gate BG having the silicide layer 58 formed on its surface. That is, polysilicon layers having the same shape as the control gates CG on the upper side are formed under the lowermost control gates CG at almost the same distance between the control gates CG on the upper side. This allows to equalize the leakage field from the periphery to the lowermost control gates CG with that from the periphery to the remaining control gates CG. It is also possible to equalize the influence of coupling between adjacent cells on the lowermost control gates CG with that on the remaining control gates CG. That is, the lowermost control gates CG and the remaining control gates CG can have the same operation characteristics, thus improving the operation.

Note that in the fifth embodiment, the structure of the first embodiment has been exemplified. However, the fifth embodiment is also applicable to the structures of the second to fourth embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a semiconductor substrate;
   a first conductive layer formed above the semiconductor substrate;
   a second conductive layer, a first inter electrode insulating film, and a third conductive layer sequentially stacked above the first conductive layer;
   a block insulating film formed on an inner surface of each of through holes provided in the second conductive layer, the first inter electrode insulating film, and the third conductive layer and extending in a stacking direction;
   a charge storage layer formed on the block insulating film;
   a tunnel insulating film formed on the charge storage layer;
   a semiconductor layer formed on the tunnel insulating film;
   an insulating member buried in a slit located between the adjacent through holes to divide the second conductive layer, the first inter electrode insulating film, and the third conductive layer; and
   a silicide layer formed on each of surfaces of the second conductive layer and the third conductive layer in the slit,
   wherein a distance between the second conductive layer and the third conductive layer along an inner surface of the slit is longer than that along the stacking direction.

2. The nonvolatile semiconductor memory device of claim 1, wherein a surface of the first inter electrode insulating film in the slit projects into the slit more than surfaces of the second conductive layer and the third conductive layer in the slit.

3. The nonvolatile semiconductor memory device of claim 2, wherein the first inter electrode insulating film includes a first portion sandwiched between the second conductive layer and the third conductive layer and a second portion projecting into the slit more than the surfaces of the second conductive layer and the third conductive layer in the slit, and
   a size of the second portion along the stacking direction is larger than a size of the first portion along the stacking direction.

4. The nonvolatile semiconductor memory device of claim 2, wherein the surface of the first inter electrode insulating film in the slit projects into the slit more than surfaces of the silicide layers in the slit.

5. The nonvolatile semiconductor memory device of claim 1, wherein a surface of the first inter electrode insulating film in the slit has unevenness.

6. The nonvolatile semiconductor memory device of claim 5, wherein the surface of the first inter electrode insulating film in the slit has a multilayered structure in which a silicon nitride film and a silicon oxide film are alternately stacked, and has unevenness at interface.

7. The nonvolatile semiconductor memory device of claim 1, wherein the first inter electrode insulating film includes a silicon nitride film on a surface in the slit.

8. The nonvolatile semiconductor memory device of claim 1, wherein the first inter electrode insulating film is formed from the block insulating film which is buried between the second conductive layer and the third conductive layer and is in contact with the insulating member.

9. The nonvolatile semiconductor memory device of claim 8, wherein the first inter electrode insulating film and the block insulating film have a multilayered structure in which a silicon nitride film and a silicon oxide film are alternately stacked from an outer side.

10. The nonvolatile semiconductor memory device of claim 1, wherein the silicide layer is formed on a surface of the first conductive layer in the slit.

11. The nonvolatile semiconductor memory device of claim 10, further comprising a second inter electrode insulating film formed on the first conductive layer,
wherein a film thickness of the second inter electrode insulating film substantially equals a film thickness of the first inter electrode insulating film.

12. The nonvolatile semiconductor memory device of claim 1, wherein the second conductive layer and the third conductive layer comprise a boron doped polysilicon layer.

13. The nonvolatile semiconductor memory device of claim 1, wherein the silicide layer comprises one of a nickel silicide layer and a cobalt silicide layer.

14. The nonvolatile semiconductor memory device of claim 1, wherein
the block insulating film is formed on an inner surface of a connection hole which connects lower ends of the adjacent through holes,
the charge storage layer is formed on the block insulating film in the connection hole,
the tunnel insulating film is formed on the charge storage layer in the connection hole, and
the semiconductor layer is formed on the tunnel insulating film in the connection hole.

* * * * *